(12) United States Patent
Holden et al.

(10) Patent No.: US 10,846,510 B2
(45) Date of Patent: *Nov. 24, 2020

(54) DYNAMIC HANDWRITING VERIFICATION, HANDWRITING-BASED USER AUTHENTICATION, HANDWRITING DATA GENERATION, AND HANDWRITING DATA PRESERVATION

(71) Applicant: Wacom Co., Ltd., Kazo-shi, Saitama (JP)

(72) Inventors: Martin Holden, Melksham (GB); Nicholas Mettyear, Salisbury (GB)

(73) Assignee: Wacom Co., Ltd., Kazo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/685,744

(22) Filed: Nov. 15, 2019

(65) Prior Publication Data
US 2020/0082153 A1 Mar. 12, 2020

Related U.S. Application Data

(60) Division of application No. 16/041,506, filed on Jul. 20, 2018, now Pat. No. 10,496,872, which is a
(Continued)

(51) Int. Cl.
*G06K 9/00* (2006.01)
*G06F 3/0488* (2013.01)
(Continued)

(52) U.S. Cl.
CPC ..... *G06K 9/00154* (2013.01); *G06F 3/04883* (2013.01); *G06K 9/00161* (2013.01);
(Continued)

(58) Field of Classification Search
CPC .......... G06K 9/00402; G06K 9/00463; G06K 9/00429; G06K 9/00154; G06K 9/00161;
(Continued)

(56) References Cited

U.S. PATENT DOCUMENTS

| 4,453,267 A | 6/1984 | Paganini et al. |
| 4,495,644 A | 1/1985 | Parks et al. |

(Continued)

FOREIGN PATENT DOCUMENTS

| CN | 1445654 A | 10/2003 |
| CN | 102789576 B | 9/2015 |

(Continued)

OTHER PUBLICATIONS

Chinese Office Action dated Mar. 14, 2018, issued in corresponding CN Application No. 201480051049.8, 7 pages.
(Continued)

*Primary Examiner* — Ali Bayat
(74) *Attorney, Agent, or Firm* — Christensen O'Connor Johnson Kindness PLLC

(57) ABSTRACT

Handwriting verification methods and related computer systems, and handwriting-based user authentication methods and related computer systems are disclosed. A handwriting verification method comprises obtaining a handwriting test sample containing a plurality of available parameters, extracting geometric parameters, deriving geometric features comprising an x-position value and a y-position value for each of a plurality of feature points in the test sample, performing feature matching between geometric features of the test sample and a reference sample, determining a handwriting verification result based at least in part on the feature matching, and outputting the handwriting verification result. Techniques and tools for generating and preserving electronic handwriting data also are disclosed. Raw handwriting data is converted to a streamed format that preserves the original content of the raw handwriting data. Techniques and tools for inserting electronic handwriting data into a digital image also are disclosed.

9 Claims, 67 Drawing Sheets

Related U.S. Application Data continuation of application No. 15/031,700, filed as application No. PCT/JP2014/005367 on Oct. 22, 2014, now Pat. No. 10,032,065, which is a continuation-in-part of application No. 14/080,723, filed on Nov. 14, 2013, now Pat. No. 9,235,748.

(60) Provisional application No. 61/895,895, filed on Oct. 25, 2013.

(51) Int. Cl.
  *G06K 9/22* (2006.01)
  *G06K 9/62* (2006.01)

(52) U.S. Cl.
  CPC ..... *G06K 9/00167* (2013.01); *G06K 9/00181* (2013.01); *G06K 9/00865* (2013.01); *G06K 9/222* (2013.01); *G06K 9/6206* (2013.01)

(58) Field of Classification Search
  CPC ........... G06K 9/00167; G06K 9/00181; G06K 9/00865; G06K 9/222; G06K 9/6206; G06F 3/04883
  USPC ...................................................... 382/123
  See application file for complete search history.

(56) References Cited

U.S. PATENT DOCUMENTS

| | | |
|---|---|---|
| 4,656,662 A | 4/1987 | Filliman et al. |
| 4,701,960 A | 10/1987 | Scott |
| 4,724,542 A | 2/1988 | Williford |
| 5,027,414 A | 6/1991 | Hilton |
| 5,038,392 A | 8/1991 | Morris et al. |
| 5,054,088 A | 10/1991 | Gunderson et al. |
| 5,091,975 A | 2/1992 | Berger et al. |
| 5,101,437 A | 3/1992 | Plamondon |
| 5,109,426 A | 4/1992 | Parks |
| 5,111,512 A | 5/1992 | Fan et al. |
| 5,285,506 A | 2/1994 | Crooks et al. |
| 5,434,928 A | 7/1995 | Wagner et al. |
| 5,454,046 A | 9/1995 | Carman, II |
| 5,528,003 A | 6/1996 | Bodin et al. |
| 5,528,699 A | 6/1996 | Obata et al. |
| 5,544,255 A | 8/1996 | Smithies et al. |
| 5,559,897 A | 9/1996 | Brown et al. |
| 5,577,135 A | 11/1996 | Grajski et al. |
| 5,644,655 A | 7/1997 | Windsor |
| 5,647,017 A | 7/1997 | Smithies et al. |
| 5,657,396 A | 8/1997 | Rudolph et al. |
| 5,680,470 A | 10/1997 | Moussa et al. |
| 5,687,254 A | 11/1997 | Poon et al. |
| 5,699,445 A | 12/1997 | Wagner et al. |
| 5,812,698 A | 9/1998 | Platt et al. |
| 5,818,955 A | 10/1998 | Smithies et al. |
| 5,828,772 A | 10/1998 | Kashi et al. |
| 5,892,824 A | 4/1999 | Beatson et al. |
| 5,933,514 A | 8/1999 | Ostrem et al. |
| 5,991,441 A | 11/1999 | Jourjine |
| 6,011,873 A | 1/2000 | Desai et al. |
| 6,055,592 A | 4/2000 | Smith |
| 6,064,751 A | 5/2000 | Smithies et al. |
| 6,091,835 A | 7/2000 | Smithies et al. |
| 6,128,409 A | 10/2000 | Lewis |
| 6,148,093 A | 11/2000 | McConnell et al. |
| 6,259,043 B1 | 1/2001 | Clary et al. |
| 6,212,295 B1 | 4/2001 | Ostrem et al. |
| 6,307,955 B1 | 10/2001 | Zank et al. |
| 6,381,344 B1 | 4/2002 | Smithies et al. |
| 6,487,310 B1 | 11/2002 | Bishop et al. |
| 6,512,840 B1 | 1/2003 | Tognazzini |
| 6,661,908 B1 | 12/2003 | Suchard et al. |
| 6,694,045 B2 | 2/2004 | Chung et al. |
| 6,741,749 B2 | 5/2004 | Herbert, Jr. |
| 6,970,581 B2 | 11/2005 | Yoshii et al. |
| 7,106,888 B1 | 9/2006 | Silverbrook et al. |
| 7,116,804 B2 | 10/2006 | Murase et al. |
| 7,139,431 B2 | 11/2006 | Silverbrook et al. |
| 7,190,815 B2 | 3/2007 | Zank et al. |
| 7,197,167 B2 | 3/2007 | Chung et al. |
| 7,206,436 B2 | 4/2007 | Murase et al. |
| 7,239,727 B2 | 7/2007 | Taylor |
| 7,263,211 B2 | 8/2007 | Yoshii et al. |
| 7,319,789 B2 * | 1/2008 | Dresevic ............... G06F 40/103 382/186 |
| 7,362,901 B2 | 4/2008 | Walch |
| 7,391,906 B2 | 6/2008 | Blake et al. |
| 7,426,288 B2 | 9/2008 | Sakamoto et al. |
| 7,433,499 B2 | 10/2008 | Kim |
| 7,436,989 B2 | 10/2008 | Chung et al. |
| 7,474,770 B2 | 1/2009 | Beigi |
| 7,506,153 B2 | 3/2009 | Lapstun et al. |
| 7,529,391 B2 | 5/2009 | Lin et al. |
| 7,545,959 B2 | 6/2009 | Houle |
| 7,609,415 B2 | 10/2009 | Miki et al. |
| 7,693,312 B2 | 4/2010 | Zank et al. |
| 7,889,889 B2 | 2/2011 | Haid |
| 7,916,906 B2 | 3/2011 | Hicks et al. |
| 7,917,761 B2 | 3/2011 | Cahill et al. |
| 7,933,840 B2 | 4/2011 | Zank |
| 7,961,175 B2 | 6/2011 | Lapstun et al. |
| 7,973,775 B2 | 7/2011 | Lapstun et al. |
| 7,982,722 B2 | 7/2011 | Lapstun et al. |
| 7,983,455 B2 | 7/2011 | Moise et al. |
| 7,986,312 B2 | 7/2011 | Lapstun et al. |
| 8,090,161 B2 | 1/2012 | Kaplan |
| 8,370,632 B2 | 2/2013 | Lehwany |
| 9,741,085 B2 * | 8/2017 | Avni ..................... G06T 1/0021 |
| 2002/0106114 A1 | 8/2002 | Yan |
| 2003/0182585 A1 | 9/2003 | Murase et al. |
| 2005/0105781 A1 | 5/2005 | Sakamoto et al. |
| 2005/0146518 A1 * | 7/2005 | Wang .................. G06F 3/03545 345/179 |
| 2005/0175222 A1 | 8/2005 | Silverbrook et al. |
| 2006/0074814 A1 | 4/2006 | Lovell, Jr. |
| 2006/0136731 A1 | 5/2006 | Hicks et al. |
| 2006/0138228 A1 | 6/2006 | Sanders et al. |
| 2006/0182343 A1 * | 8/2006 | Lin ........................ G06K 9/222 382/181 |
| 2007/0065021 A1 | 3/2007 | Delgrosso et al. |
| 2007/0154071 A1 | 7/2007 | Lin et al. |
| 2008/0019575 A1 | 1/2008 | Scalise |
| 2008/0082426 A1 | 4/2008 | Gokturk |
| 2010/0283766 A1 | 11/2010 | Shieh |
| 2011/0060985 A1 | 3/2011 | Kerr et al. |
| 2011/0130096 A1 | 6/2011 | Dunkars |
| 2012/0206420 A1 | 8/2012 | Shieh |
| 2012/0212459 A1 | 8/2012 | Rusu et al. |
| 2014/0002382 A1 | 1/2014 | Lee et al. |
| 2014/0019855 A1 * | 1/2014 | Kim ....................... G06Q 10/10 715/268 |
| 2015/0169056 A1 | 6/2015 | Weddle et al. |

FOREIGN PATENT DOCUMENTS

| | | |
|---|---|---|
| DE | 69231818 T2 | 11/2001 |
| EP | 0099476 A2 | 2/1984 |
| EP | 0567680 B1 | 3/1993 |
| EP | 0 542 557 A2 | 5/1993 |
| EP | 0737342 A1 | 6/1995 |
| EP | 1020817 A1 | 7/2000 |
| GB | 1 286 332 A | 8/1972 |
| JP | 58-178488 A | 10/1983 |
| JP | 62-006385 A | 1/1987 |
| JP | S62-287387 A | 12/1987 |
| JP | 05-268100 A | 10/1993 |
| JP | 05-274481 A | 10/1993 |
| JP | 06-162268 A | 6/1994 |
| JP | 10-187969 A | 7/1998 |
| JP | 10-240866 A | 9/1998 |
| JP | 10-247240 A | 9/1998 |
| JP | 11-341456 A | 12/1999 |
| JP | 2000-163514 A | 6/2000 |

(56) References Cited

FOREIGN PATENT DOCUMENTS

| | | |
|---|---|---|
| JP | 2003-271966 A | 9/2003 |
| JP | 2004-021663 A | 1/2004 |
| JP | 2005-509385 A | 4/2005 |
| JP | 2007-305109 A | 11/2007 |
| JP | 2011-238083 A | 11/2011 |
| JP | 2016-076233 A | 5/2016 |
| SG | 10201407479 U | 6/2015 |
| WO | 2013/093864 A1 | 6/2013 |

OTHER PUBLICATIONS

Chinese Office Action dated Nov. 26, 2018, issued in corresponding CN Application No. 201410645999.5, filed Nov. 14, 2014, 17 pages.

Chinese Office Action dated Sep. 13, 2018, issued in corresponding CN Application No. 201480051049.8, 7 pages.

Communication Pursuant to Article 94(3) EPC dated Mar. 14, 2016, issued in corresponding Application No. EP 14 19 3143.6, 4 pages.

Das, M.T., and L.C. Dulgar, "Signature Verification (SV) Toolbox: Application of PSO-NN," Engineering Applications of Artificial Intelligence 22(4-5):688-694, Jun. 2009.

Extended European Search Report dated Apr. 13, 2015, issued in corresponding Application No. EP 14 19 3143.6, 9 pages.

Extended European Search Report dated Jun. 30, 2017, issued in corresponding EP Application No. 14856498.2, 11 pages.

Fahmy, M.M.M., "Online Handwritten Signature Verification System Based on DWT Features Extraction and Neural Network Classification," Ain Shams Engineering Journal 1(1):59-70, Sep. 2010.

Ferri, L.C., et al., "Biometric Authentication for ID Cards With Hologram Watermarks," SPIE—International Society for Optical Engineering Proceedings 4675:629-640, Apr. 2002.

Fierrez-Aguilar, J., et al., "An on-Line Signature Verification System Based on Fusion of Local and Global Information," Lecture Notes in Computer Science, vol. 3546, Audio- and Video-Based Bimetric Person Authentication, 2005, pp. 523-532.
<http://gsdt.wacom.eu/download/file/Signature-SDK/1.6/Signature-Components-API.pdf>, at least as early as Sep. 2013, 75 pages.

Impedovo, D., and G. Pirlo, "Automatic Signature Verification: The State of the Art," IEEE Transactions on Systems, Man, and Cybernetics—Part C: Applications and Reviews 38(5):609-635, Sep. 2008.

Impedovo, D., et al., "Handwritten Signature Verification by Multiple Reference Sets," Proceedings of the 11th International Conference on Frontiers in Handwriting Recognition (ICFHR), Montréal, Aug. 19-21, 2008, 5 pages.

"Ink Serialized Format Specification," Microsoft Corporation, 2007, 49 pages.

International Search Report dated Jan. 20, 2015, issued in corresponding International Application No. PCT/JP2014/005367, filed Oct. 22, 2014, 5 pages.

Ismail, M.A., and S. Gad, "Off-Line Arabic Signature Recognition and Verification," Pattern Recognition 33(10):1727-1740, Oct. 2000.

Jain, A.K., et al., "On-Line Signature Verification," Pattern Recognition 35(12):2963-2972, Dec. 2002.

Japanese Office Action dated Dec. 4, 2018, issued in corresponding Japanese Application No. 2015-221883, 8 pages.

Japanese Office Action dated Oct. 23, 2018, issued in corresponding JP Application No. 2014-231172, filed Nov. 14, 2014, 6 pages.

Kato, Y., et al., "Signature Data Hiding for Verifying Originality of Digital Picture," Computer Security Symposium 2000, Information Processing Society of Japan, Symposium Series, vol. 2000, No. 12, Oct. 26, 2000, 13 pages.

Li, B., et al., "Minimizing Spatial Deformation Method for Online Signature Matching," in S.-W. Lee and S.Z. Li (eds.), "Advances in Biometrics: International Conference, ICB 2007, Seoul, Korea, Aug. 27-28, 2007, Proceedings," Springer, Berlin, Series: Lecture Notes in Computer Science 4642:646-652, Sep. 2007.

Luan, F., et al., "On-Line Handwritten Signature Verification Algorithm Based on Time Sequence," International Journal of Information and Systems Sciences 1(3-4):229-236, 2005.

Maiorana, E., et al., "Template Protection for on-Line Signature-Based Recognition Systems," Biometrics and Identity Management, Springer-Verlag Berlin Heidelberg, pp. 170-180, May 2008.

Martínez-Romo, J.C., et al., "On-Line Signature Verification Based on Genetic Optimization and Neural-Network-Driven Fuzzy Reasoning," in A.H. Aguirre et al. (eds.), "MICAI 2009: Advances in Artificial Intelligence: 8th Mexican International Conference on Artificial Intelligence, Guanajuato, Mexico, Nov. 9-13, 2009, Proceedings," Springer, Berlin, Series: Lecture Notes in Computer Science/Artificial Intelligence 5845:246-257, Dec. 2009.

Muramatsu, D., and T. Matsumoto, "Effectiveness of Pen Pressure, Azimuth, and Altitude Features for Online Signature Verification," Proceedings of the International Conference on Advances in Biometrics (ICB '07), Aug. 2007, pp. 503-512.

Office Action dated Oct. 28, 2016, from U.S. Appl. No. 14/940,925, filed Nov. 13, 2015, 26 pages.

Scattolin, P., "Recognition of Handwritten Numerals Using Elastic Matching," Thesis, Department of Computer Science, Concordia University, Montreal, Nov. 1995, 22 pages.

"SDK Feature Comparison," Wacom Co., Ltd., Tokyo, Japan, <http://gsdt.wacom.eu/product/SDKComparison.pdf>, at least as early as Jun. 2013, 1 page.

"Signature Components API," Global Signature Development Team, Wacom Co., Ltd., Tokyo, Japan.

Tappert, C.C., et al., "The State of the Art in on-Line Handwriting Recognition," IEEE Transaction on Pattern Analysis and Machine Intelligence 12(8):786-808, Aug. 1990.

Thumwarin, P., et al., "On-Line Signature Verification Based on FIR System Characterizing Motion Pressure," Proceedings of the 10th International ACM SIGGRAPH Conference on Virtual Reality Continuum and Its Applications in Industry (VRCAI 2011), Hong Kong, Dec. 11-12, 2011, pp. 565-568.

"Wacom SDKs: Integrate Signature Pads Into Your Workflow," © 2013 Wacom Europe GmbH, <http://signature.wacom.eu/software/software-development-kits-sdks>, at least as early as Dec. 2013, 2 pages.

Written Opinion dated Feb. 26, 2018, issued in corresponding SG Application No. 11201601314R, filed Oct. 22, 2014, 7 pages.

Yuen, H., "A Chain Coding Approach for Real-Time Recognition of on-Line Handwritten Characters," Proceedings of the International Conference on Acoustics, Speech, and Signal Processing (ICASSP '96), Atlanta, Georgia, May 7-10, 1996, vol. 6, pp. 3426-3429.

Zimmerman, T.G., et al., "Retail Applications of Signature Verification," vol. 5404, Proceedings of SPIE, Biometric Technology for Human Identification, Aug. 2004, 9 pages.

Japanese Office Action dated Sep. 1, 2020, issued in corresponding JP application 2019-132908, 8 pages.

* cited by examiner

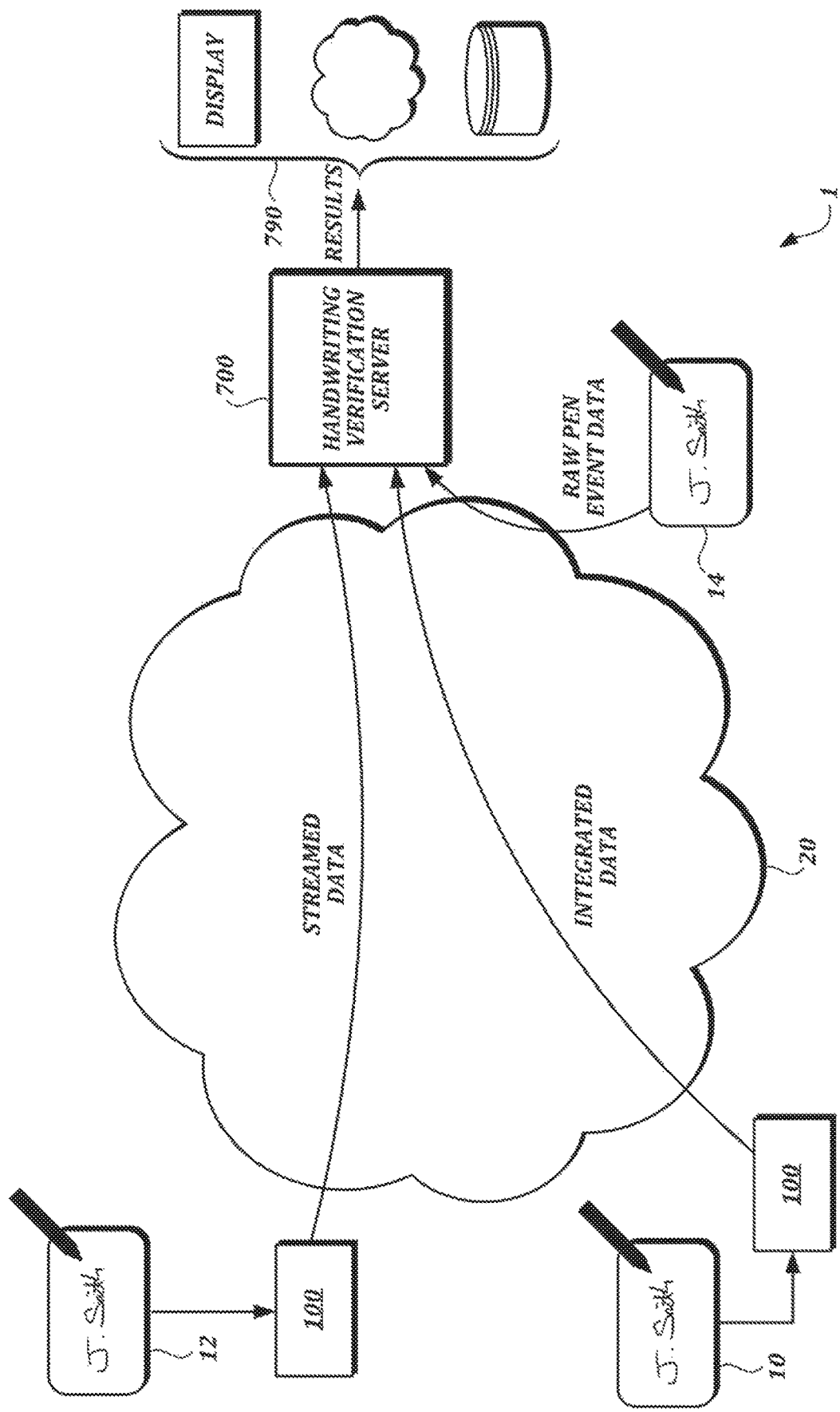

| SERVICE ID | USER ID | REFERENCE SIGNATURE(S) |
|---|---|---|
| ABC | #0 | J. Smith |
| | #1 | J. Smith |
| | ... | W. Wang |
| | ... | ... |
| XYZ | #0 | 山田 太郎 |
| | ... | 山田 太郎 |
| | ... | ... |

| REFERENCE SIGNATURE(S) | NAME ID | |
|---|---|---|
| | LOCAL ID | SERVICE ID |
| J. Smith | #0 | ABC |
| J. Smith | #1 | ABC |
| W. Wang | ... | ... |
| 山田 太郎 | #0 | XYZ |
| 山田 太郎 | ... | ... |

| STYLUS ID | SERVICE ID | NAME ID | |
|---|---|---|---|
| | | LOCAL ID | |
| #0 | ABC | #1 | |
| #1 | ABC | #N | |
| ... | XYZ | #2 | |
| ... | ... | ... | |
| ... | ... | ... | |
| #N | ABC | #0 | |
| ... | ... | ... | |

| (i) PEN/ DEVICE ID | (ii) TEST SIGNATURE (TO BE VERIFIED) | (iii) SERVICE ID | AUTHENTICATION INFORMATION (E.G. USERNAME:PASSWORD) |
|---|---|---|---|
| #0 | *W. Hayes* | ABC | ABC\Whayes:pass123 |
| #1 | *J. Smith* | ABC | ABC\jsmith:pass123 |
|  |  | XYZ | XYZ\jsmith:pass123 |
| ... | ... | ... | ... |
| #N | *Sammy* | Book+ | sammy123:pass!bookP |
| ... | ... | ... | ... |

INPUT: (ii), (iii) ; RETURN: Authentication Information

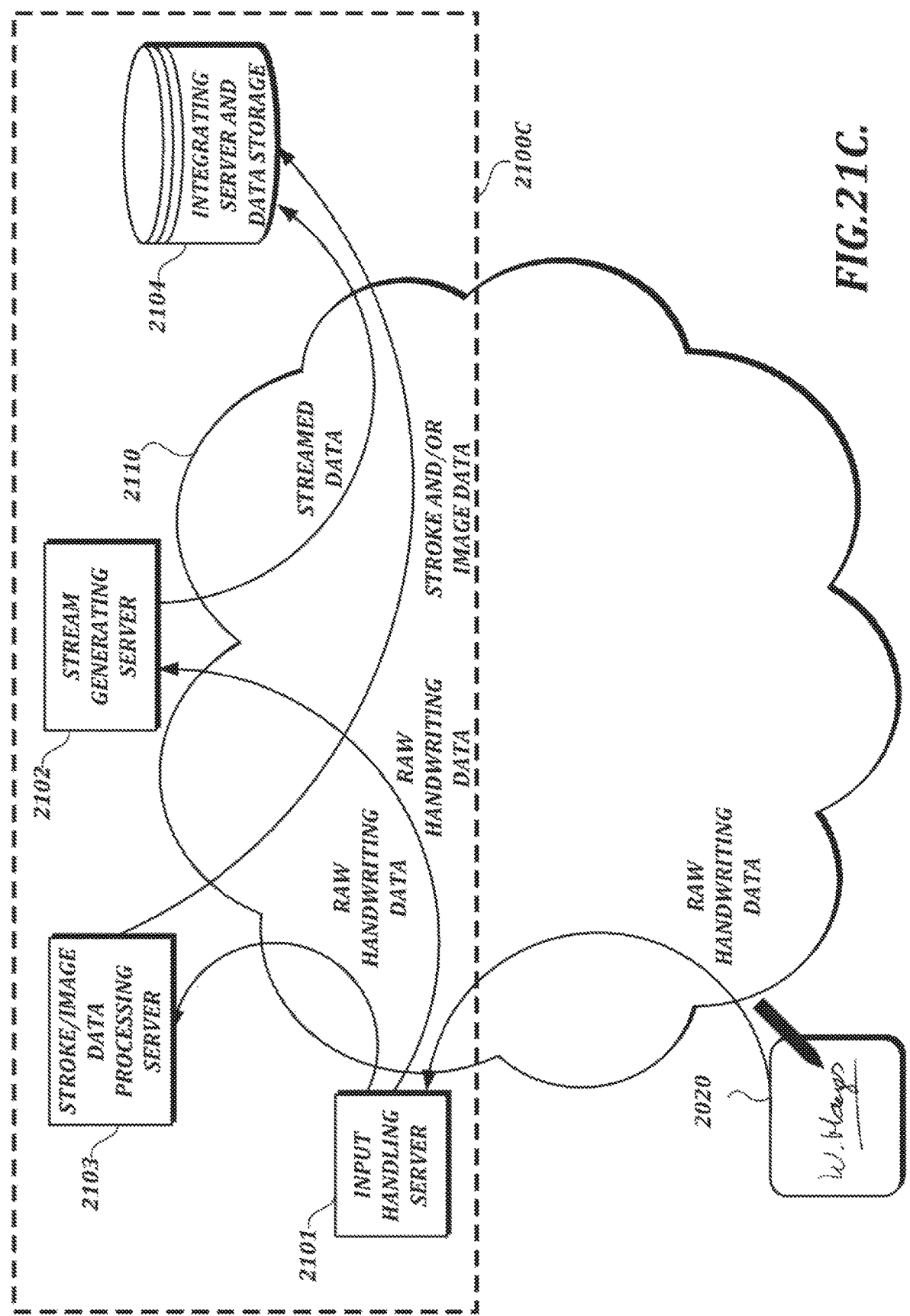

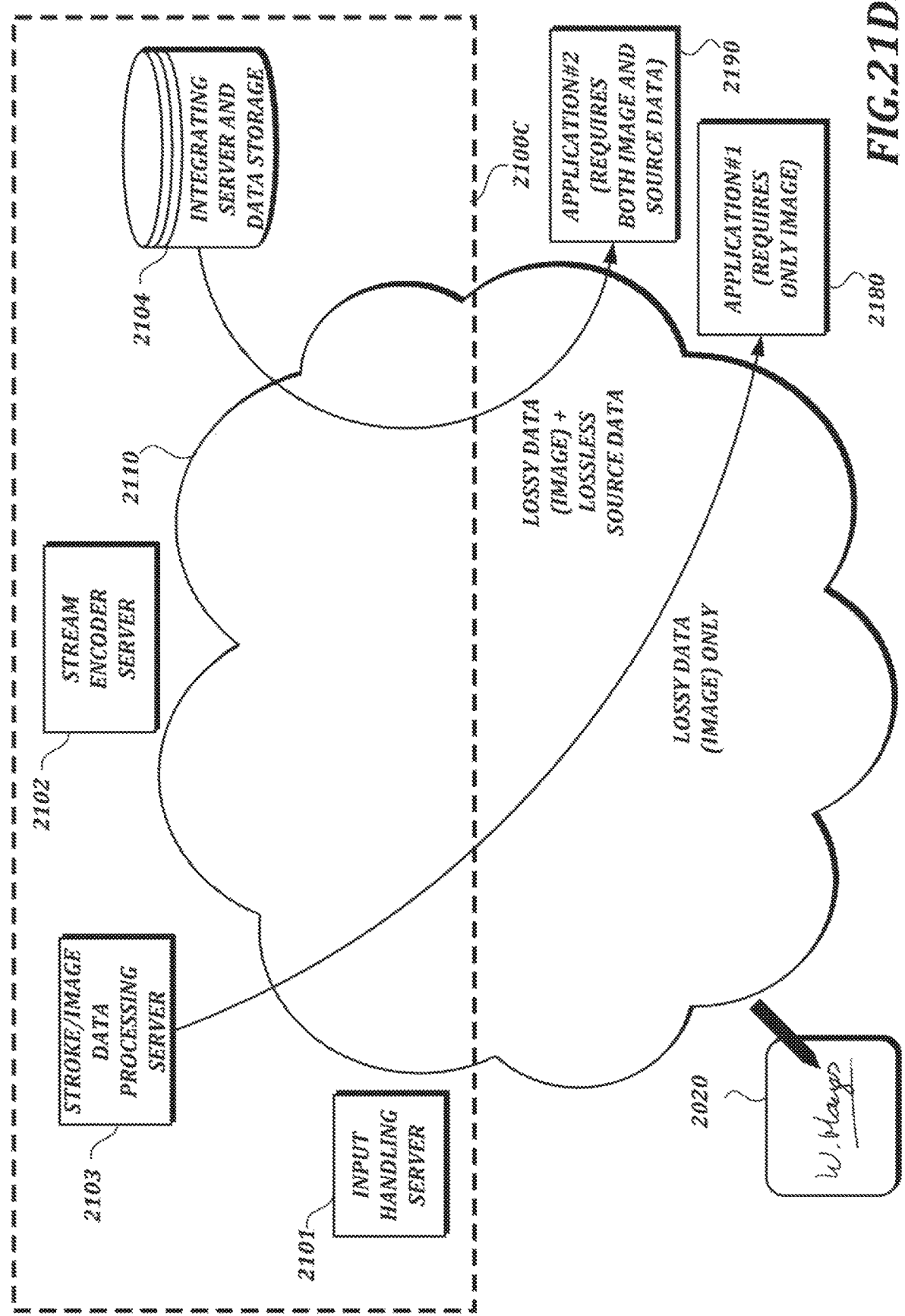

| VALUE | BITSTRING |
|---|---|
| 0 | 1 |
| 1 | 010 |
| -1 | 011 |
| 2 | 00100 |
| -2 | 00101 |
| 3 | 00110 |
| -3 | 00111 |
| 4 | 0001000 |
| -4 | 0001001 |
| 5 | 0001010 |
| -5 | 0001011 |
| 6 | 0001100 |
| -6 | 0001101 |
| 7 | 0001110 |
| -7 | 0001111 |
| 8 | 000010000 |
| -8 | 000010001 |
| 9 | 000010010 |
| -9 | 000010011 |
| ⋮ | |
| 100 | 000000011001000 |
| -100 | 000000011001001 |
| 101 | 000000011001010 |
| -101 | 000000011001011 |
| ⋮ | |
| 1000 | 00000000011111010000 |
| -1000 | 00000000011111010001 |
| 1001 | 00000000011111010010 |
| -1001 | 00000000011111010011 |

HIGHER PROBABILITY VALUES (rows 0 through -5): SHORTER BITSTRINGS ASSIGNED

*FIG. 37.*

| X | X_delta | X_prediction_esidue | X_pred_residual_ExpGolomb | X_number_of_bits |
|---|---|---|---|---|
| 4587 | 4587 | 4587 | 000000000000010001111010110 | 27 |
| 4617 | 30 | -4557 | 000000000000010001110011011 | 27 |
| 4639 | 22 | -8 | 000010001 | 9 |
| 4671 | 32 | 10 | 000010100 | 9 |
| 4707 | 36 | 4 | 0001000 | 7 |
| 4749 | 42 | 6 | 0001100 | 7 |
| 4797 | 48 | 6 | 0001100 | 7 |
| 4849 | 52 | 4 | 0001000 | 7 |
| 4903 | 54 | 2 | 00100 | 5 |
| 4957 | 54 | 0 | 1 | 1 |
| 5013 | 56 | 2 | 00100 | 5 |
| 5065 | 52 | -4 | 0001001 | 7 |
| 5117 | 52 | 0 | 1 | 1 |
| 5160 | 43 | -9 | 000010011 | 9 |
| 5198 | 38 | -5 | 0001011 | 7 |
| 5226 | 28 | -10 | 000010101 | 9 |
| 5250 | 24 | -4 | 0001001 | 7 |
| 5262 | 12 | -12 | 000011001 | 9 |
| 5267 | 5 | -7 | 0001111 | 7 |
| 5264 | -3 | -8 | 000010001 | 9 |
| 5257 | -7 | -4 | 0001001 | 7 |
| 5244 | -13 | -6 | 0001101 | 7 |
| 5230 | -14 | -1 | 011 | 3 |
| 5213 | -17 | -3 | 00111 | 5 |
| 5194 | -19 | -2 | 00101 | 5 |
| 5174 | -20 | -1 | 011 | 3 |
| 5154 | -20 | 0 | 1 | 1 |

| P | P_delta | P_prediction_residual | P_pred_residual_ExpGolomb | P_number_of_bits |
|---|---|---|---|---|
| 1 | 1 | 1 | 010 | 3 |
| 10 | 9 | 8 | 000010000 | 9 |
| 52 | 42 | 33 | 0000001000010 | 13 |
| 96 | 44 | 2 | 00100 | 5 |
| 118 | 22 | -22 | 00000101101 | 11 |
| 142 | 24 | 2 | 00100 | 5 |
| 167 | 25 | 1 | 010 | 3 |
| 191 | 24 | -1 | 011 | 3 |
| 212 | 21 | -3 | 00111 | 5 |
| 231 | 19 | -2 | 00101 | 5 |
| 248 | 17 | -2 | 00101 | 5 |
| 264 | 16 | -1 | 011 | 3 |
| 278 | 14 | -2 | 00101 | 5 |
| 291 | 13 | -1 | 011 | 3 |
| 304 | 13 | 0 | 1 | 1 |
| 316 | 12 | -1 | 011 | 3 |
| 326 | 10 | -2 | 00101 | 5 |
| 336 | 10 | 0 | 1 | 1 |
| 345 | 9 | -1 | 011 | 3 |
| 353 | 8 | -1 | 011 | 3 |
| 360 | 7 | -1 | 011 | 3 |
| 365 | 5 | -2 | 00101 | 5 |
| 369 | 4 | -1 | 011 | 3 |
| 372 | 3 | -1 | 011 | 3 |
| 375 | 3 | 0 | 1 | 1 |
| 376 | 1 | -2 | 00101 | 5 |
| 377 | 1 | 0 | 1 | 1 |

*FIG. 39.*

VARIABLE LENGTH CODE TABLE 4100

| VALUE | BITSTRING |
|---|---|
| 0 | 1 |
| +1 (RIGHT MOVE PRIORITIZED) | 0 1 0 |
| +2 | 0 1 1 |
| +3 | 0 0 1 0 0 |
| +4 | 0 0 1 0 1 |
| ⋮ | ⋮ |
| -1 (LEFT MOVE) | 0 0 0 0 1 0 0 0 0 1 |
| -2 | |
| ⋮ | 0 0 0 0 0 … 1 . 0 0 0 0 1 |

*FIG.41A.*

VARIABLE LENGTH CODE TABLE
(FOR ARABIC)

| | VALUE | BITSTRING |
|---|---|---|
| LEFT MOVE (SHORTER) | 0 | 1 |
| | +1 | 0 1 0 |
| | +2 | 0 1 1 |
| | +3 | 0 0 1 0 0 |
| | +4 | 0 0 1 0 1 |
| | ⋮ | ⋮ |
| RIGHT MOVE | -1 | 0 0 0 0 1 0 0 0 1 |
| | -2 | |
| | ⋮ | 0 0 0 0 0 ... 1 ..0 0 0 0 1 |

DYNAMIC HANDWRITING VERIFICATION, HANDWRITING-BASED USER AUTHENTICATION, HANDWRITING DATA GENERATION, AND HANDWRITING DATA PRESERVATION

BACKGROUND

Electronic handwriting is increasingly important in a variety of contexts. For example, electronic handwriting is now commonly used in place of pen and paper to obtain a credit card holder's affirmation of a credit card transaction. As electronic handwriting has become more common, the ability to verify authenticity of electronic handwriting has also become more important.

U.S. Pat. No. 6,487,310 describes an "elastic matching" method for comparing one signature against another, comprising the operations of creating a mapping between corresponding points in two signatures to be compared measured at different times after the commencement of writing the signatures which maximizes the correlation between the local spatial neighborhood of the measured points and simultaneously minimizes the curvature of the elastic spatial distortion from the mapping, providing quantitative measures of both the degree of the spatial correlations and the degree of the non-uniform spatial distortions in the mapping, thereby providing measures of the similarity between the signatures.

In addition to the accuracy of signature verification, the recording of handwriting data is an important topic. Recent handwriting input devices are not limited to conventional digitizers and there are many types of hardware having similar—but not identical—capabilities. In order to ensure the compatibility of handwriting data captured by all types of devices, a flexible data format is desirable.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In at least one aspect of the present disclosure, a handwriting verification method comprises obtaining a handwriting test sample containing a plurality of available parameters, wherein the plurality of available parameters comprises geometric parameters and one or more non-geometric parameters; extracting the geometric parameters from the plurality of available parameters; based on the geometric parameters, deriving geometric features comprising an x-position value and a y-position value for each of a plurality of evenly distributed feature points in the handwriting test sample; performing first feature matching between geometric features of the handwriting test sample and geometric features of a reference sample; determining a handwriting verification result based at least in part on the feature matching; and outputting the handwriting verification result. The geometric features may further comprise values derived from the geometric parameters, such as direction and curvature values. The determining of the handwriting verification result can be further based on a count of unlinked feature points.

The first feature matching can include finding mappings between one or more of the evenly distributed feature points in the test sample and one or more evenly distributed feature points in the reference sample. The first feature matching can include a simulated annealing process. The simulated annealing process can include selecting a feature point in the reference sample; generating a pseudo-random value; comparing the pseudo-random value with a constant; and based on the comparing, determining whether to remove a link from a selected point in the reference sample or define a new link between the selected feature point in the reference sample and a selected feature point in the test sample. The determining step can be biased towards defining a new link over removing an existing link based on the value of the constant. If a new link is defined, any previously existing links that are crossed by the new link can be removed.

Second feature matching also can be performed, which may include evaluation of a non-geometric parameter (e.g., a time-related parameter, such as speed, acceleration, or pen pressure over time). The second feature matching may include comparing an area of a pressure-time diagram from a start point of the reference sample to an $i^{th}$ point of the reference sample and an area of a pressure-time diagram from a start point of the test sample to an $i^{th}$ point of the test sample. The handwriting verification result can be further based on the second feature matching.

In another aspect, a handwriting verification method comprises performing feature matching between geometric features of a handwriting test sample and geometric features of a reference sample, wherein the feature matching comprises defining one or more links between one or more evenly distributed feature points in the test sample and one or more evenly distributed feature points in the reference sample; obtaining a count of consecutive unlinked feature points in the test sample; and outputting a handwriting verification result, wherein the handwriting verification result is based at least in part on the feature matching and the count of consecutive unlinked feature points in the test sample.

In another aspect, a user authentication method comprises receiving test signature data and a user device identifier (ID) from a user device; searching for a name ID associated with the test signature data; obtaining the name ID; searching for a reference device ID associated with the name ID; comparing the reference device ID with the user device ID; and providing authentication information (e.g., an authentication result) to the user device based on the comparing. The device IDs may be, for example, pen or stylus IDs associated with a pen or stylus.

In another aspect, a user authentication method comprises receiving test signature data (e.g., encrypted test signature data), a device identifier, and a service identifier from a user device, wherein the service identifier relates to a service executing on the user device; comparing the test signature data with reference signature data; based on a result of the comparing, obtaining authentication information (e.g., a user ID and a password) associated with the service executing on the user device; and providing the authentication information to the user device. If the test signature data is consistent with the reference signature data, the test signature data may be added to the reference signature data (e.g., as supplemental information for future authentications).

In another aspect, a method executed in a computer configured to be used with a handwriting data input device comprises obtaining raw handwriting data comprising a sequence of pen events each including a plurality of values of different attributes, generating, from the raw handwriting data, streamed data including a plurality of streams, each of which includes data related to a single attribute of the different attributes, generating, from the raw handwriting data, stroke data and/or image data, and selectively outputting the streamed data or the stroke data and/or image data. The selective outputting may be based at least in part on a request from an application and may include integrating (e.g., as a steganographic process) the streamed data with the stroke data and/or the image data, thereby recombining original content of the raw handwriting data with the stroke data and/or the image data in a single file.

Generating the streamed data may include lossless data processing, and generating the stroke data and/or the image data may include lossy data processing. The lossless data processing may include preserving timestamp information, and the lossy data processing may include discarding the timestamp information. The lossless data processing may include preserving values at an original level of precision. The lossy data processing may include reducing the original level of precision for at least some of the values.

Generating the streamed data may include inserting (e.g., in a header of the streamed data) identifiers associated with the plurality of streams. Generating the streamed data also may include selecting a compression technique from a plurality of available compression techniques for each of the plurality of streams based on the identifiers, and applying the selected compression technique to each of the plurality of streams.

The plurality of available compression techniques may include (i) no compression and (ii) delta coding. The delta coding may include run-length coding of delta values. Applying the selected compression technique may include applying the delta coding to x-coordinate values or y-coordinate values.

The selected compression technique also may include the following: obtaining a kth value in a sequence of handwriting data values as a current target value, where k is an index value; calculating a predicted value for the kth value based on values obtained in advance of the encoding of the kth value; calculating a prediction residual value for the kth value based on the current target value and the predicted value for the kth value; and encoding the prediction residual value by using an entropy coding method that maps shorter bitstrings for smaller absolute prediction residual values and longer bitstrings for larger absolute prediction residual values. The entropy coding method may include switching between variable length code tables according to a stream type.

In another aspect, a computer system comprises a streamed data generating section configured to generate streamed data based on raw handwriting data, wherein the streamed data comprises a plurality of streams, wherein the streamed data generating section comprises a lossless stream adaptive encoder configured to adaptively encode the plurality of streams; and a lossy data processing section configured to generate stroke data and/or image data based on the raw handwriting data. The computer system also may include an integrating section configured to integrate the streamed data and the stroke data and/or the image data into integrated data. The integrated data may include a digital image with the encoded handwriting data inserted therein.

BRIEF DESCRIPTION OF DRAWINGS

FIG. 1A is a high-level diagram of an illustrative cloud computing arrangement configured to verify authenticity of sample handwriting data;

FIG. 16 is an illustration of a table that can be used to look up a reference signature based on one or more identifiers;

FIG. 18A is an illustration of a table that can be used to look up an identifier based on signature data;

FIG. 18B is an illustration of a table that can be used to look up a device identifier based on other identifiers;

FIG. 19B is an illustration of a table of data that can be used in the user authentication process shown in FIG. 19A;

FIGS. 21C and 21D are diagrams of illustrative cloud computing arrangements that may be used in accordance with described embodiments;

FIG. 37 depicts a table that shows an example variable-length coding scheme that can be used to encode values such as delta values or prediction residuals;

FIGS. 38 and 39 depict tables that show results of applications of the variable-length coding scheme of FIG. 37 to prediction residuals for x-coordinate values and pressure values, respectively;

FIGS. 41A and 41B show example variable-length code (VLC) tables for an illustrative context-based encoding scheme;

DESCRIPTION OF EMBODIMENTS

Figure 1B:
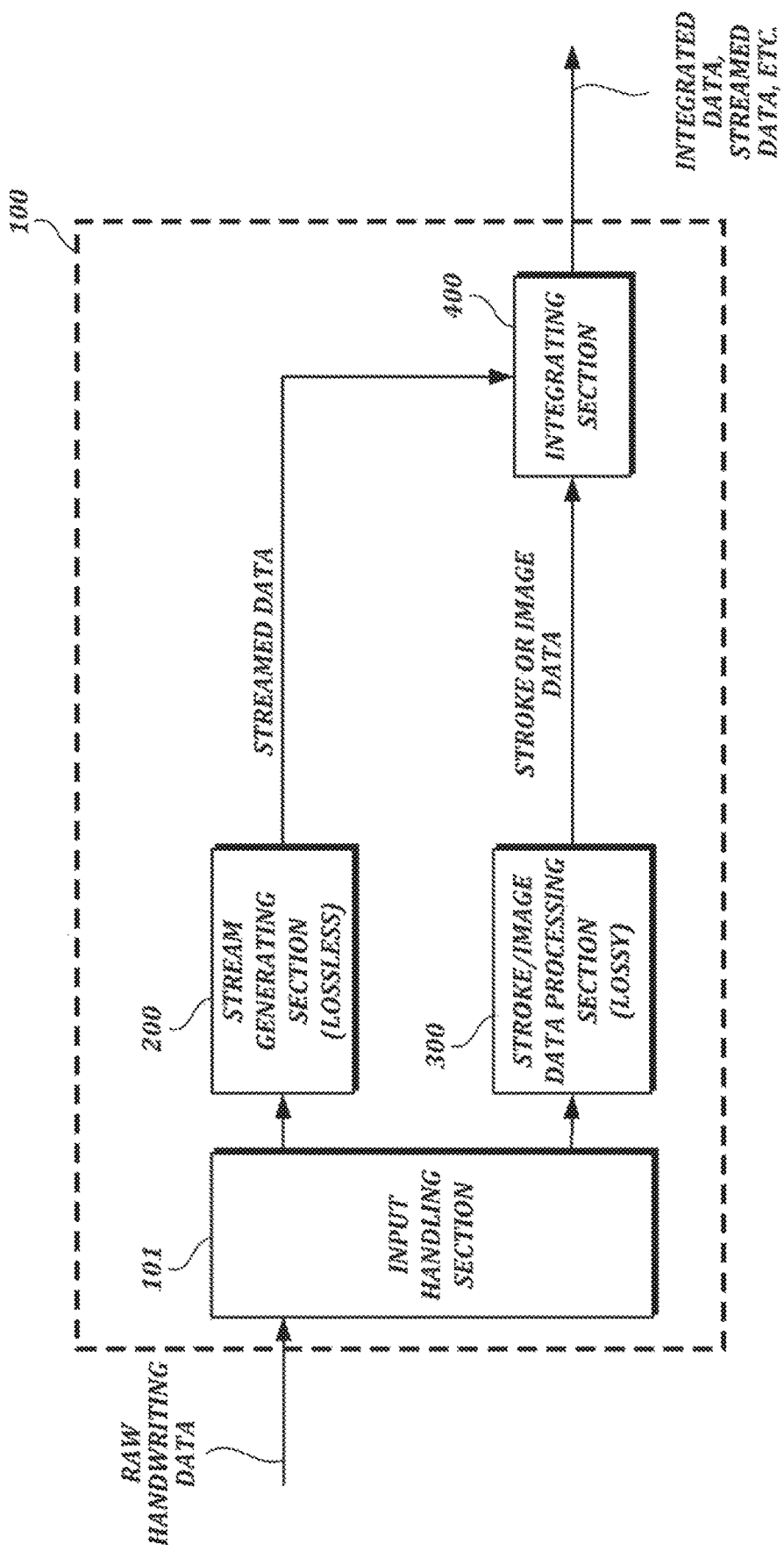
FIG. 1B is a functional block diagram of an illustrative handwriting data processing section.

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of exemplary embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

I. Dynamic Handwriting Verification and Handwriting-Based User Authentication

Some embodiments of the present disclosure are directed to verifying electronic signatures or other electronic handwriting. Determining whether a signature is authentic poses many challenges. One challenge is that authentic signatures made by the same person will always have some degree of variability. Another challenge is that the degree of variability between authentic signatures will vary from person to person. Previously, a determination of the level of variability has been made by combining several reference samples collected at different times into a template that can be used for verification. However, collecting several reference samples at different times does not fit well with many business processes. For example, banks have traditionally stored a single reference signature for comparison purposes. Thus, the ability to improve the accuracy of a verification process while using a single reference would be advantageous.

Accordingly, in described embodiments, a dynamic handwriting verification engine is configured to compare handwriting data associated with a handwriting test sample (e.g., a signature) with handwriting data associated with a reference sample to determine whether the test sample is authentic. Although some embodiments described herein refer to verification of signatures, it should be understood that embodiments described herein can be used to verify handwriting of all kinds, and are not limited to verification of signatures.

In accordance with embodiments described herein, a verification process involves matching geometric features in a test sample and a reference sample while allowing for minor differences resulting from natural inconsistency between samples that are made by the same person. In addition to geometric features, the verification process also can take into account more data that can be generated by current handwriting collection technology (e.g., movement of a pen between strokes, pen pressure, pen angles, and the like), which can improve the quality of verification results. Because different input devices may provide different types of data, the verification process can adapt to the types of data provided by particular devices, in accordance with embodiments described herein. For example, if a test sample includes pressure information and a reference sample does not, the verification process can omit analysis of pressure information and focus instead on comparisons of data that are common to the two samples.

FIG. 1A is a high-level diagram of an illustrative cloud computing arrangement 1 configured to verify authenticity of sample handwriting data in accordance with techniques described herein. In the example shown in FIG. 1A, handwriting input devices 10, 12, and 14 provide handwriting data in various forms to a handwriting verification server 700 over a network 20 (e.g., the Internet). The handwriting input devices 10, 12, and 14 may be implemented as dedicated handwriting collection devices or as general purpose devices, such as suitably configured smart phones or tablet computers. Although the handwriting input devices 10, 12, and 14 are referred to herein as "input devices," such devices are not limited to the collection of input and typically will also include other functionality (e.g., display functionality, data transmission functionality, etc.).

When a handwritten signature is made on paper, an ink pen leaves a continuous trail of ink that forms the signature. A digital version of a handwritten signature generally comprises a collection of discrete data points measured at regular time intervals.

Referring again to FIG. 1A, any of the input devices 10, 12, 14 may use electromagnetic resonance (EMR) technology, in which a digitizer incorporates a sensor board that detects the pen's movement and energy is induced in the pen's resonant circuit by a magnetic field generated by the sensor board surface. The pen's resonant circuit then makes use of this energy to return a magnetic signal to the sensor board surface. The board detects the pen's coordinate position at regular time intervals even if the electronic pen does not touch the sensor board surface, so long as the pen remains within close enough proximity to the sensor board, such that signals can still be received from the pen. (The effective signal range can vary depending on the particular technology being used, but is generally on the order of several millimeters.)

Alternatively, other handwriting input technology can be used. For example, an electronic pen may use other wireless technology or may be connected by a wire to a digitizer. As another example, an electronic pen may or may not be detectable away from the surface of a digitizer. As another example, an electronic pen may be powered or unpowered. Powered pens may receive power via a wire connected to an external power source or via an on-board battery. As another example, it is possible to input handwriting data without an electronic pen (e.g., via a stylus on a pressure sensitive digital writing pad, a touchscreen, or some other input device that does not require an electronic pen).

However the handwriting data may be collected, handwriting data provided by the input devices 10, 12, and 14 may include pen event information, device information, and/or contextual information about the context in which the handwriting was made. In described embodiments, pen event information includes the x, y position of the pen-tip on or above the digitizer surface and the time since the start of the handwriting. Further, pen event information may optionally include additional information subject to the capabilities of the input devices 10, 12, and 14, such as pressure (pen force), angles (azimuth, altitude, and/or rotation) and pen-down status. Pen event information is typically collected at regular intervals during a signing process.

Device information may include information needed to convert from digitizer units to real-world units. Contextual information for a signature may include the name of the person signing; the date and time of signature; the reason for signing; the type and version of operating system used on a host device; the type of digitizer; the version of the digitizer device driver; a unique identifier taken from the network interface controller (NIC) address of the a host device; if a cryptographic hash function is used, information about the type of hash function; and/or supplementary data that may be added by a software application at the time of capture. Contextual information also may include information about the document being signed, such as a cryptographic message digest.

Referring again to FIG. 1A, the handwriting verification server 700 performs a verification process that compares handwriting test samples with reference samples to determine whether the test samples are authentic. Results of the verification process can be output by the handwriting verification server 700. In at least one embodiment, the handwriting verification server 700 performs the verification process illustrated in FIG. 4, as described in further detail below. In the example shown in FIG. 1A, results of the verification process are provided by the handwriting verification server to a post-processing section 790 for further processing (e.g., formatting results for display, storing results, analyzing results, transmitting results to other devices, etc.). The post-processing section 790 may be implemented in the handwriting verification server 700 and/or in one or more other devices.

The handwriting verification server 700 can verify the authenticity of handwriting input data provided in various forms (e.g., integrated data, streamed data, raw pen event data). For example, as shown in FIG. 1A, the input devices 10 and 12 can transmit raw handwriting data to a handwriting data processing section 100, which can generate and transmit streamed data or integrated data to the handwriting verification server 700 over the network 20, as described in further detail below.

FIG. 1B is a functional block diagram of an illustrative handwriting data processing section 100. The handwriting data processing section 100 may be implemented (e.g., as software or hardware) within a handwriting input device or in some other device that may communicate with the input device directly (e.g., via a USB connection) or over a network.

In the example shown in FIG. 1B, the handwriting data processing section 100 comprises an input handling section 101, a stream generating section 200, a lossy data processing section 300, and an integrating section 400. The input handling section 101 is responsible for forwarding raw handwriting data for further processing by, e.g., the stream generating section 200 and the lossy data processing section 300. The stream generating section 200 receives raw handwriting data as input and generates streamed data (e.g., separate streams for x-coordinate, y-coordinate, and pressure information, along with header information). In at least one embodiment, the stream generating section 200 uses lossless encoding techniques to generate compressed streamed data comprising a plurality of streams.

In the example shown in FIG. 1B, the lossy data processing section 300 also receives raw handwriting data as input. The lossy data processing section 300 can use lossy data processing techniques (that is, techniques that may involve data loss) to generate stroke data (which can be used to render the handwriting as an image) and/or image data (e.g., image data in a PNG format or some other image data format). For example, the lossy data processing section 300 may include an ink engine configured to perform data formatting and processing that may be needed to render a visual representation of the handwriting (e.g., a signature) for display. As an alternative to the arrangement shown in FIG. 1B, in which stroke data and/or image data is generated based on raw handwriting data, the lossy data processing section 300 can generate output based on streamed data provided by the stream generating section 200.

In the example shown in FIG. 1B, the integrating section 400 receives the streamed data and the stroke and/or image data as input and outputs integrated handwriting data. The integrating section 400 may output integrated data in a single output file (e.g., an image file) or it may separately output streamed data and/or stroke/image data. In at least one embodiment, streamed data can be converted into an encoded binary format, and the integrated data can take the form of a digital image with the encoded binary data inserted steganographically into the digital image.

The arrangements shown in FIGS. 1A and 1B are only examples. Many other arrangements are possible. For example, although handwriting input and handwriting verification are described with reference to FIG. 1A as occurring in different devices (e.g., in input devices and the handwriting verification server 700, respectively), handwriting input and handwriting verification also can be performed within the same device. As another example, although handwriting input devices and a handwriting verification server are described with reference to FIG. 1A as communicating within a cloud computing arrangement 1 over a wide-area network such as the Internet 20, input devices and the handwriting verification server also can communicate in some other way (e.g., over a local-area network). As another example, the details of how the handwriting data processing section 100 operates may vary depending on implementation and/or context. As another example, a handwriting data processing section 100 is not required for providing handwriting data to be verified according to the techniques described herein. In the example shown in FIG. 1A, input device 14 generates raw pen event data and transmits the raw pen event data over the network 20 to the handwriting verification server 700 without intermediate processing by a handwriting data processing section 100.

Figure 2A:
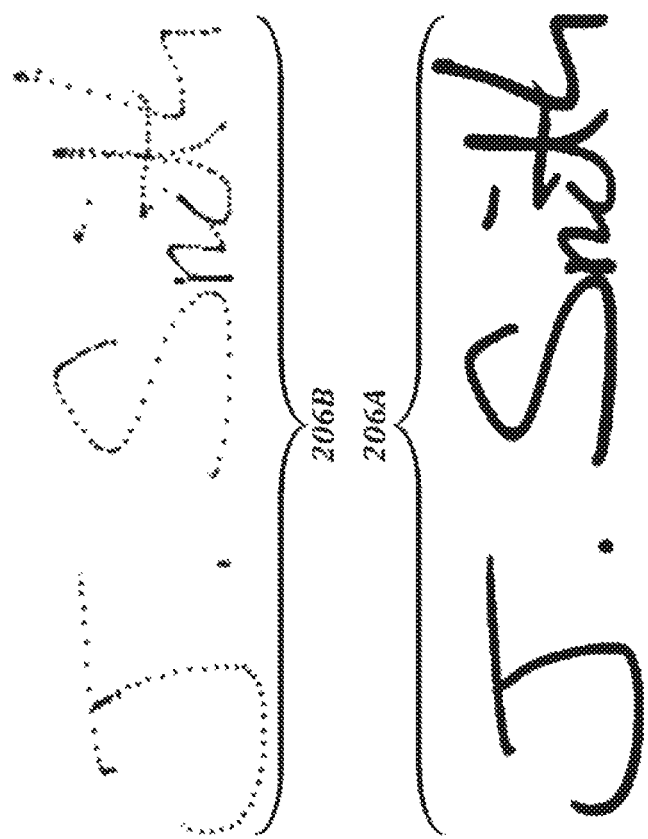
FIG. 2A is an illustration of a handwritten signature comprising a plurality of pen events.

In accordance with embodiments described herein, a handwriting sample to be verified (or "test sample") can be a handwritten signature (see FIG. 2A) or any other type of handwriting, such as printed characters or an artistic drawing.

Figure 2B:
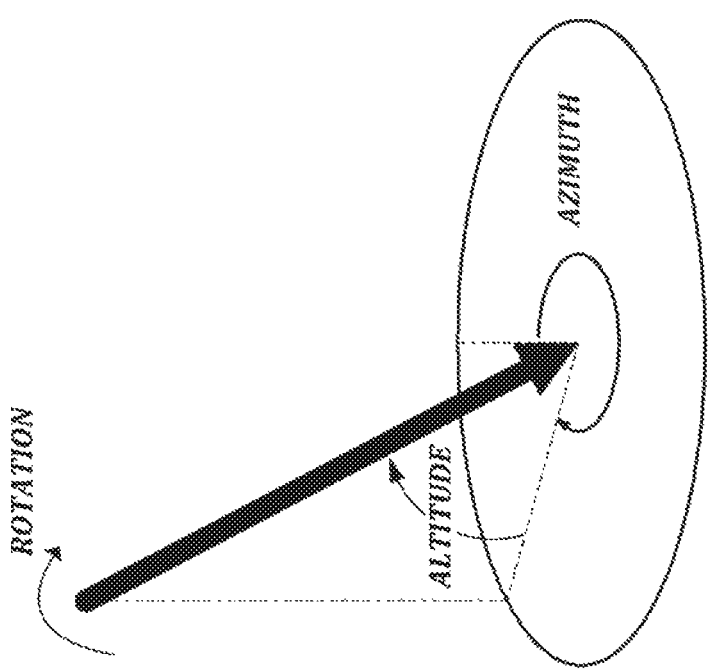
FIG. 2B is a diagram of rotation, altitude, and azimuth parameters that can be detected for a pen device.

In described embodiments, handwriting data can be represented as a sequence of pen events. Typically, a pen event records the position of the pen tip (e.g., while on the surface of or within a limited range of a digitizer) at a particular time. In addition to x/y-coordinate values, some handwriting input devices also may detect other information such as pen angle, writing speed, writing pressure, etc. Depending on device capabilities, pen data associated with pen events may include additional measurements such as pen pressure and angles. In the example shown in FIG. 2B, rotation, altitude, and azimuth are among the parameters that can be detected for a pen device (represented by a large black arrow 208).

Referring again to FIG. 2A, an illustrative handwritten signature 206A comprises a plurality of pen events are detected by a pen device and digitizer using technology (e.g., EMR technology) that allows pen events to continue to be detected when the pen is lifted from the surface of the digitizer, as long as the pen remains within signal range. In the example shown in FIG. 2A, coordinates detected when the pen is up are depicted as lighter dots, and coordinates detected while the pen is down are depicted as darker dots.

Figure 2C:
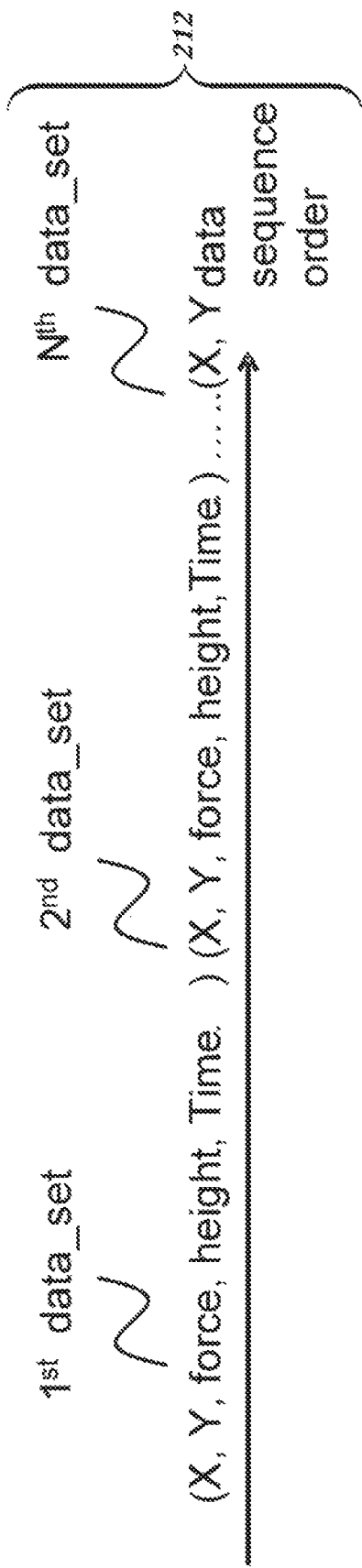
FIG. 2C is an illustration of an example data structure that can be used to represent a pen event and a data sequence order of such pen events.

FIG. 2C is an illustration of an example data structure 210 that can be used to represent a pen event and a data sequence order 212 of such pen events. A sequence of pen events can be provided as input to, for example, a handwriting verification server 700, either in a raw form and/or in a preprocessed form (e.g., via a handwriting data processing section 100, which may be used to put the pen event data into the form of streamed data and/or integrated data). In the example shown in FIG. 2C, the data structure 210 can be implemented as a "struct" or "class" type. Alternatively, the data structure 210 can be implemented in some other way. In described embodiments, pen events are provided in the order they occurred in the data sequence order 212.

Figure 3:
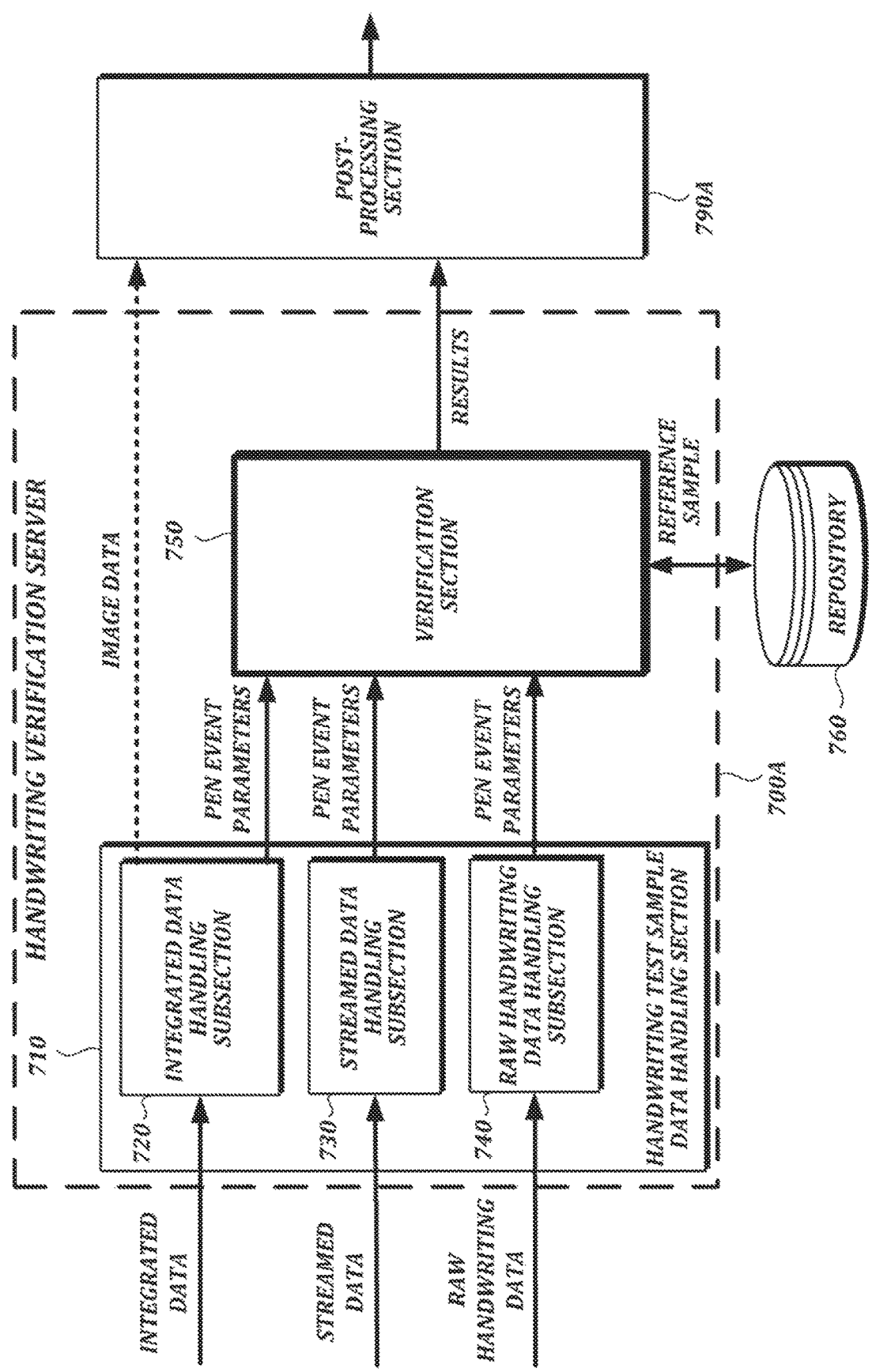
FIG. 3 is a functional block diagram of a handwriting verification service that may be implemented in a handwriting verification server.

FIG. 3 is a functional block diagram of a handwriting verification service 700A that may be implemented in a handwriting verification server (e.g., the handwriting verification server 700 shown in FIG. 1A). In the example shown in FIG. 3, the handwriting verification service 700A comprises a handwriting test sample data handling section 710 comprising subsections 720, 730, and 740 that are configured to process handwriting data in various forms. In the illustrated example, an integrated data handling subsection 720, a streamed data handling subsection 730, and a raw handwriting data subsection 740 are configured to receive integrated data, streamed data, and raw handwriting data, respectively, as input, and generate pen event parameters as output. Some of the data handling sections may be capable of outputting other data, as well. For example, in the example shown in FIG. 3, integrated data handling section 720 is configured to extract image data from the integrated data and transmit the image data to post-processing section 790A for further processing.

In the example shown in FIG. 3, a verification section 750 receives pen event parameters from the handwriting test sample data handling section 710 and receives a reference sample from a repository 760. (The repository 760 may be implemented on a device separate from the handwriting verification service 700A, as shown in FIG. 3, or the repository may be implemented on the same device as the service 700A.) The verification section 750 verifies the authenticity of a handwriting test sample by comparing features derived from the pen event parameters with features of the reference sample.

Figure 4:
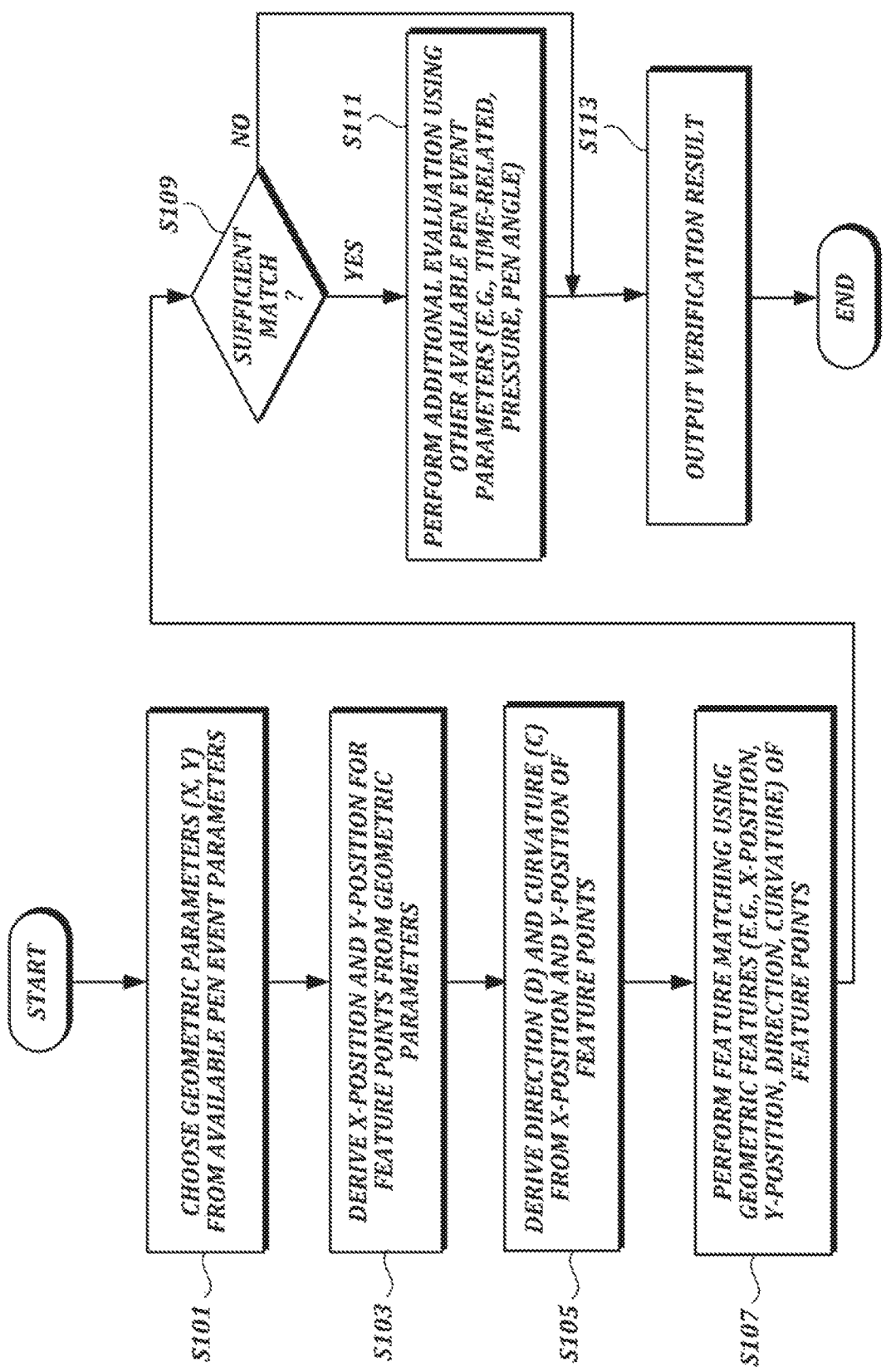
FIG. 4 is a flow chart of an example dynamic handwriting verification process.

An example dynamic handwriting verification process is shown in FIG. 4. The verification process shown in FIG. 4 can be performed by a handwriting verification server (e.g., handwriting verification server 700 in FIG. 1A) or by some other device. The verification process shown in FIG. 4 can be performed in a cloud computing arrangement (e.g., cloud computing arrangement 1 shown FIG. 1A) or in some other arrangement. In described embodiments, the verification process uses geometric parameters of the handwriting in a handwriting test sample to derive handwriting features that can be compared with features in a reference sample.

In the example shown in FIG. 4, geometric parameters of the handwriting are chosen from available pen event parameters at step S101. In this example, geometric parameters of the handwriting include x-coordinate values and y-coordinate values. The available pen event parameters from which the geometric parameters are chosen may include, in addition to the x-coordinate values and y-coordinate values, pressure values, angle values, time stamp information, or the like. The available pen event parameters may depend on factors such as the capabilities of the input device that was used to create the handwriting.

Because the speed of ordinary handwriting varies, the detection of x-coordinate and y-coordinate positions at regular time intervals results in variable spacing between the detected positions. Referring again to the example signature shown in FIG. 2A, the coordinate positions 206B of the pen events are detected at regular intervals (e.g., at a sample rate of 133 points per second, 200 points per second, or some other sample rate). Therefore, greater spacing between the coordinate positions 206B indicates portions of the signature in which the pen is moving faster, and narrower spacing indicates portions in which the pen is moving slower.

Referring again to FIG. 4, in order to facilitate comparison of feature points in handwriting test samples and reference samples, feature points are derived from the geometric parameters of the handwriting at step S103. Feature points derived in this way follow the handwriting path of the sample but need not be co-located with pen events. In at least one embodiment, feature points are evenly distributed along the handwriting path. However, feature points can be distributed in other ways.

Figure 5:
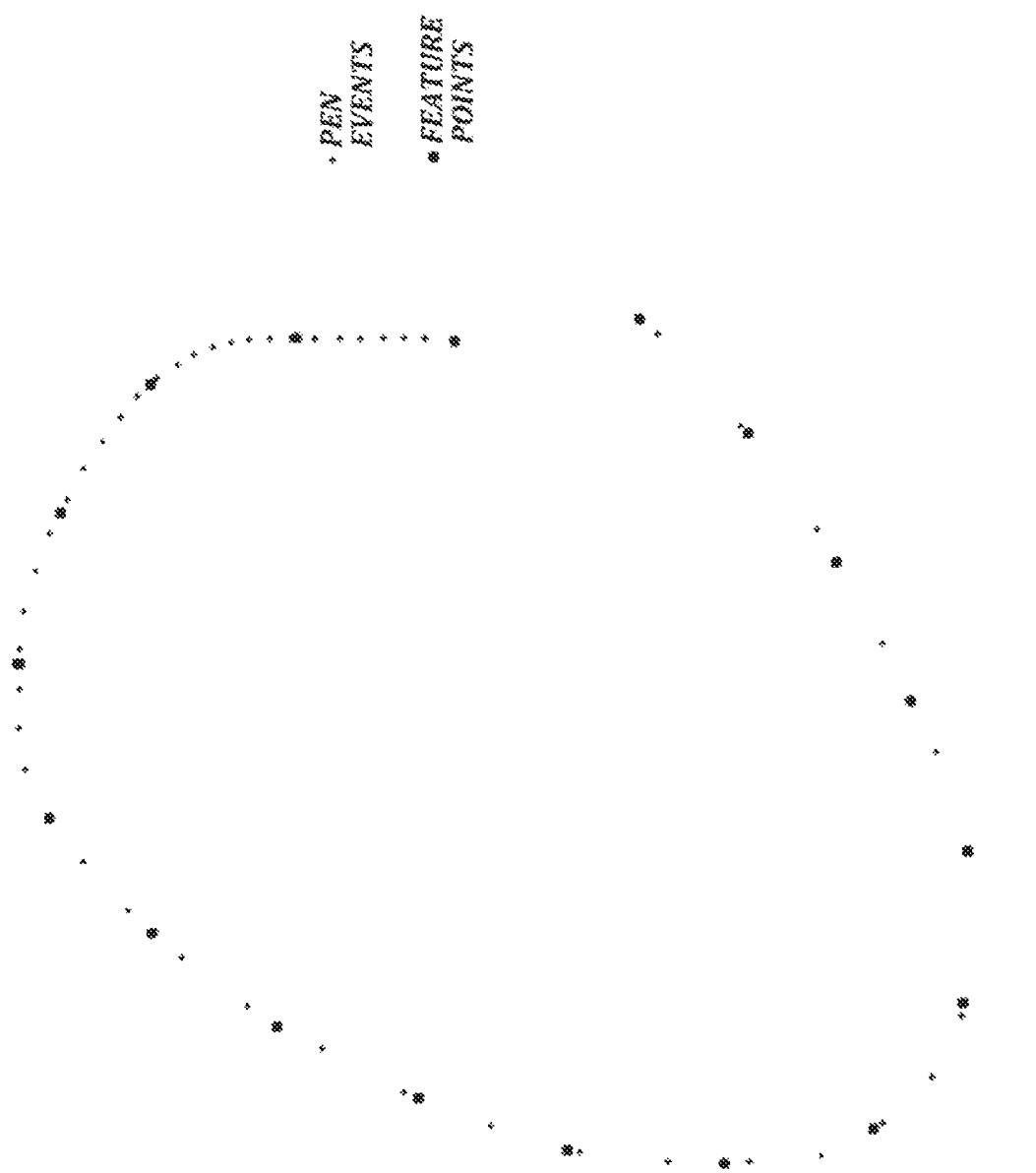
FIG. 5 is an illustration of feature points along a handwriting path.

FIG. 5 depicts illustrative spacing of feature points along a handwriting path. In the example shown in FIG. 5, the feature points are evenly distributed. In general, decreasing the spacing tends to increase the number of feature points, which can lead to increased processing time. On the other hand, increasing the spacing tends to decrease the number of feature points, which can lead to decreased accuracy and omission of important features in the handwriting. In at least one embodiment, a regular spacing of 1 mm is used as a compromise to balance reasonable processing time with accurate detection of important handwriting features.

The particular spacing that is used can vary depending on implementation. For example, the spacing between feature points need not be uniform. According to one alternative approach, feature points can be positioned according to a density normalization process in which the spacing between densely packed pen events is expanded for the corresponding feature points. In such an approach, feature points may or may not be co-located with original pen events. The density normalization process also can include inserting feature points into portions of the handwriting path where pen events are sparse. The density normalization process can be applied to the test sample and to the reference sample to resolve point density differences between the samples while still allowing for some variation in spacing between feature points, which can help to preserve information relating to speed and acceleration of handwriting. The density normalization process can help to provide comparable sets of feature points between samples obtained by devices with different sampling rates.

Referring again to FIG. 4, each of the feature points (see step S103) is associated with a corresponding x-position and y-position calculated at regular spatial intervals along the handwriting path. In at least one embodiment, the x-positions and the y-positions of the respective feature points are calculated as shown in FIG. 6.

Figure 6:
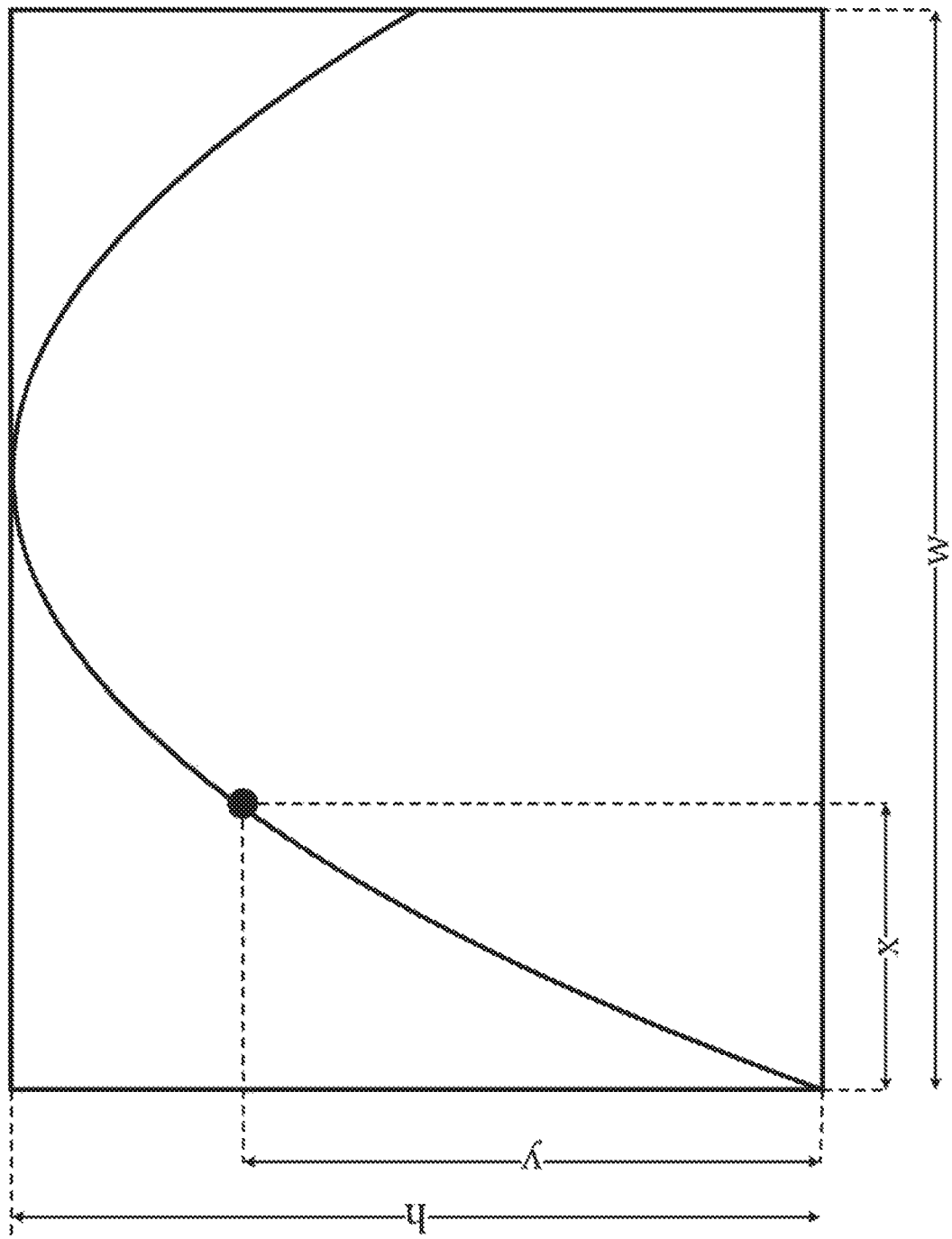
FIG. 6 is a graph that illustrates calculations of x-positions and y-positions of respective feature points.

In the example shown in FIG. 6, the x-position (X) and the y-position (Y) of the feature points are defined as the proportion of the x-coordinate value or y-coordinate value, respectively, relative to an overall value of the respective dimension (e.g., width (w) or height (h)) of the handwriting or some portion of the handwriting (e.g., a stroke).

In at least one embodiment, feature points are defined for the entire length of a handwriting sample, including pen-up areas in which the pen was not in contact with the tablet surface. In some circumstances, pen-up information will not be available between strokes. This can occur, for example, when a capture device is used that does not support pen-up data, or when a pen is held at a distance from the digitizer such that pen-up data cannot be detected. If pen-up information is not available, feature points can be generated within the limits of pen-down pen events.

Referring again to FIG. 4, at step S105, direction (D) and curvature (C) are derived from x-positions and y-positions of the derived feature points. In this example, the direction and curvature values derived at step S105 are not based on x/y-coordinate values from the original pen events. In at least one embodiment, direction and curvature are derived for a current feature point based on x-positions and y-positions of previous feature points and subsequent feature points, as shown in FIGS. 7A and 7B.

Figure 7A:
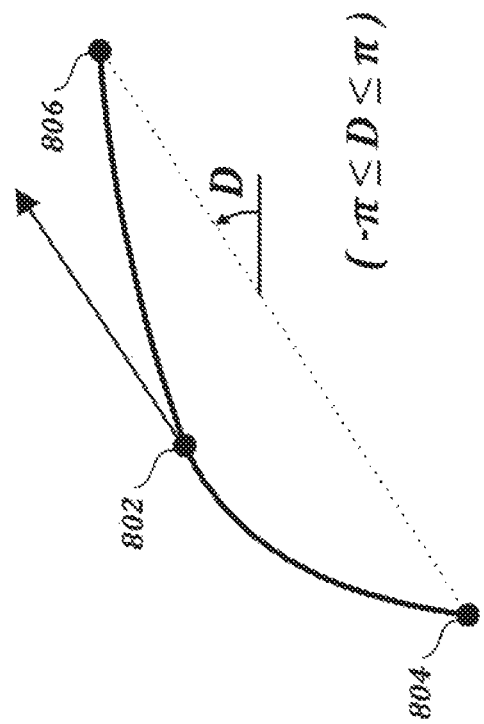
FIGS. 7A and 7B are illustrations that depict calculations of direction and curvature, respectively, for a current feature point based on x-positions and y-positions of previous feature points and subsequent feature points.
Figure 7B:
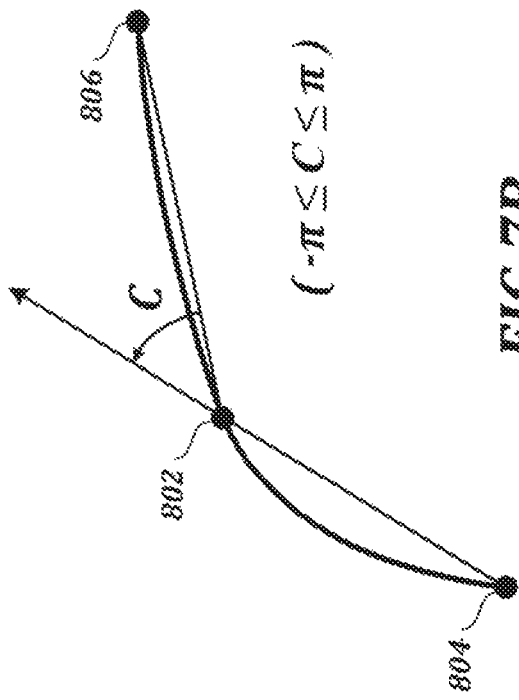

In the example shown in FIG. 7A, the direction D for a current feature point 802 is calculated as the angle (relative to the horizontal, in radians) of the line between the previous feature point 804 and the next feature point 806. In the example shown in FIG. 7B, the curvature C for a current feature point 802 is calculated as the angle (in radians) between the line that connects the current feature point 802 to the previous feature point 804 and the line that connects the current feature point 802 to the next feature point 806.

Referring again to FIG. 4, at step S107 feature matching is performed using geometric features (e.g., x-position, y-position, direction, curvature) of the feature points. In this example, the goal of the feature matching is to link corresponding geometric features in a handwriting sample to be verified (or test sample) and a reference sample while providing flexibility to account for natural variation in authentic handwriting. The feature matching of step S107 may include more than one feature matching pass, as described in further detail below.

Figure 8:
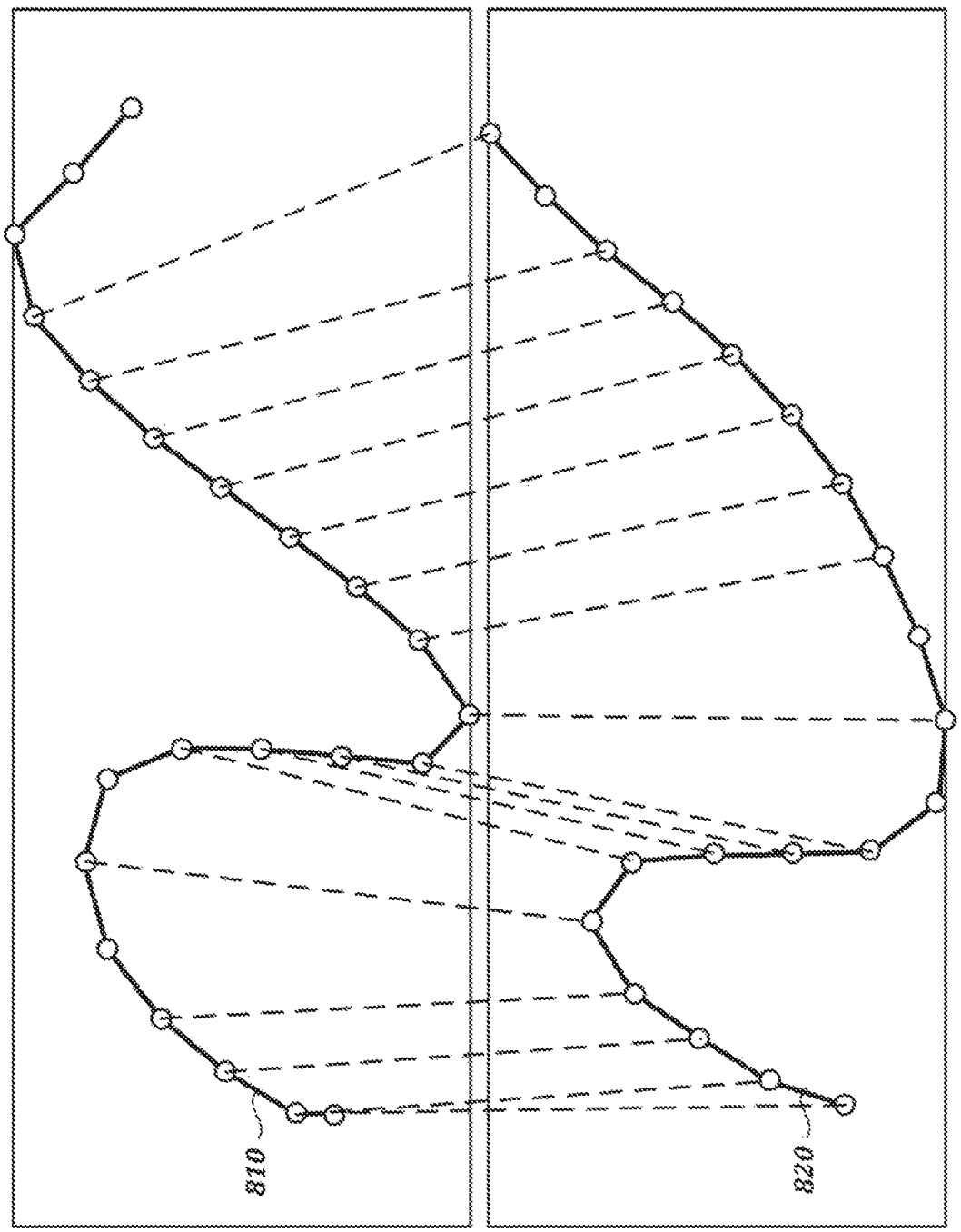
FIG. 8 is diagram of mappings established between a test sample and a reference sample by a feature matching technique.

FIG. 8 is an illustration of mappings established between a test sample 810 and a reference sample 820 by a feature matching technique (e.g., step S107 in FIG. 4). In the example illustrated in FIG. 8, the mappings comprise links (represented by dashed lines) established between corresponding feature points (represented by circles) in a test sample 810 and a reference sample 820. The consistency of the handwriting line at each end of the link can be referred to as the "energy" of the link. In this example, the energy is measured in terms of the differences between x-position (X), y-position (Y), direction (D), and curvature (C) values of the linked feature points.

In at least one embodiment, the energy is measured according to the following equation:

$$e_i = k_x(X_r - X_t)^2 + k_y(Y_r - Y_t)^2 + k_d(D_r - D_t)^2 + k_c(C_r - C_t)^2 \quad [\text{Math.1}]$$

where $e_i$ is the energy of the $i^{th}$ link, connecting a reference sample r with a test sample t; $X_r$, $Y_r$, $D_r$, and $C_r$ are the x, y, direction and curvature values for the reference sample; $X_t$, $Y_t$, $D_t$, and $C_t$ are the x, y, direction and curvature values for the test sample; and $k_x$, $k_y$, $k_d$, and $k_c$ are weighting factors for the different energy components.

In at least one embodiment, an optimal set of links is one that achieves a minimum total energy (E) of the system, which can be defined according to the following equation:

$$E = \Sigma e_i + k_u n_u \quad [\text{Math.2}]$$

where $e_i$ is the energy of the $i^{th}$ link; $k_u$ is a constant representing the energy of an unlinked feature; and $n_u$ is the number of unlinked features (if any).

In at least one embodiment, numerical annealing is used to minimize the differences between the feature points at the ends of each link, and thereby minimize the energy E. In particular, in at least one embodiment, a method of simulated annealing is used to make pseudo-random changes to the link, which may increase or decrease the overall energy.

In one example annealing process, which is now described with reference to FIGS. 9A-9D, changes that result in a reduction of the overall energy are always accepted, and changes that result in energy increases may be accepted depending on factors such as the current temperature of the system, which may be progressively reduced. The term "temperature" as used herein refers to the mathematical energy of the system and does not refer to any actual thermal energy. Similarly, related terms such as "cooling" are used to refer to reduction of the mathematical energy, and do not refer to any change in actual thermal energy.

"Energy" and "temperature" are related terms that can be used to model the annealing process. In at least one embodiment, a goal of the annealing process is to find the best set of links between corresponding features in two signatures. The relative merit of any of the possible linking patterns can be determined by assessing the similarity of the geometric features such as position, line direction and curvature at linked feature points. The energy of a link is a measure of the differences between the two feature points. Zero energy indicates a state of having identical features, and the energy increases as the differences become more substantial.

The annealing process tries to minimize the total energy of the system by adjusting the set of links. However, if individual adjustments that increase the total energy were never permitted, the probability of the annealing process becoming trapped in a local minimum of total energy would increase. To address this situation, the annealing process can be designed to reduce the probability of the process becoming trapped in a local minimum by allowing some changes that result in an increase in energy, thereby allowing for the possibility that subsequent changes may achieve lower total energy.

The temperature of the system can be used to control the likelihood of a change that increases the total energy. In at least one embodiment, the temperature is initially set at a relatively high value that allows increases in energy to occur more frequently. The temperature is reduced as the annealing process proceeds. As the temperature drops, the likelihood of increased energy is reduced until stability in the system is reached.

Figure 9A:
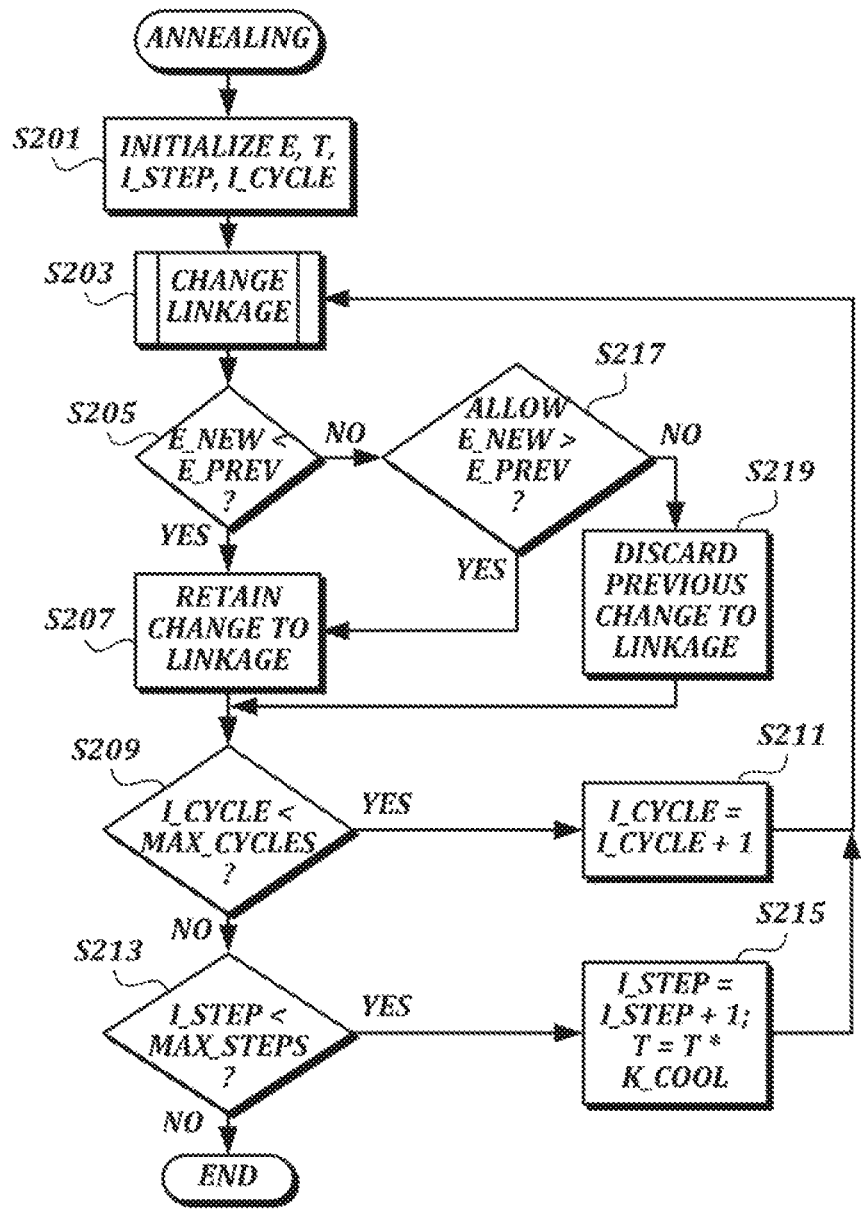
FIG. 9A is a flow chart of an example annealing process that can be used in a handwriting verification process.
Figure 9B:
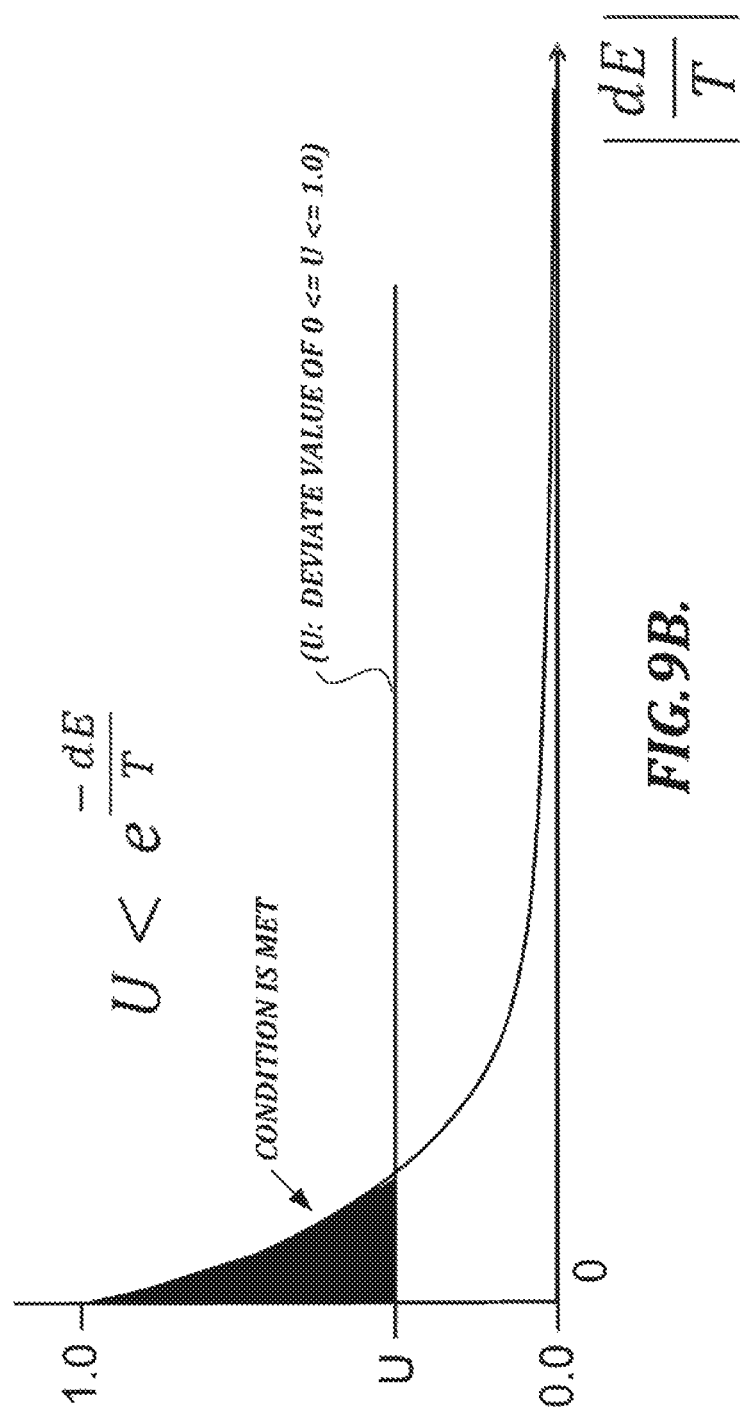
FIG. 9B is a graph that illustrates conditions for allowing increases in energy during an annealing process used in a handwriting verification process.

Referring now to the example annealing process illustrated in FIG. 9A, at step S201 the variables E (energy), T (temperature), I_step, and I_cycle are initialized. At step S203, the linkage is changed. In this context, the term "linkage" is used to refer generally to the one or more links between the test sample and the reference sample. Therefore, at step S203, the set of links between the test sample and reference sample is changed in some way. (An example process by which the set of links can be changed is described in detail below with reference to FIG. 9C.)

At step S205, the total energy of the changed linkage (E_new) is compared with the total energy of the previous state of the linkage (E_prev). If E_new is less than or equal to E_prev, the change to the linkage is retained at step S207. If E_new is greater than E_prev, a determination is made at step S217 as to whether the change to the linkage can still be accepted.

In at least one embodiment, increases in energy may be accepted depending on a ratio involving the magnitude of the change (dE) and the current temperature. In the example shown in FIG. 9B, increases in energy (positive dE) are allowed when the following condition is met:

$$U < e^{\frac{-dE}{T}} \quad [\text{Math. 3}]$$

where U is a uniform deviate value in the range of 0<=U<=1.0, dE is the change in overall energy resulting from the change to the linkage, and T is the current temperature of the system. A uniform deviate is used to generate one or more pseudo-random values U. A single uniform deviate generator is used for the entire comparison between the test sample and the reference sample, and it is always initialized with the same seed. This ensures that the comparison of the test sample and the reference sample always returns the same result.

Figure 9C:
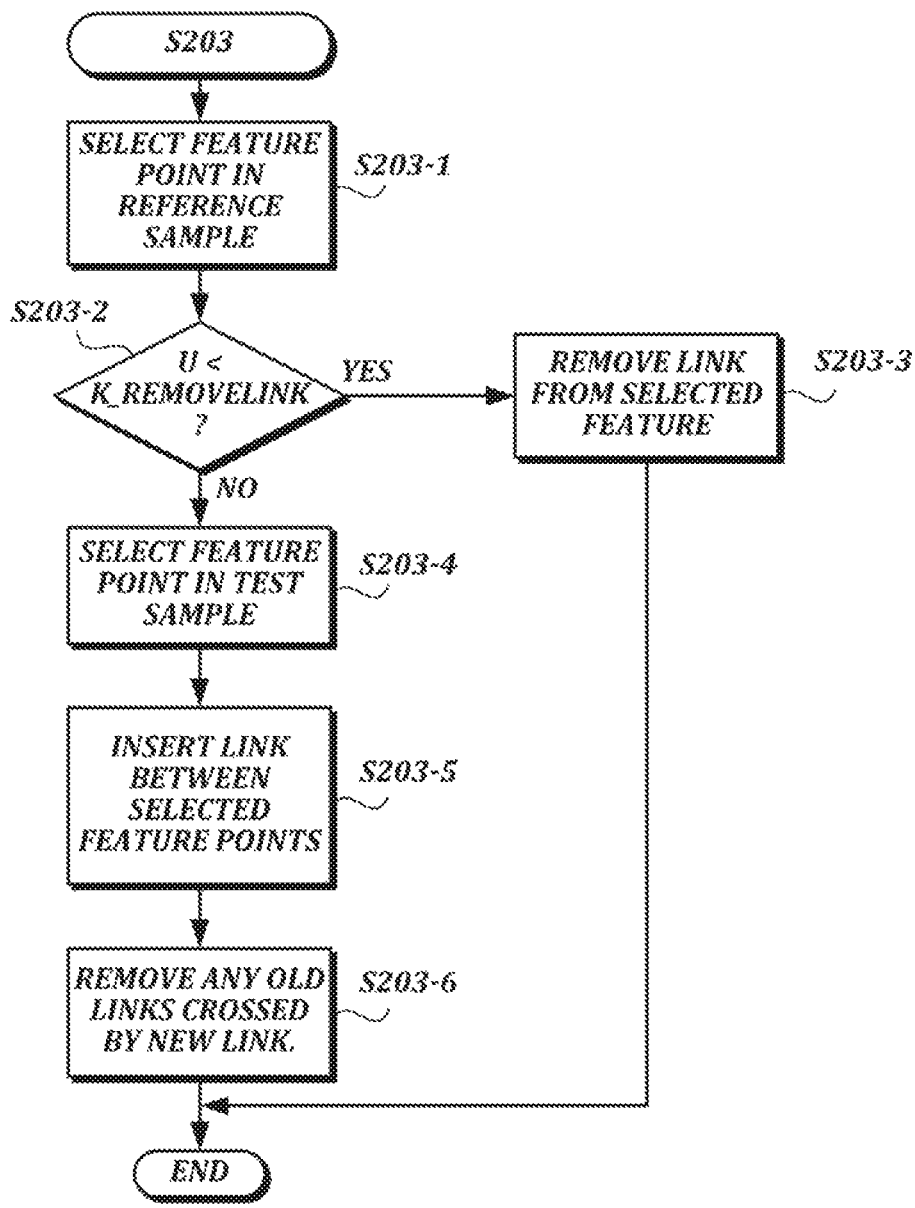
FIG. 9C is a flow chart of an example process by which a set of links can be changed in an annealing process used in a handwriting verification process.
Figure 9D:
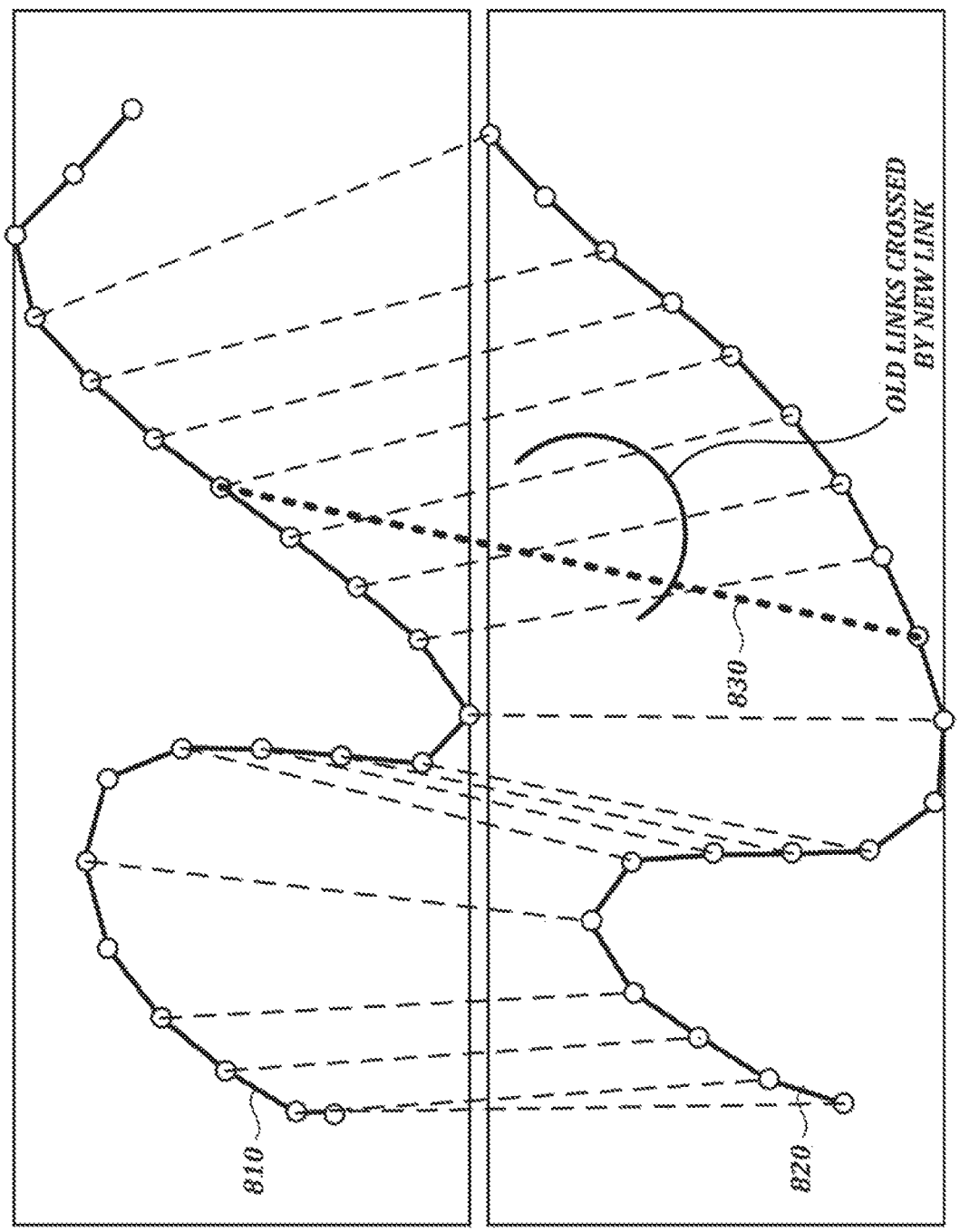
FIG. 9D is diagram of an illustrative change in a set of links during an annealing process used in a handwriting verification process.

An example process by which the linkage can be changed (see step S203 in FIG. 9A) will now be described with reference to FIG. 9C. At step S203-1, a feature point is selected in a reference sample. At step S203-2, a determination is made as to whether the uniform deviate value U is less than the constant K_RemoveLink.

In at least one embodiment, step S203-2 is performed at each change to the linkage by pseudo-randomly determining to either remove a link or set a new link by comparing the value U with the constant K_RemoveLink. The value of K_RemoveLink can be set to bias the determination towards either removing an existing link or setting a new link. Experiments indicate that it is desirable if about 30% of the changes consist of removing the link, in which case K_RemoveLink would be set to 0.3. The value of constant K_RemoveLink can vary depending on implementation.

If U is less than K_RemoveLink, the link is removed from the selected feature point at step S203-3. (This step allows the annealing process to remove a link without inserting any others to replace it, to ensure that more possible changes to the linkage are achievable.) Otherwise, a feature point in the test sample is selected at step S203-4, and a link is inserted between the selected feature points in the reference sample and the test sample at step S203-5. At step S203-6, any previously existing links that are crossed by the newly inserted link are removed from the linkage. In the example shown in FIG. 9D, a new link 830 crosses three previously existing links, which are removed from the linkage according to the example process described in FIG. 9C.

In general, it is desirable to ensure that enough changes are made to the linkage to allow the minimum energy state to be achieved and to ensure that the temperature is reduced sufficiently to allow the solution to settle in an optimal state. Referring again to FIG. 9A, steps S209-S215 are used to determine whether the annealing process has reached its end. In the example shown in FIG. 9A, I_cycle is incremented at step S211 until a maximum value (Max_cycles) is reached (see step S209), and I_step is incremented at step S215 until a maximum value (Max_steps) is reached (see step S213). When I_step is incremented at step S215, the temperature (T) of the overall system also is reduced by multiplying T by a cooling factor (K_cool). The number of steps is the number of temperature changes that are made, with the temperature being reduced by the cooling factor at each stage. The number of cycles is the number of changes that are attempted at each temperature level. Values such as Max_cycles, Max_steps, and K_cool can vary depending on implementation.

The annealing process can be made more accurate, at the possible expense of processing speed, by using a larger number of cycles and more gradual temperature reductions. In at least one embodiment, annealing parameters (e.g., number of cycles, cooling factor for temperature reductions) are chosen to get adequate accuracy quickly in the majority of cases. However, this can occasionally result in poor linkage between two samples that would otherwise have acceptable linkage if the annealing was adequate.

Figure 9E:
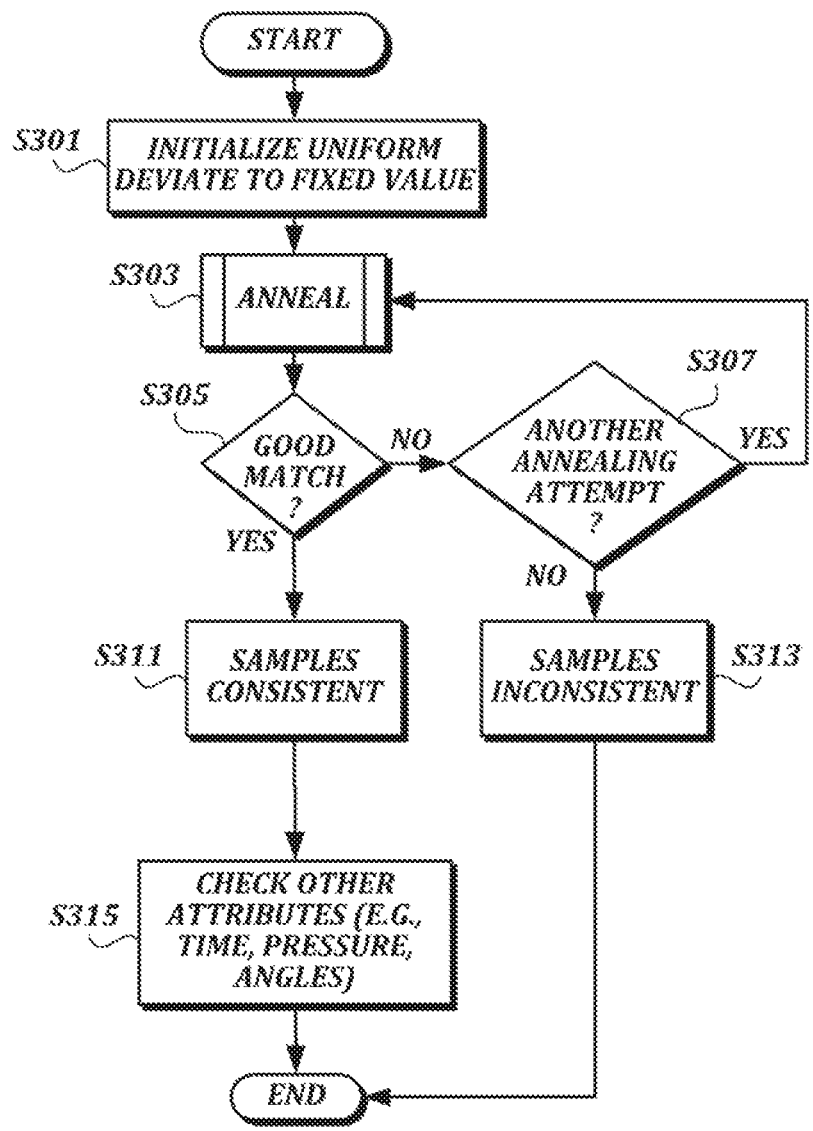
FIG. 9E is a flow chart of an example process by which annealing can be repeated in a handwriting verification process.

To help determine whether poor linkage is a result of dissimilarity between samples or an inaccurate initial annealing process, a second annealing process can be performed with a different initial seed. An example process by which annealing can be repeated is illustrated in FIG. 9E. At step S301, a uniform deviate is initialized to a fixed value. At step S303, an annealing process is performed, such as the process shown in FIG. 9A. At step S305, if a good match is found between the two samples, a determination is made at step S311 that the samples are consistent. Other attributes (e.g., time values, pressure values, angle values) also can be checked at step S315 to confirm the consistency of the samples.

If a good match is not found at step S305, a check is performed at step S307 to determine whether another annealing attempt will be made. The check performed at step S307 may involve comparing the number of annealing steps already performed with a maximum value. For example, in at least one embodiment, if 2 annealing attempts have not been made yet, the annealing step S303 is repeated without resetting the uniform deviate generator in order to guarantee that the same random sequence will not be used in the subsequent annealing step. Otherwise, with 2 annealing attempts having been made, a determination is made at step S313 that the samples are inconsistent.

After annealing has been performed, the resulting linkage will include a set of links, each with a known energy. However, not all feature points will be linked unless the samples are identical or nearly identical. The quality of the linkage can be assessed by calculating a proportion (Pl) of the feature points that are linked and the mean link energy (Em) according to the following equations:

$$P_l = \frac{2n_l}{n_r + n_t}$$ [Math. 4]

$$E_m = \frac{\sum e_l}{n_l}$$ [Math. 5]

where $P_l$ is the proportion of features that are linked, $n_l$ is the total number of links, $n_r$ is the number of features in the reference sample, and $n_t$ is the number of features in the test sample. In embodiments that use the above equations to assess linkage quality, consistent signatures will have high values of $P_l$ and low values of Em. Conversely, dissimilar samples will have low values of $P_l$ and high values of Em.

Figure 10:
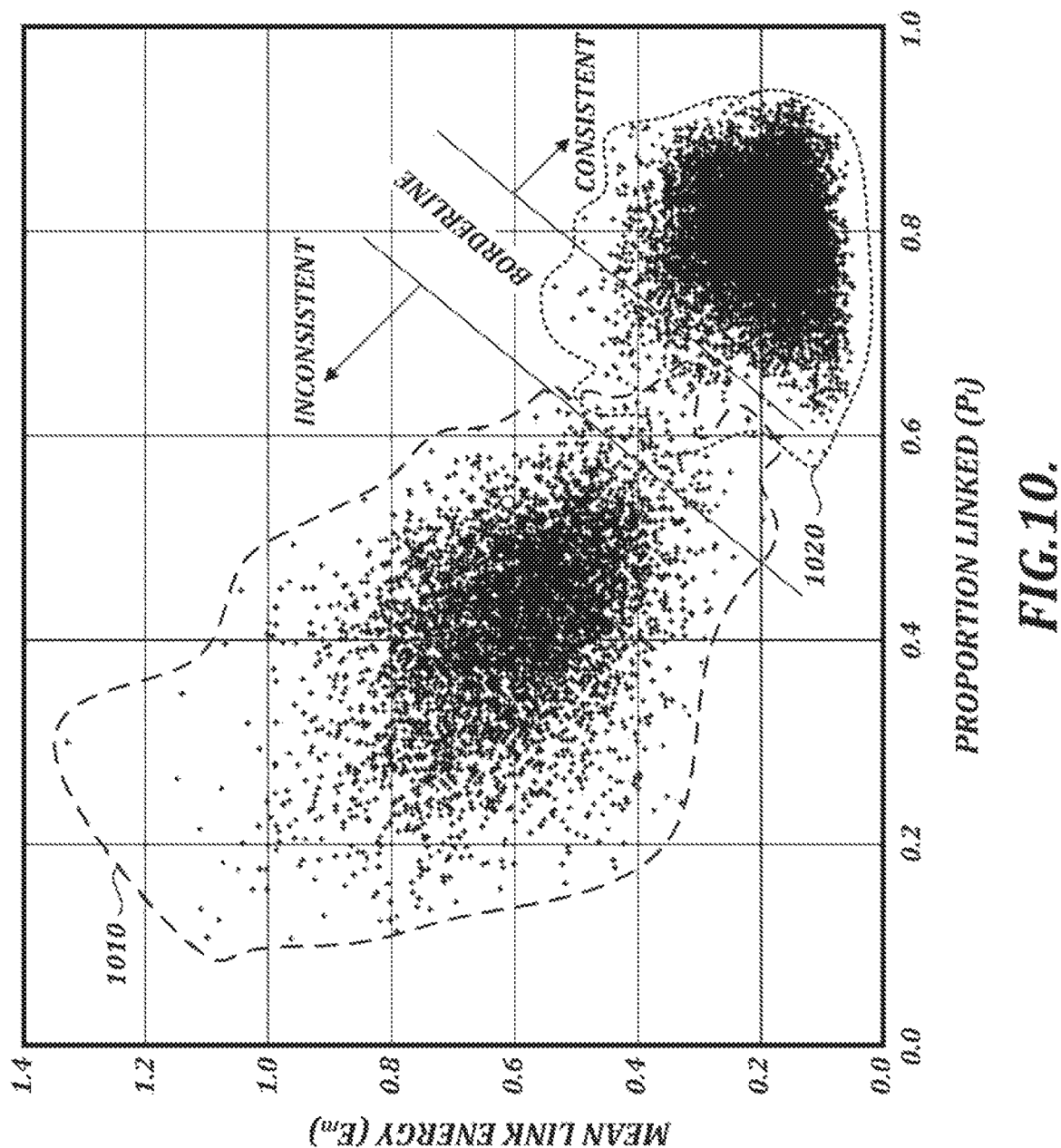
FIG. 10 is a graph showing results from a test in which the proportion of features that are linked and the mean link energy for a large number of signatures have been plotted.

The expected difference in $P_l$ and Em values for consistent signatures and inconsistent signatures can be measured empirically. In FIG. 10, results are shown from a test in which the proportion Pl and the mean link energy Em for a large number of signatures have been plotted. The plot points in the region 1010 within the dashed line are each associated with a comparison of samples that are from different people and therefore likely to be inconsistent. The plot points in region 1020 within the dotted line are each associated with a comparison samples that are from the same person and therefore likely to be consistent.

In the example shown in FIG. 10, a large majority of data points in region 1010 reflect Pl and Em values associated with inconsistent samples, and a large majority of data points in region 1020 reflect Pl and Em values associated with consistent samples. There is some overlap between the regions 1010 and 1020 in an area labeled as "borderline," in which the Pl and Em values do not clearly indicate whether the samples are consistent or inconsistent. However, the results in FIG. 10 show that it is possible in many cases to make an initial assessment of whether the test sample and the reference sample are consistent based on handwriting geometry. In at least one embodiment, test samples that are identified as inconsistent at this stage are automatically given a verification score of 0, and no further processing is done to determine whether the test sample is consistent with the reference sample.

Although the Pl and Em values are effective for measuring linkage quality in many scenarios, they may not reflect significant differences between a test sample and a reference sample if a substantial portion of the samples are very similar. It is possible to improve the accuracy of handwriting verification by performing an additional check to determine whether there is a significant section of unlinked feature points between the test sample and the reference sample.

Referring again to FIG. 4, at step S109 a determination is made as to whether the test sample and the reference sample are a sufficient match. In the example shown in FIG. 4, if the test sample and the reference sample are determined to be a sufficient match at step S109, then further processing is performed (see step S111, described in further detail below) before outputting a result of the verification at step S113. However, if the test sample and the reference sample are determined not to be a sufficient match at step S109, a result showing the samples to be inconsistent can be output at step S113 without further processing.

The output produced at step S113 can be any output that is suitable to indicate a result of the verification, such as a Boolean value. Alternatively, a different value that allows for indicating more than just a binary or true/false result can be used. In least one embodiment, the output produced at step S113 comprises a floating point value ranging from 0

(indicating that the test sample and the reference sample are very different) to 1.0 (indicating that the test sample and the reference sample are very similar).

Figure 11:
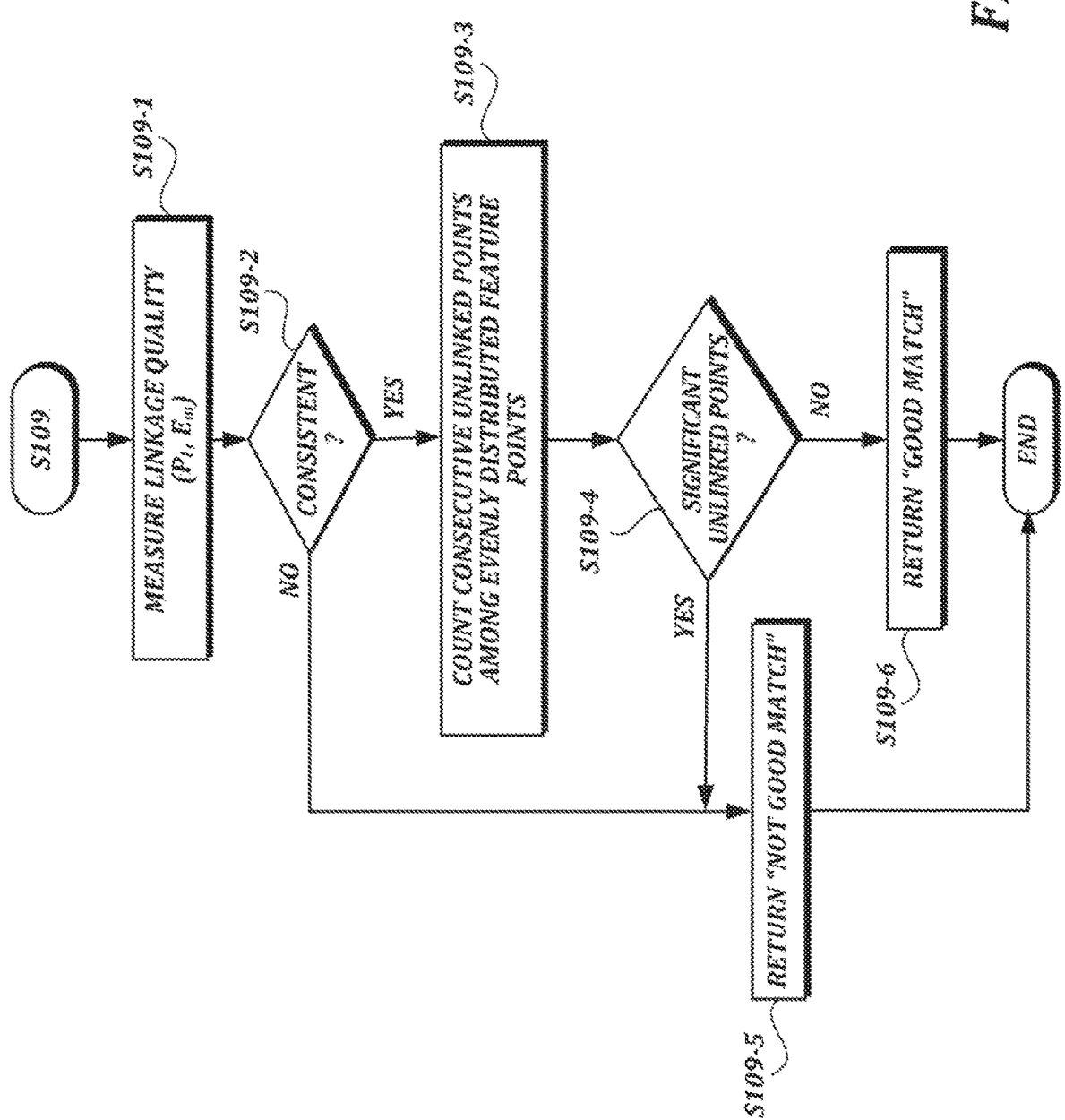
FIG. 11 is a flow chart of an example sample matching process that includes a count of consecutive unlinked feature points.

FIG. 11 illustrates an example matching process S109 that includes a count of consecutive unlinked feature points. In the example shown in FIG. 11, at step S109-1 an initial measure of linkage quality is performed by determining Pl and Em values for linkage between a test sample and a reference sample. As mentioned above with reference to FIG. 10, at step S109-2, if the values of Pl and Em indicate that the test sample and the reference sample are not consistent, the process S109 returns a result indicating that the test sample and the reference sample are not a good match (not consistent) at step S109-5, and further processing in the matching process S109 can be omitted. However, if the values of Pl and Em indicate that the test sample and the reference sample are consistent, at step S109-3 consecutive unlinked feature points are counted.

Figure 12A:
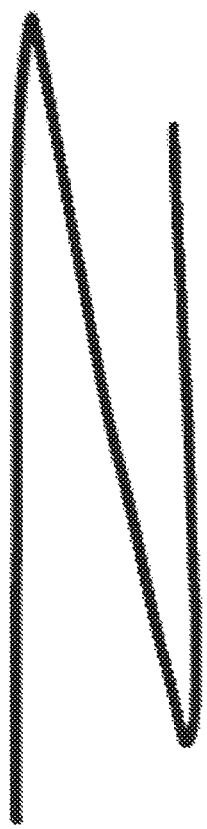
FIGS. 12A and 12B are illustrations of a test sample and a reference sample, respectively, that may be processed according to a sample matching process that includes a count of consecutive unlinked feature points.
Figure 12B:
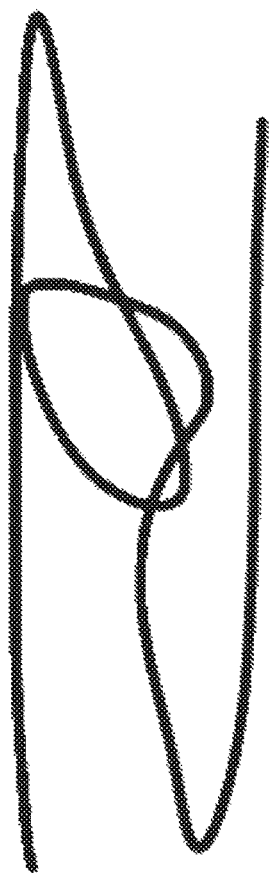

FIGS. 12A and 12B depict a test sample and a reference sample, respectively, that may be processed according to the matching process S109 illustrated in FIG. 11. FIG. 12A depicts an example test sample having a "Z" shape, and FIG. 12B depicts an example reference sample having a similar "Z" shape, but with an additional loop. Substantial portions of the two samples depicted in FIGS. 12A and 12B are identical or very similar. Thus, a high proportion of the features depicted in FIGS. 12A and 12B may be linked with very low link energies. The additional loop in the reference sample shown in FIG. 12B may be unlinked, but the overall linkage and link energy may be similar to what would be expected in natural variations among authentic signatures.

The samples depicted in FIGS. 12A and 12B are illustrative of a scenario in which the values of Pl and Em may indicate that the test sample and the reference sample are consistent, despite a significant missing feature in the test sample. An additional check for consecutive unlinked feature points (as illustrated in FIG. 11) may be used to improve the accuracy of the matching process. In the illustrative scenario depicted in FIGS. 12A and 12B, the matching process illustrated in FIG. 11 may be used to determine that the respective samples are not consistent due to the missing feature.

Referring again to FIG. 11, at step 109-4 a determination is made whether the unlinked feature points are significant. If the unlinked feature points are significant, the process S109 returns a result indicating that the test sample and the reference sample are not a good match (not consistent) at step S109-5. If the unlinked feature points are not significant, the process S109 returns a result indicating that the test sample and the reference sample are a good match (consistent) at step S109-6.

In at least one embodiment, determining whether the unlinked feature points are significant includes determining whether the count of consecutive unlinked features points in an unlinked section is greater than a predetermined value NU. Counts that are greater than NU can be added, and the total length of these counts can be represented as a proportion (referred to as "proportion free," or Pf) of the overall sample length. Counts that are less than or equal to NU can be ignored. The value of NU can vary depending on implementation. Samples with a Pf value exceeding a predetermined value can be deemed inconsistent.

Referring again to FIG. 4, if a test sample and a reference sample have been initially determined to be a sufficient match at step S109 based on handwriting geometry, additional evaluation is performed at step S111 using other pen event parameters that are not limited to handwriting geometry.

In at least one embodiment, the additional evaluation performed at step S11 comprises non-geometric feature matching, which can include analysis of time-related pen event parameters, such as writing speed. Individuals tend to develop a habitual rhythm in the way they write with a pen, which means that pen speed and acceleration tend to be very similar (though not identical) for handwriting (e.g., signatures) made by the same person. Thus, time-related pen event parameters, which differ from the geometric features that are analyzed in other steps, can be useful in a handwriting verification process (e.g., as a supplement to geometric feature matching). In at least one embodiment, geometric features can be extracted from raw handwriting data along with elapsed time corresponding to the respective features, allowing comparison of elapsed time values.

Figure 13A:
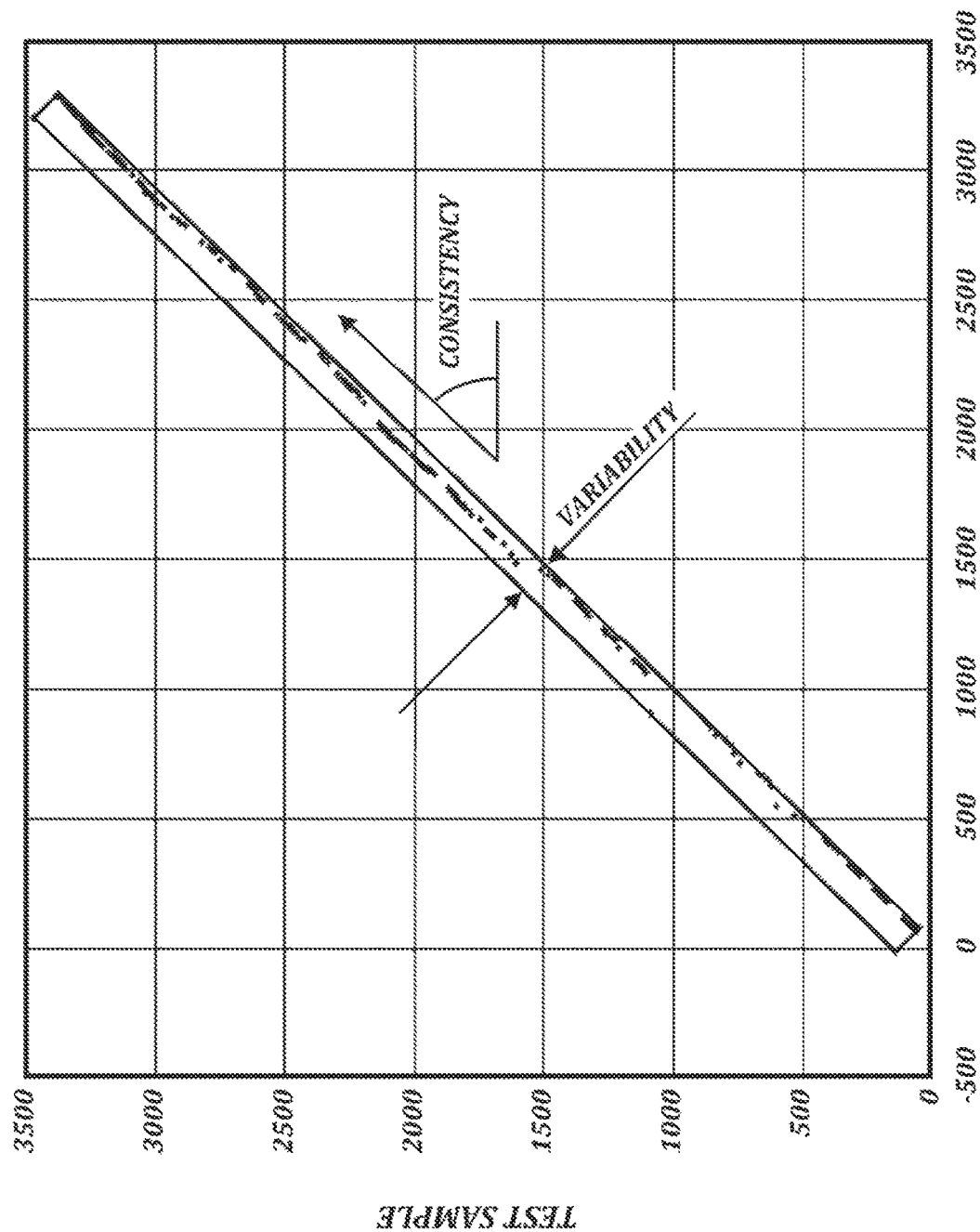
FIG. 13A is a graph that illustrates results of comparison of elapsed time values corresponding to feature points in two handwriting samples.

FIG. 13A is a graph that illustrates results of comparison of elapsed time values corresponding to feature points in two handwriting samples. The results are illustrated in FIG. 13 as a plot corresponding to elapsed time for linked feature points. Each point in the plot corresponds to a link and represents the elapsed time to a feature point in a reference sample (horizontal axis) and the elapsed time to a linked feature point in a test sample (vertical axis). For signatures that are consistent, the elapsed time from the start of the signature should be similar for each pair of linked feature points.

In the example shown in FIG. 13A, the points are plotted inside a rectangle that represents overall consistency (by the rectangle's diagonal slope, or angle from the horizontal) and variability (by the rectangle's narrower dimension, as indicated by the perpendicular arrows) of speed. Overall consistency in this context refers to the average total time elapsed (and therefore the speed) of the respective samples. In this example, the rectangle's slope of approximately 1:1 indicates that the samples have a consistent average speed. Variability in this context refers to differences in local changes in speed. Acceptable limits in overall consistency and variability of speed can be measured through testing of signature samples that are known to be made by the same person.

Referring again to FIG. 4, the additional evaluation performed at step S111 also can include analysis of other parameters, such as pen pressure or pen angles. Pen pressures can be reliably compared by assessing the status (e.g., increasing, decreasing, or steady) of the pressure at each feature point. Consistency of pressure can be calculated as a proportion Pp of links that have the same pressure status at each end of the link. An acceptable value of Pp can be determined by measuring pressure variation in a large number of signature samples that are known to be from the same person.

Typically, pen pressures are measured as relative values, rather than as absolute force values. Pressure values are device-dependent, with variations in sensitivity occurring even between devices of the same model due to factors such as differences in construction, hysteresis, and aging of pen materials. Thus, it is not generally possible to make reliable comparisons between samples using absolute force values, particularly if the same person may have used different input devices to provide the samples.

In a first illustrative method of pen pressure value comparison, pen pressures can be compared by assessing the status of the pressure at each feature, e.g., whether the pressure is increasing, decreasing, or steady at each point.

The consistency is then calculated by the proportion $P_p$ of links that have the same pressure status at each end. In at least one experiment, however, the first method was found to be inadequate when the pressure is close to constant for significant periods. When this occurs, it is possible for slight differences to be found as different sign gradients, resulting in significant errors.

Figure 13B:
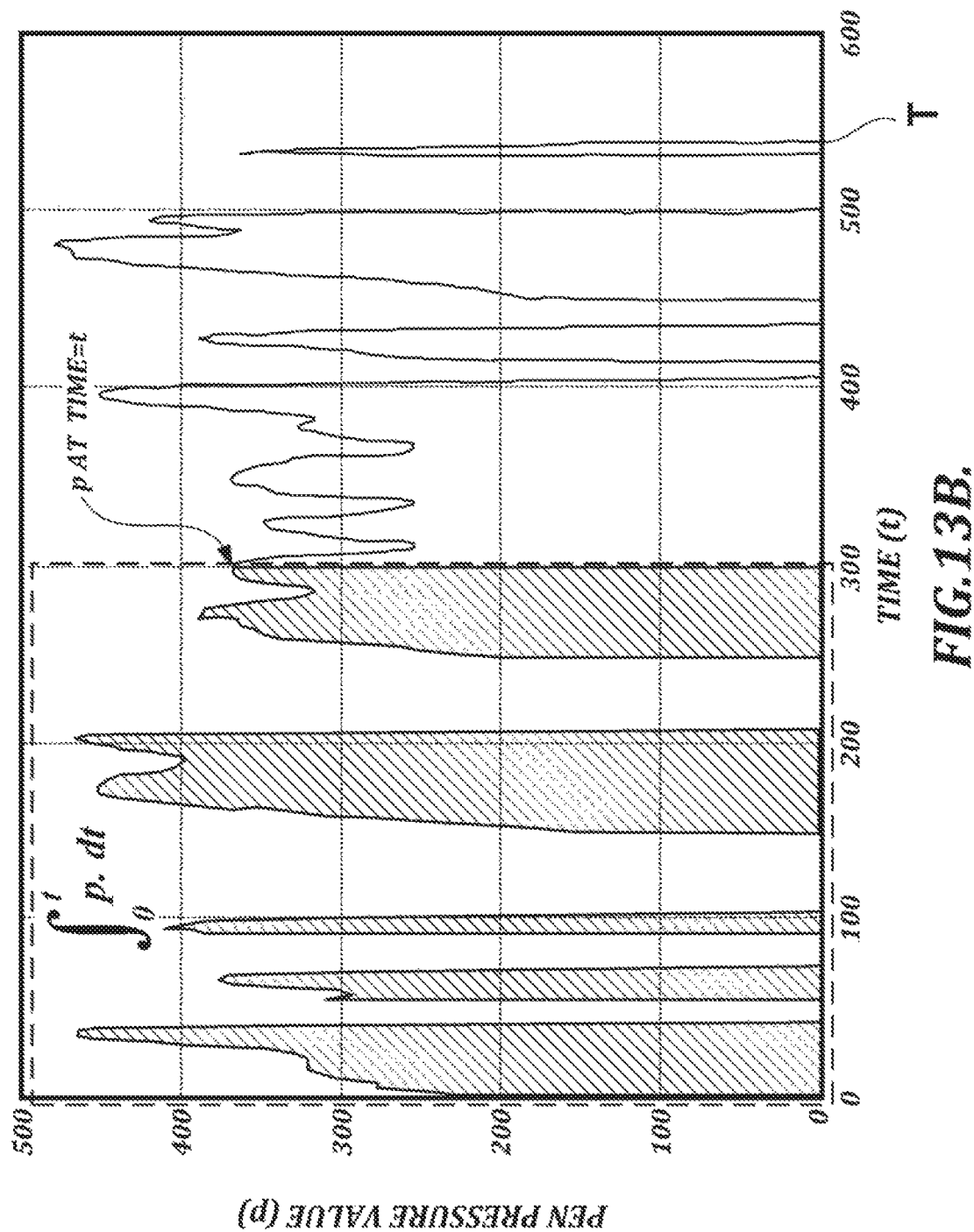
FIG. 13B is a graph that illustrates an area of a pressure-time diagram from the start of the signature to feature i.

In a second illustrative method of pen pressure value comparison, pen pressures can be reliably compared by calculating $P_i$, the area of the pressure-time diagram from the start of the signature to feature i, normalized as a proportion of the overall pressure-time area for the entire signature, according to the following equation:

$$P_i = \frac{\int_0^t p \cdot dt}{\int_0^T p \cdot dt} \quad \text{[Math. 6]}$$

where $P_i$ is the proportion of the pressure-time diagram up to feature i, p is the pen pressure, t is the time from the start of the signature to feature i, and T is the overall signature time. FIG. 13B is a diagram that illustrates the above equation. In FIG. 13B, the horizontal axis shows the elapsed time from the start of the signature, and the vertical axis shows the pressure recorded by the pen tip. The shaded area of the graph in the region defined by the dashed line shows the sum of pen the pressure p(t) from time 0 to time t.

Figure 13C:
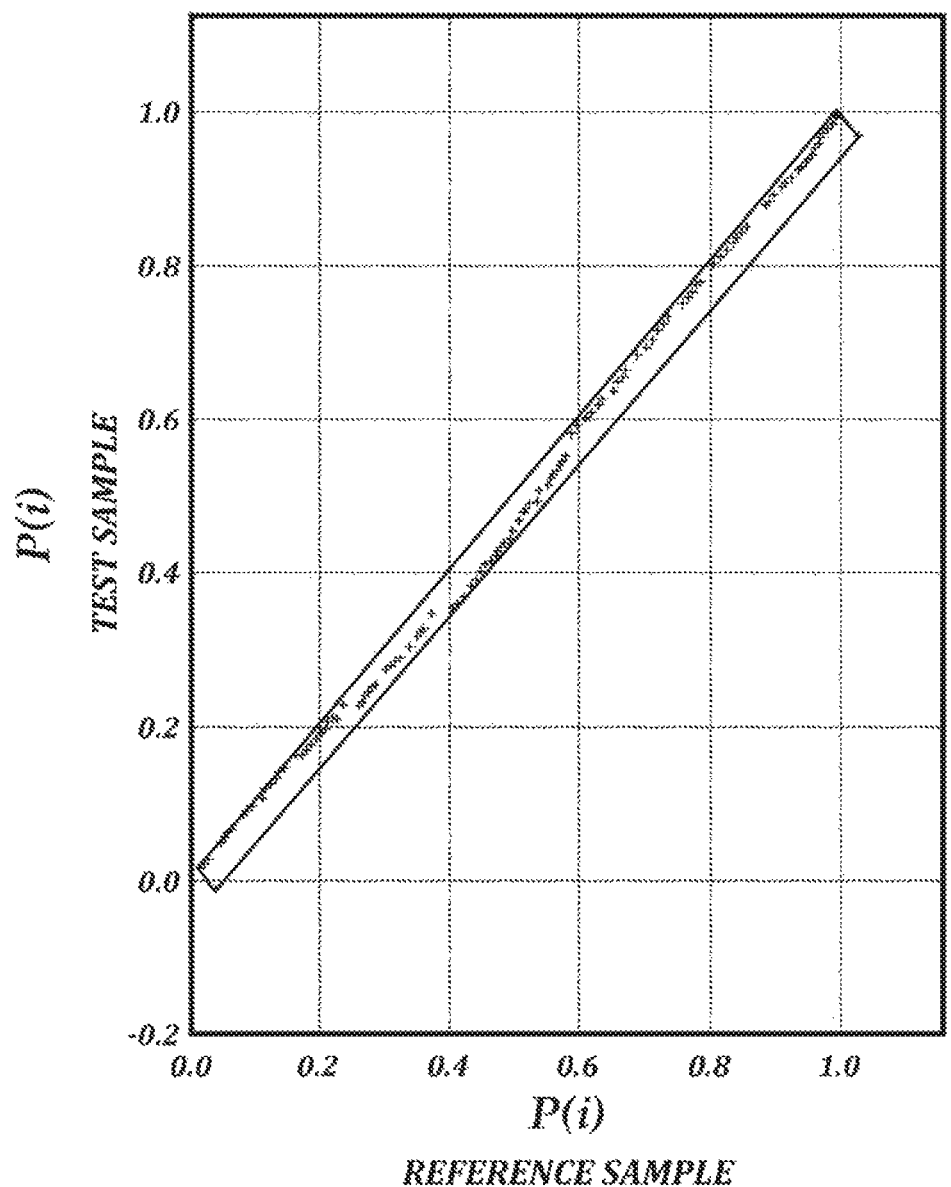
FIG. 13C is a graph that illustrates results of comparison of pressure-time values corresponding to feature points in two handwriting samples.

FIG. 13C is a graph that illustrates results of comparison of pressure-time values corresponding to feature points in two handwriting samples. The results are illustrated in FIG. 13C as a plot corresponding to pressure-time values for linked feature points. Each point in the plot corresponds to a link and represents the proportion of the pressure-time graph to a feature point in a reference sample (horizontal axis) and the proportion of the pressure-time graph to a linked feature point in a test sample (vertical axis). For signatures that are consistent, the proportion of the pressure-time graph is similar for each pair of linked feature points. Note that in this example, the last point of the graph will by definition always be (1.0, 1.0).

Figure 14:
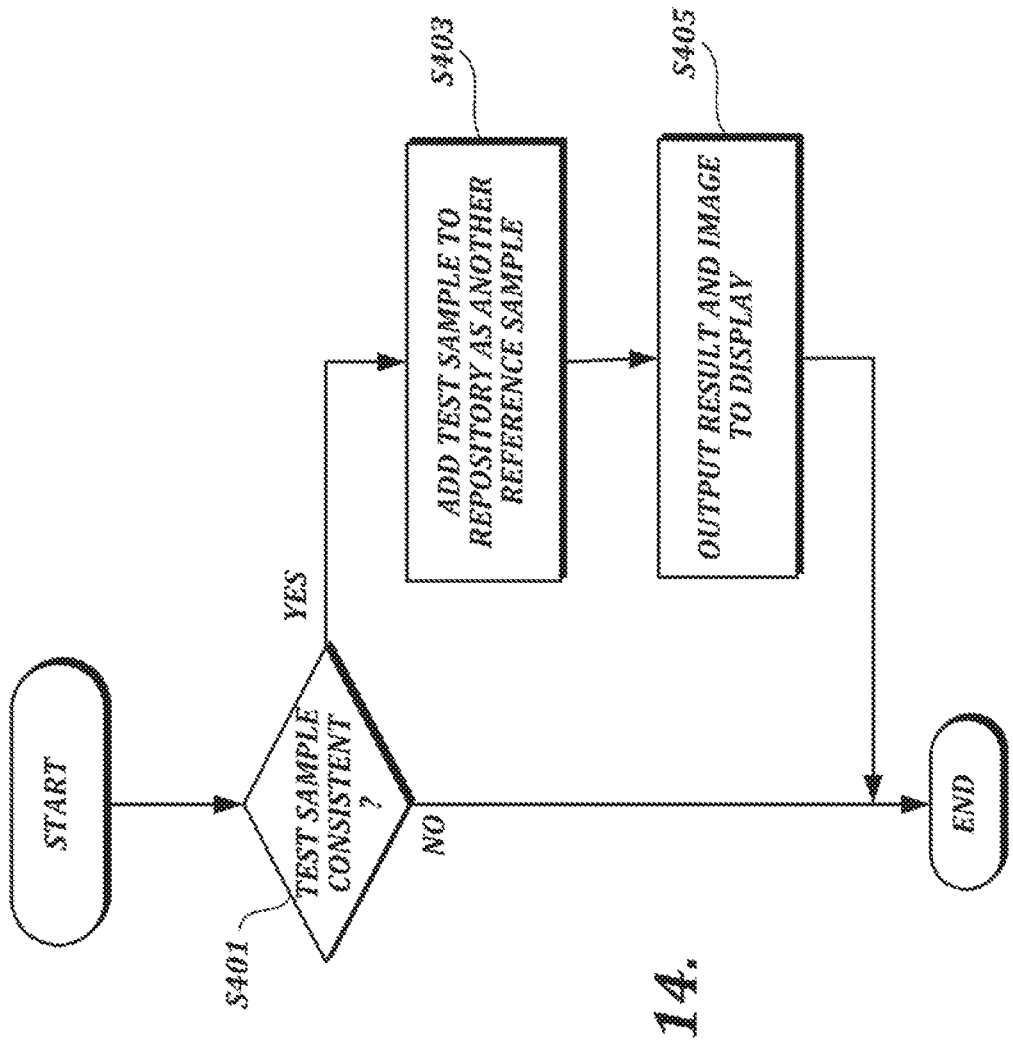
FIG. 14 is a flow chart of an example post-processing process that can be used after a determination has been made as to whether a test sample is consistent or inconsistent with a reference sample.

FIG. 14 is a flow chart of an example post-processing process that can be used after a determination has been made as to whether a test sample is consistent or inconsistent with a reference sample. In the example process illustrated in FIG. 14, if a test sample is determined to be consistent with a reference sample at step S401, the test sample can be added to a repository as another reference sample at step S403. When a test sample is found to be consistent with a reference sample, the test sample can be used to supplement existing reference samples and potentially improve the accuracy of future verification processes. Further, in the example process illustrated in FIG. 14, at step S405 the verification result can be output along with separate image data that can be rendered for display. For example, if the handwriting data for the test sample was integrated with image data, an image of the handwriting can be displayed along with an indicator of the result of the verification process (e.g., whether the handwriting has been verified or not).

Figure 15:
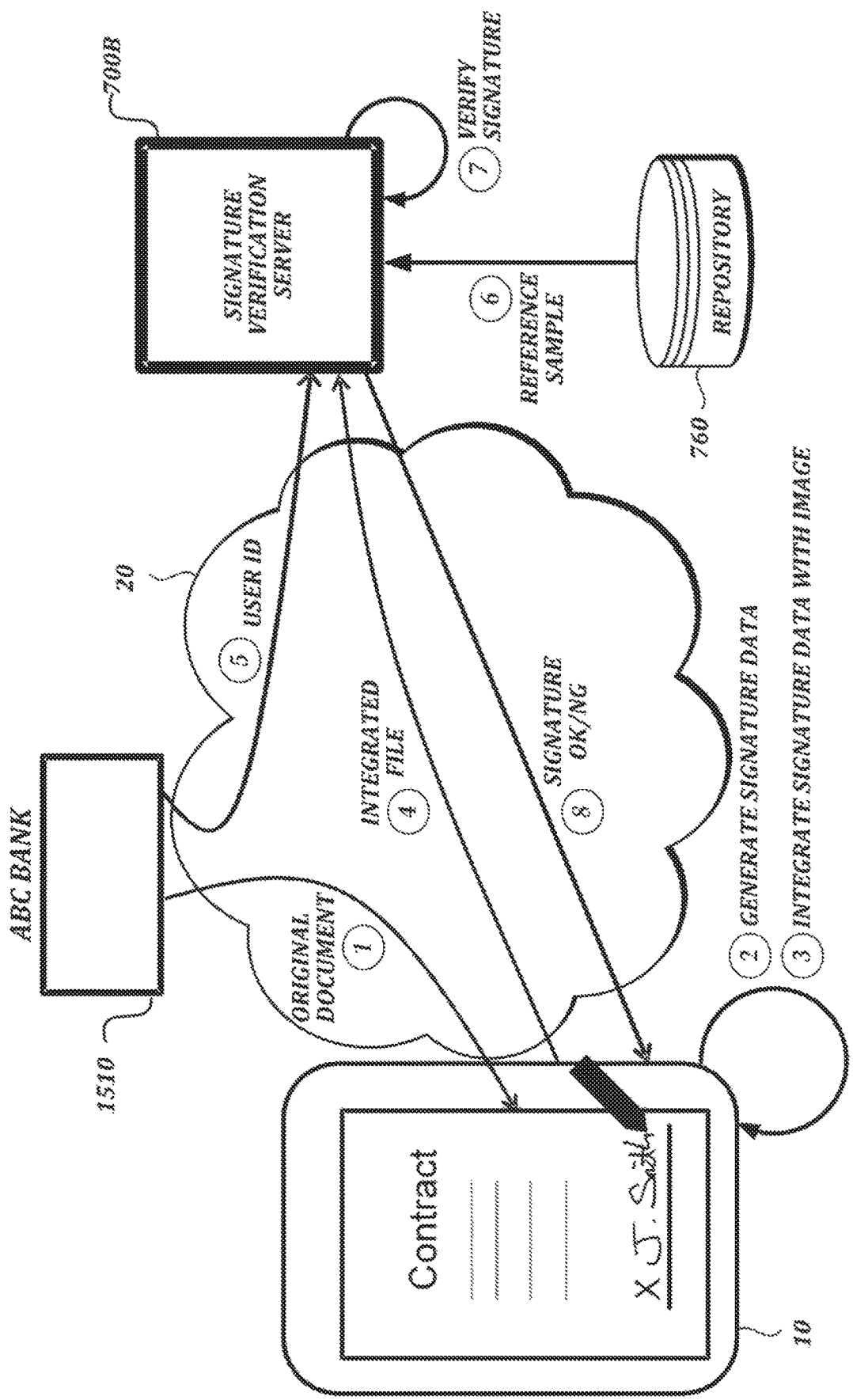
FIG. 15 is a diagram of an illustrative computer system and process for verifying authenticity of a signature.

FIG. 15 is a diagram of an illustrative computer system and process for verifying authenticity of a signature. The particular signature verification techniques that may be used in the system and process depicted in FIG. 15 can vary from those described herein, depending on implementation. In the example shown in FIG. 15, the signature is made on a contract in a banking context.

As shown in FIG. 15, a server 1510 provided by ABC Bank provides an original contract document to a handwriting input device 10 for signature. The input device 10 generates signature data in response to a user's signing the contract and integrates the signature data with an image of the signed contact. The input device 10 provides the integrated file to a signature verification server 700B over a network 20 (e.g., the Internet). The handwriting input device 10 may be implemented as a dedicated handwriting collection device or as a general purpose device, such as a suitably configured smart phone or tablet computer with pen input capability.

In the example shown in FIG. 15, the server 1510 (or some other server controlled by ABC Bank) provides a user ID to the signature verification server 700B. The signature verification server 700B uses the user ID to select an appropriate reference signature in repository 760 to use in a verification process.

FIG. 16 depicts a table 1690 that the signature verification server 700B can use to look up a reference signature based on one or more identifiers (e.g., a service ID (which identifies the entity that provided the document for signature) and the user ID provided by the server 1510). The service ID may be provided by the server 1510, the input device 10, or some other entity. As shown in table 1690, the reference signature can be in any language, and more than one reference signature may be available for a single user.

Referring again to FIG. 15, the signature verification server 700B verifies the signature provided by the input device 10 by comparing the signature with the reference signature. The signature verification server 700B returns a result of the verification to the input device 10 indicating whether the signature is verified ("OK") or not verified ("NG").

Figure 17:
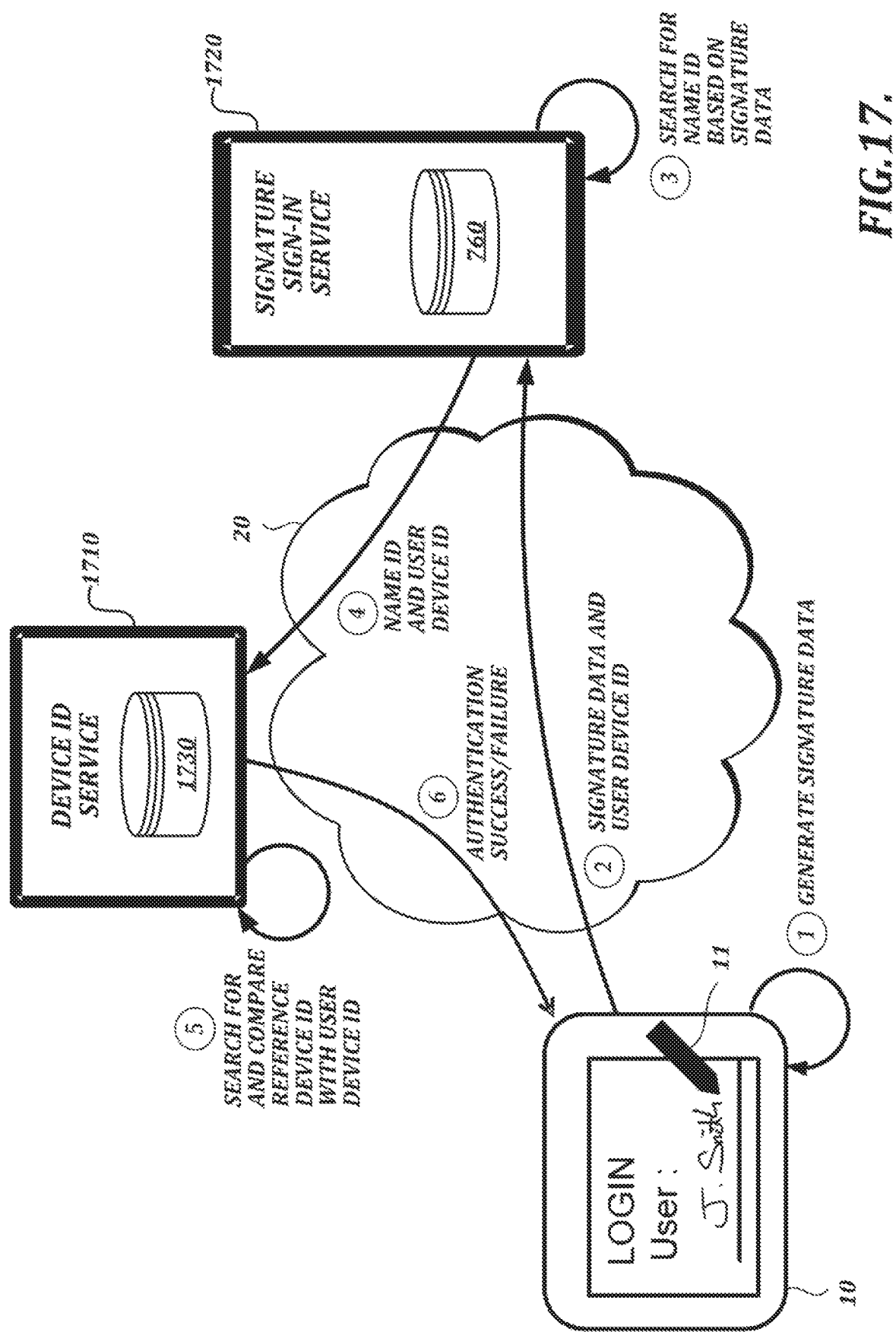
FIG. 17 is a diagram of an illustrative handwriting-based user authentication process in a suitably configured computing system.

FIG. 17 is a diagram of an illustrative computer system and handwriting-based user authentication process that can be used to authenticate a user based on the user's signature. The illustrative computer system and handwriting-based user authentication process depicted in FIG. 17 may use handwriting verification techniques described herein or other handwriting verification techniques for user authentication, depending on implementation.

In the example shown in FIG. 17, an input device 10 generates test signature data in response to a user attempting to sign in to a computer system by signing with a pen/stylus device 11. The input device 10 provides the signature data along with a user device ID (e.g., a stylus ID associated with the pen/stylus device 11) to a signature sign-in service 1720 over a network 20 (e.g., the Internet).

In the example shown in FIG. 17, the signature sign-in service 1720 searches for a "name ID" based on the test signature data provided by the input device 10. The signature sign-in service 1720 can use a verification process to determine whether the test signature data provided by the input device 10 is consistent with corresponding reference signature data associated with one or more reference signatures stored in database 1730.

FIG. 18A is an illustration of a table that can be used to look up an identifier (e.g., in database 1730) based on signature data. In particular, FIG. 18A depicts a table 1890 that the signature sign-in service 1720 can use to look up a name ID (e.g., a local ID combined with a service ID) based on the signature data provided by the input device 10. The local ID may be associated with a user, and the service ID may be associated with a device ID service 1710 (see FIG. 17).

Referring again to FIG. 17, the signature sign-in service 1720 sends the user device ID and the name ID (e.g., local ID plus service ID) to the device ID service 1710. FIG. 18B is an illustration of a table that can be used to look up a reference device ID (e.g., a stylus ID) based on other identifiers. In particular, FIG. 18B depicts a table 1892 that the device ID service 1710 can use to look up a reference device ID that corresponds to the name ID provided by the signature sign-in service 1710. If the reference device ID in the table entry matches the user device ID sent by the signature sign-in service 1720, the device ID service 1710 can send authentication information back to the input device 10. In the example shown in FIG. 17, the authentication information includes an authentication result of "success" or "failure." In addition to the success/failure result, the authentication information transmitted in this example can include (e.g., in the case of "success") a user ID and password that may be required to complete the log-in process.

Figure 19A:
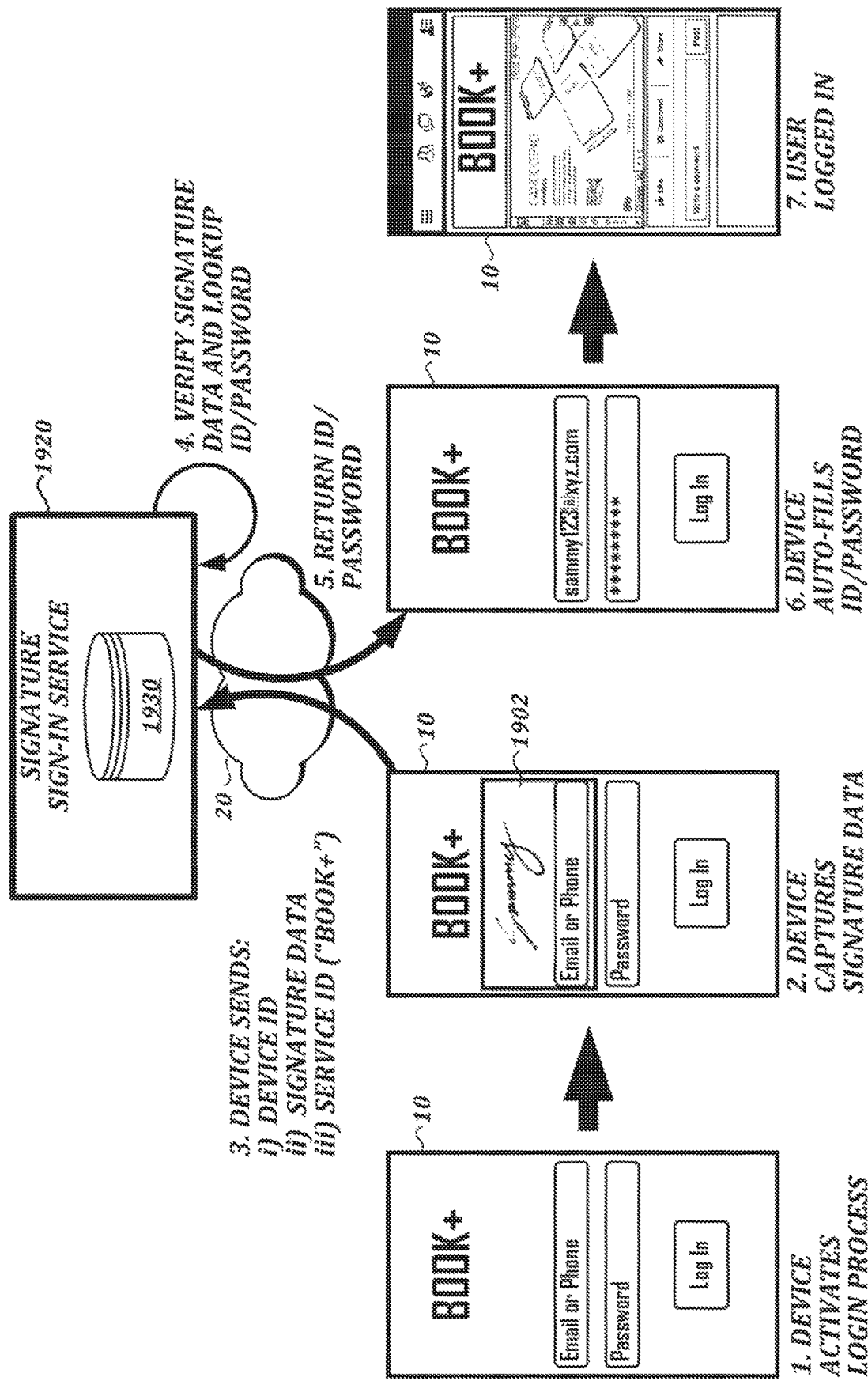
FIG. 19A is a diagram of another illustrative handwriting-based user authentication process in a suitably configured computing system.

FIG. 19A is a diagram of another illustrative handwriting-based user authentication process in a suitably configured computing system. In this example, the user authentication process is a log-in process that is used to provide access to a social network service called "Book+"; however, other services can be accessed in a similar way.

As shown in FIG. 19A, a handwriting input device 10 activates a log-in process associated with a service (e.g., by navigating to a website associated with the service using a browser application or by activating a dedicated application associated with the service). The device 10 captures signature data (e.g., in a signature area 1902), which may be generated in response to a user signing with a pen/stylus device (not shown). The device 10 sends the signature data as test signature data to be verified. The test signature data is sent along with a device ID associated with the device 10 and/or a pen/stylus device and a service ID (e.g., "Book+") associated with the service to a signature sign-in service 1920 over a network 20 (e.g., the Internet).

In the example shown in FIG. 19A, the signature sign-in service 1920 verifies the test signature data (e.g., by comparing the test signature data with reference signature data in accordance with techniques described herein or other techniques) and obtains authentication information (e.g., user ID and password information) based at least in part on the results of the verification. The signature sign-in service 1920 is implemented as a "one-pass" sign-in service that allows a user to be authenticated using a single instance of user input (a signature) rather than requiring multiple instances of user input (e.g., a user ID and a password) to be provided by the device 10.

FIG. 19B depicts a table 1990 that illustrates information that can be provided to a signature sign-in service (e.g., sign-in service 1920) to authenticate a user, along with authentication information (e.g., user ID and password) that can be returned from the signature sign-in service if the user authentication is successful. In the example shown in FIG. 19B, a pen/device ID, signature data associated with a test signature to be verified, and a service ID (e.g., "Book+") can be received from a user device (e.g., input device 10) and used to authenticate a user of the user device with respect to the service identified by the service ID.

Referring again to FIG. 19A, the signature sign-in service 1920 can use information such as the device ID and the service ID to look up one or more reference signatures associated with a user in the database 1930. The signature sign-in service 1920 can then use a handwriting verification process to determine whether the signature data provided by the input device 10 is consistent with the reference signature(s). Once the user has been authenticated with the signature sign-in service 1920, the service 1920 can transmit the user ID and password to the device 10. The user ID and password can then be used to complete the log-in process. For example, the device 10 can automatically fill in the user name (e.g., an email address) and password in appropriate fields in a user interface.

In practice, any collection of information that allows a user to be reliably authenticated by a signature sign-in service (e.g., signature sign-in service 1920) can be used for user authentication. The particular information that may be used to look up a particular user in a database (e.g., database 1930) can vary depending on factors such as the information that is transmitted to the signature sign-in service, the information that is stored in the database, and the way the database is designed.

For security purposes, any information relating to handwriting verification and related user authentication processes (e.g., handwriting data, device identifiers, service identifiers, authentication information, etc.) may be encrypted (e.g., using symmetric (e.g., shared-secret-key) or asymmetric (e.g., public-key) encryption). Encrypted information may be decrypted before further processing is performed on the underlying information. For example, encrypted test signature data may be decrypted prior to comparing the test signature data with reference signature data.

II. Handwriting Data Generation and Preservation

Some embodiments of the present disclosure are directed to generating and preserving electronic handwriting data. In some described embodiments, raw electronic handwriting data is generated by a digitizer, and the raw data is converted to a streamed format. Although the format of the handwriting data is changed relative to its raw form, the streamed format preserves the original content of the raw handwriting data by employing lossless data processing techniques while also allowing for data processing that may involve data loss (e.g., rendering of handwriting data for display as an image).

Original content of raw handwriting data can be preserved in a variety of data formats, and the formats to be used can vary depending on a variety of factors, including the nature of the processing to be performed on the data. In some embodiments, a handwriting data format is used that provides multiple benefits: it preserves the original data without changing it in any way so that it can be used forensically without any danger of data losses; it includes sufficient information about the source device so that the original data can be converted to a commonly understood system of metrics; it is flexible and extensible so that all device capabilities can be supported; it is optimally compact to minimize storage and transmission overheads; and it is device-independent at the binary level so that it can be handled on any type of hardware.

In some cases, handwriting data can be converted into multiple formats without data loss, while still allowing for conversion into other formats (e.g., a stroke data format for rendering in standardized units for display) that would result in data loss if the handwriting data was not otherwise preserved. Lossless compression techniques can be used to reduce storage and transmission bandwidth requirements while allowing all desired handwriting data to be preserved.

Some embodiments of the present disclosure are directed to inserting data (e.g., electronic handwriting data) into a digital image that, when decoded by a suitably configured decoder, provides information that is separate from, although possibly related to, the image itself. In described embodiments, the original content of raw electronic handwriting data is converted to streamed data, and the streamed data is inserted into a digital image (e.g., a digital image that contains a rendering of a handwritten signature) in a way that is generally not noticeable to a human viewer when the image is displayed, thus allowing the original content of the raw handwriting data to be preserved without noticeable degradation of image quality and without additional storage requirements. In such embodiments, handwriting data that is obtained during the input of the handwriting can be preserved for future rendering, authentication, or other processing.

In some described embodiments, the original content of raw electronic handwriting data (e.g., high quality pen data generated by movement of an electronic pen in relation to a corresponding digitizer) is preserved. For example, in an illustrative usage scenario, electronic handwriting data is stored in a digital image that includes pixel data representing an image of the handwriting itself. The electronic handwriting data is collected by one or more sensors (e.g., sensors in a pen device and/or a digitizer) and converted into stroke data that can be rendered and displayed as one or more pen strokes (e.g., as part of a signature). However, the original handwriting data is also preserved to avoid data loss. In described embodiments, the original handwriting data is preserved in a streamed format, which can be converted to an encoded binary format suitable for distributing, analyzing, and rendering the handwriting data portably across a wide range of applications, platforms, and technologies.

When a handwritten signature is made on paper, an ink pen leaves a continuous trail of ink that forms the signature. A digital version of a handwritten signature generally comprises a collection of discrete data points measured at regular time intervals.

In described embodiments, a digitizer (e.g., a signature tablet device) works by recording the position of an electronic pen at frequent intervals, measuring the x (horizontal) and y (vertical) positions at each point. For example, in a system that uses electromagnetic resonance technology, the digitizer incorporates a sensor board that detects the pen's movement. Energy is induced in the pen's resonant circuit by a magnetic field generated by the sensor board surface. The pen's resonant circuit then makes use of this energy to return a magnetic signal to the sensor board surface. The board detects the pen's coordinate position at regular time intervals even if the electronic pen does not touch the sensor board surface, so long as the pen remains within close enough proximity to the sensor board, such that signals can still be received from the pen. (The effective signal range can vary depending on the particular technology being used, but is generally on the order of several millimeters.)

Alternatively, other handwriting input technology can be used. For example, an electronic pen may use other wireless technology or may be connected by a wire to a digitizer. As another example, an electronic pen may or may not be detectable away from the surface of a digitizer. As another example, an electronic pen may be powered or unpowered. Powered pens may receive power via a wire or via an on-board battery. As another example, it is possible to input handwriting data without an electronic pen (e.g., via a stylus on a pressure sensitive digital writing pad, a touchscreen, or some other input device that does not require an electronic pen).

The process of rendering and displaying strokes of electronic handwriting typically involves analyzing electronic handwriting data in order to determine which pixels in a display are to be adjusted to represent the strokes on the display. The pixels that are used to visually represent the strokes are sometimes referred to as the "ink" of the strokes. The process of rendering the strokes for display is handled by a component called an ink engine. In addition to using pen position data to render the shape and position of the strokes, an ink engine also can use measurement of other handwriting attributes (e.g., pressure) to determine ink thickness.

In some scenarios, it may be acceptable to discard raw handwriting data (e.g., after it has been used by an ink engine for rendering and display). Discarding the raw data may provide some efficiency with regard to the size of the data being saved. However, the conversion of raw data by the ink engine may involve data loss. For example, if high-resolution raw handwriting data is converted for rendering in standardized units on a low-resolution display, much of the data may be lost if it is not otherwise preserved. If the raw data is not preserved in some form, many benefits, such as the ability to analyze handwriting data for authentication purposes or the ability to use the handwriting data in ink engines with different rendering properties, may be lost.

Therefore, in accordance with various described embodiments, the original content of electronic handwriting data can be preserved. The handwriting data can be converted to standard units by an ink engine, as needed, without undesirable data loss. The position of the pen (e.g., x-coordinates and y-coordinates) can be stored in original sensor measurement units (which may vary depending on the type of sensor used), and the characteristics of the input device also can be recorded to allow conversion to different units. For example, the x, y position information can be converted from native sensor units to conventional units (such as millimeter offsets from an origin) if information about the scale and direction of each axis is included.

In particular, techniques and tools are provided for recording and storing handwriting data in digital images. Handwriting data that is stored in this way can be used portably across different software applications, platforms, and devices.

In any of the examples described herein, handwriting data can be preserved in a form that is designed for portability across various devices and platforms that may have different requirements in terms of, for example, word size (e.g., 16 bits, 32 bits, etc.), endianness (e.g., little-endian, big-endian), and floating point support. Further, in any of the examples described herein, it is possible to extend the range of preserved information without affecting existing software. In at least some embodiments, a streamed data architecture is used that allows software to disregard unrecognized stream types safely. Using principles described herein, new applications can be designed that handle old data (which may lack the latest types of information, such as information collected by new or redesigned sensors) efficiently and without unexpected results, which can be advantageous for signed documents that may need to be stored for many years.

Figure 20:
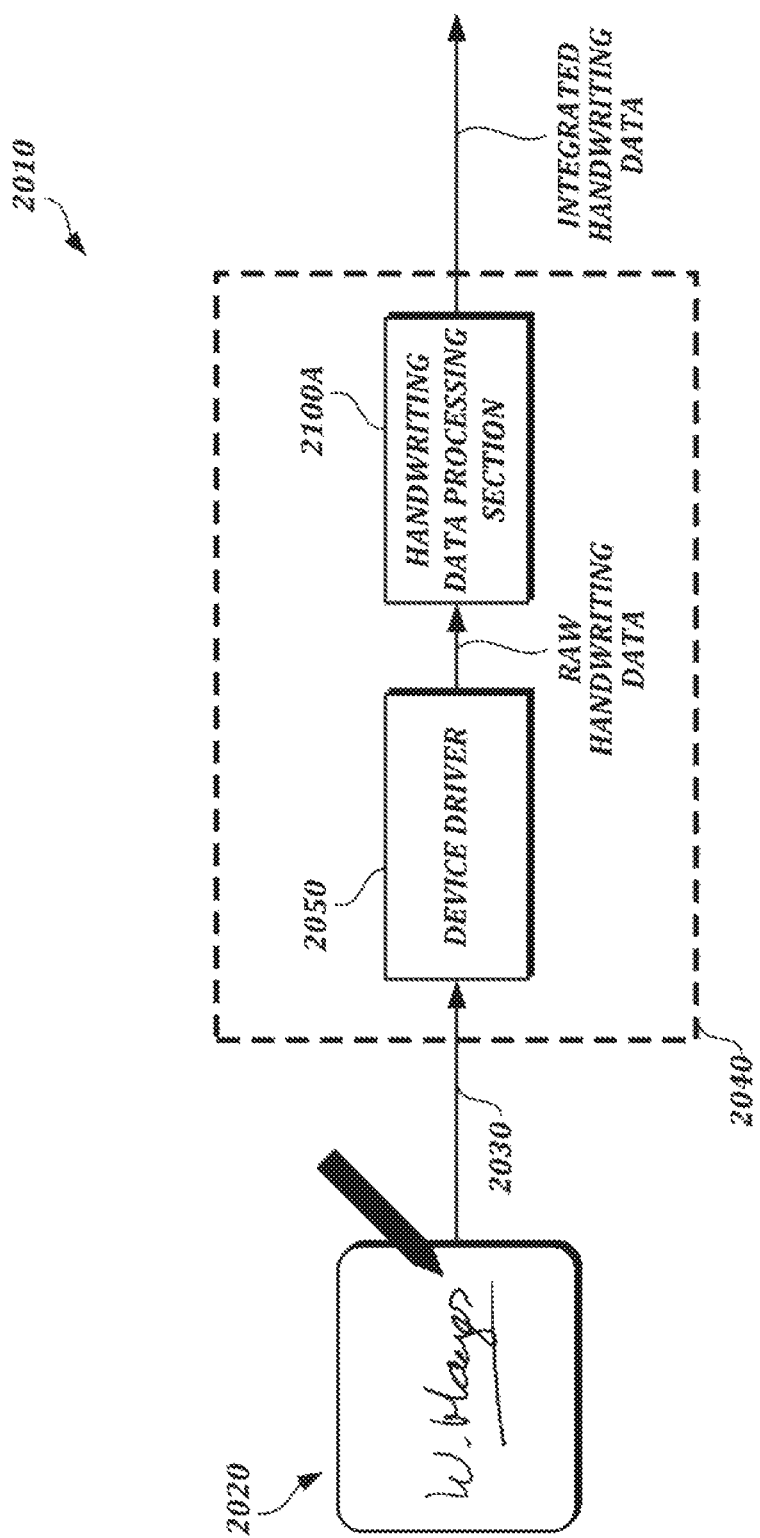
FIG. 20 is a high-level diagram of an illustrative system configured to generate integrated handwriting data.

FIG. 20 is a high-level diagram of an illustrative system 2010 configured to generate integrated handwriting data according to at least one described embodiment. As shown in FIG. 20, an input device 2020 (e.g., an electronic pen and a corresponding digitizer (e.g., a signature pad device), or some other input device, such as a touch pad device, that can be used for handwriting input) generates device input data 2030, which is transmitted over a communication link (e.g., a USB connection) to a computer 2040. The device input data 2030 is processed by a device-dependent device driver 2050 running on the computer 2040. The device driver 2050 generates raw electronic handwriting data.

In the example shown in FIG. 20, a pen device and a digitizer are used to provide handwriting input. The digitizer may be implemented as a dedicated handwriting collection device, or as a general purpose device, such as a suitably configured smart phone or tablet computer. Sensors in the pen device and/or the digitizer detect pen position and may also detect additional information, such as pressure information. In at least one embodiment, the device driver 2050 generates raw handwriting data that includes coordinate information, pressure information, and timing information.

Handwriting data may include pen event information collected at regular intervals during a signing process, device information, and/or contextual information about the context in which the signature was made. Pen event information includes the x, y position of the pen-tip on or above the digitizer surface and the time since the start of the signature. Further, pen event information may optionally include additional information subject to the capabilities of the input device 2020, such as pressure (pen force), angles (azimuth, altitude, and/or rotation) and pen-down status. Device information may include information needed to convert from digitizer units to real-world units. Contextual information may include the name of the person signing; the date and time of signature; the reason for signing; the type and version of operating system used on a host device; the type of digitizer; the version of the digitizer device driver; a unique identifier taken from the network interface controller (NIC) address of the a host device; if a cryptographic hash function is used, information about the type of hash function; and/or supplementary data that may be added by a software application at the time of capture. Contextual information also may include information about the document being signed, such as a cryptographic message digest.

In the example shown in FIG. 20, the handwriting data processing section 2100A receives raw handwriting data as input and generates integrated handwriting data as output. The process of generating integrated handwriting data, as well as the content of the integrated handwriting data, may vary depending on context and implementation, as described in further detail below.

Figure 21A:
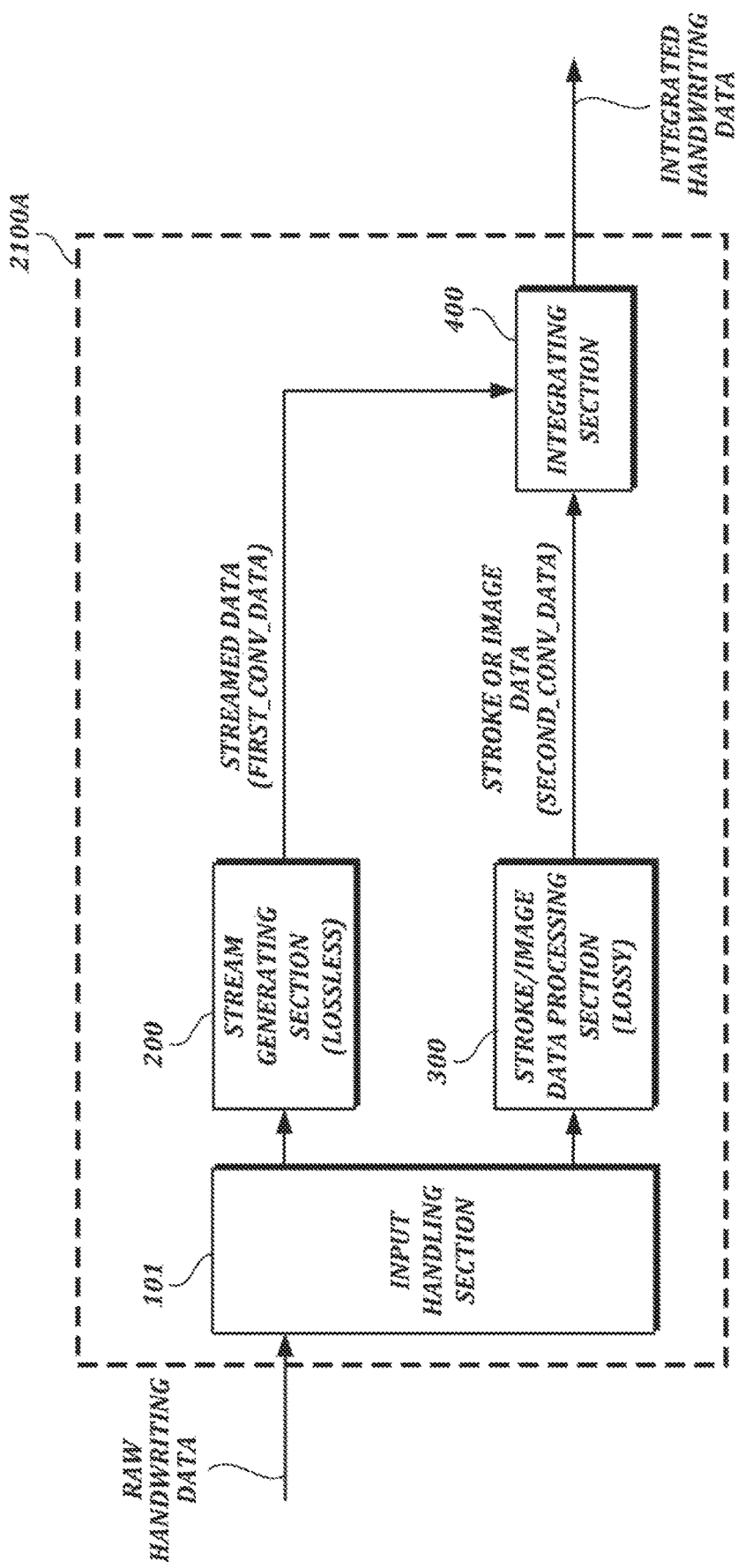
FIG. 21A is a functional block diagram of an illustrative embodiment of the handwriting data processing section shown in FIG. 20.

FIG. 21A is a functional block diagram of an illustrative embodiment of the handwriting data processing section 2100A shown in FIG. 20. In the example shown in FIG. 21A, the handwriting data processing section 2100A comprises an input handling section 101, a stream generating section 200, a lossy data processing section 300, and an integrating section 400. The input handling section 101 is responsible for forwarding raw handwriting data for further processing by, e.g., the stream generating section 200 and the lossy data processing section 300.

In the example shown in FIG. 21A, the stream generating section 200 receives raw handwriting data as input and generates streamed data (labeled "FIRST_CONV_DATA" in FIG. 21A). For example, the stream generating section 200 can provide separate streams for x-coordinate, y-coordinate, and pressure, information, along with header information. (In some embodiments, time information for particular pen events can be calculated based on a known sampling rate and need not be stored in its own stream or signaled for each pen event.) In at least one embodiment, the stream generating section 200 uses lossless encoding techniques to generate compressed streamed data comprising a plurality of streams.

The lossy data processing section 300 also receives raw handwriting data as input. The lossy data processing section 300 can generate stroke data (which can be used to render the handwriting as an image) and/or image data (e.g., image data in a PNG format or some other image data format). In at least one embodiment, the lossy data processing section 300 uses lossy data processing techniques (that is, techniques that may involve data loss) to generate stroke data and/or image data. For example, the lossy data processing section 300 may include an ink engine configured to perform data formatting and processing that may be needed to render handwriting for display. For example, the ink engine can generate image data that includes a visual representation of the handwriting (e.g., a signature).

Figure 21B:
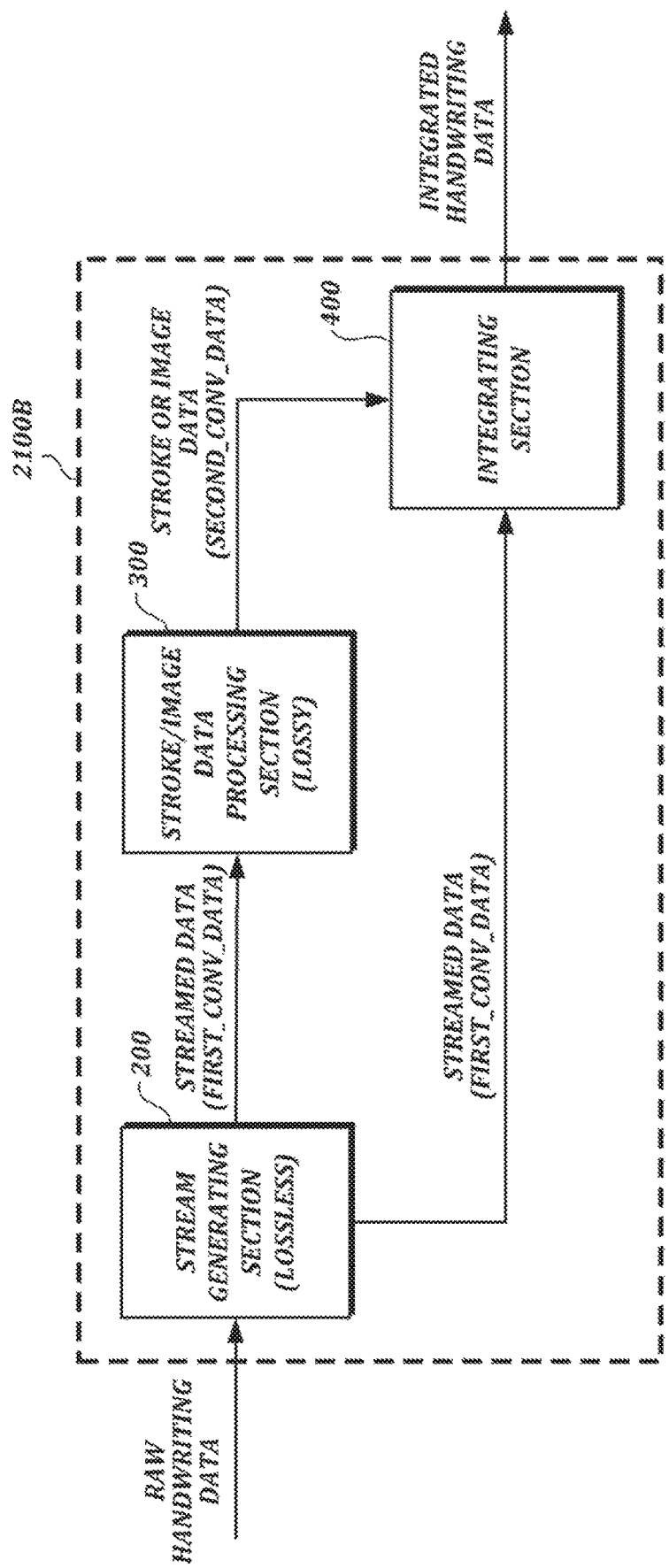
FIG. 21B is a functional block diagram of another illustrative embodiment of a handwriting data processing component.

As an alternative to the arrangement shown in FIG. 21A, in which stroke data and/or image data is generated based on raw handwriting data, such data also can be generated based on encoded handwriting data (see FIG. 21B). FIG. 21B is a functional block diagram of another illustrative embodiment of a handwriting data processing component 2100B. In the example shown in FIG. 21B, the lossy data processing section 300 generates output ("SECOND_CONV_DATA") based on encoded data ("FIRST_CONV_DATA") provided by the stream generating section 200.

As shown in FIGS. 21A and 21B, the integrating section 400 receives the streamed data and the stroke and/or image data as input and outputs integrated handwriting data. The integrating section 400 may output streamed data and stroke/image data in a single output file (e.g., an image file) or it may selectively output streamed data and/or stroke/image data. In at least one embodiment, image data can be combined with the encoded streamed data to form integrated data (e.g., a digital image with encoded binary data inserted steganographically). The details of how the integrating section 400 operates may vary depending on implementation, as described in further detail below.

The arrangements shown in FIGS. 20, 21A, and 21B are only examples. Many other arrangements are possible. Data described herein (e.g., raw data, streamed data, stroke data, image data, and integrated data) and handwriting data processing modules described herein may be stored and implemented in different ways. For example, data and processing modules can be stored and implemented within a digitizer, in some other device (such as a PC), or distributed among several devices. Data described herein may be transmitted (e.g., in the form of an image file) from one device to another, or it may be stored and/or processed within the same device. For example, in a personal computer, the streamed data may be combined with image data, converted to integrated data, and stored in a digital image file within the personal computer.

FIGS. 21C and 21D are diagrams of illustrative cloud computing arrangements that may be used in accordance with described embodiments. FIGS. 21C and 21D provide illustrative alternatives to the arrangement shown in FIG. 20, in which handwriting data processing section 2100A is shown as being implemented on a single computer 2040.

In the example shown in FIG. 21C, an input device 2020 transmits raw handwriting data to handwriting data processing section 2100C over a network 2110. In particular, the raw handwriting data is received by an input handling server 2101, which transmits raw handwriting data to a stream generating server 2102 and a stroke and/or image data processing server 2103. The servers 2102 and 2103 generate streamed data and stroke and/or image data, respectively, that is transmitted to integrating server and data storage 2104.

In the example shown in FIG. 21D, different applications (e.g., applications 2180 and 2190) can obtain different types of information from different devices. For example, lossy image data can be obtained from server 2103, and integrated data (e.g., a digital image comprising lossy image data and lossless-encoded handwriting data) can be obtained from integrating server and data storage 2104. In practice, the applications 2180 and 2190 may run on different computing devices or on the same computing device.

Referring again to FIGS. 21A and 21B, the servers depicted in FIGS. 21C and 21D may be implemented as separate computers running software such as stream generating section 200, lossy data processing section 300, and integrating section 400, respectively.

Referring again to FIG. 21D, the applications 2180 and 2190 may include decoders configured to decode lossy or lossless-encoded data, or the applications may transmit encoded data to other applications or devices configured for decoding the lossy or lossless-encoded data. Although the applications 2180 and 2190 are shown in FIG. 21D in a cloud computing arrangement, such applications and decoders also may obtain and process information according to other arrangements.

Figure 22:
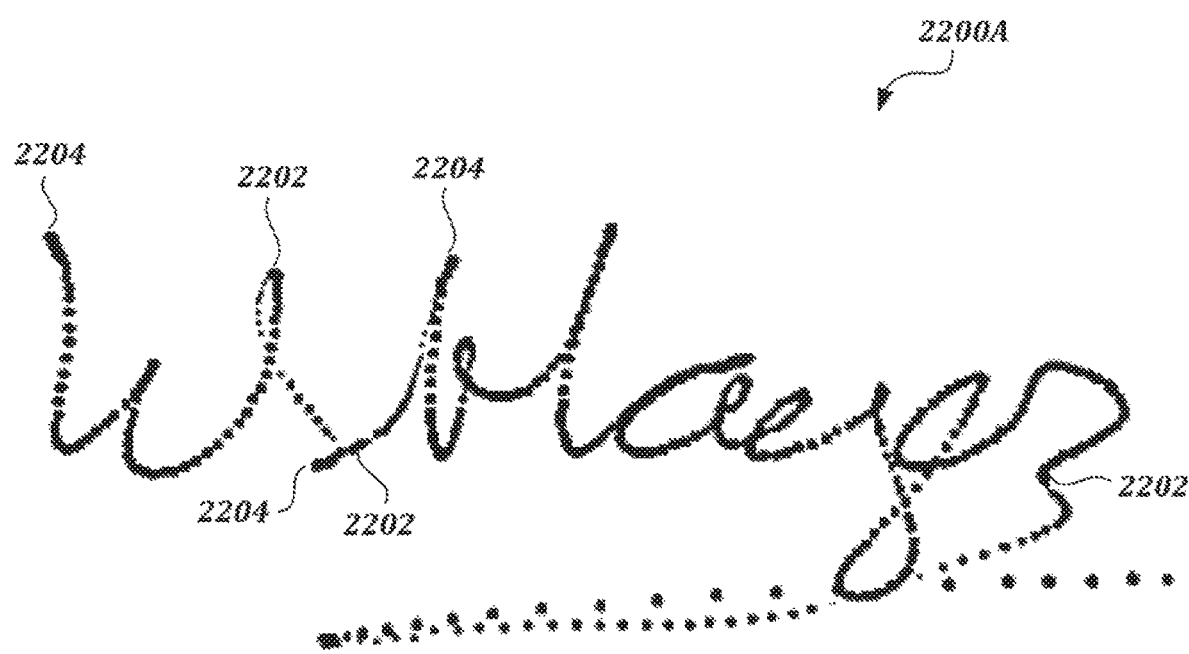
FIGS. 22 and 23 are illustrations of coordinate positions in electronic handwriting comprising a handwritten signature and an artistic drawing, respectively, as detected by a system using electromagnetic resonance technology, in which pen-up points and pen-down points are indicated.
Figure 23:
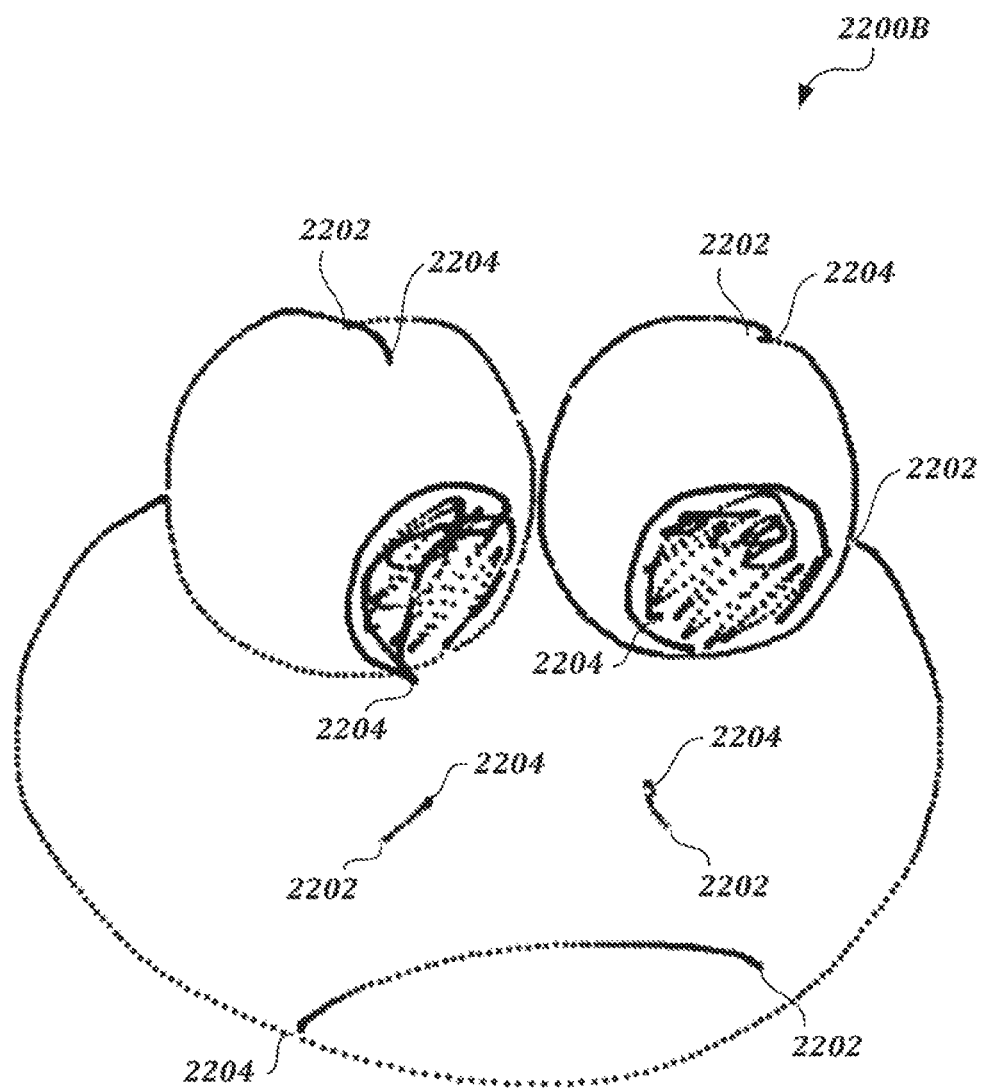

FIGS. 22 and 23 are illustrations of coordinate positions in electronic handwriting comprising a handwritten signature 2200A and an artistic drawing 2200B, respectively, as detected by a system using electromagnetic resonance technology, in which pen-up points 2202 and pen-down points 2204 are indicated. Because the positions are detected at regular intervals, greater spacing between the dots in the electronic handwriting 2200A and 2200B indicates portions of the signature in which the pen is moving faster, and narrower spacing indicates portions in which the pen is moving slower. Note that, as shown in FIGS. 22 and 23, coordinates continue to be detected between a pen-up point 2202 and a subsequent pen-down point 2204. That is, coordinates continue to be detected when the pen is lifted from the surface of the digitizer if the pen remains within signal range. In FIG. 23, coordinates detected when the pen is up (e.g., between a pen-up point 2202 and a subsequent pen-down point 2204) are depicted as lighter dots, and coordinates detected while the pen is down (e.g., between a pen-down point 2204 and a subsequent pen-up point 2202) are depicted as darker dots. The board (or some other sensor) also may detect other information such as pen angle, writing speed, writing pressure, etc.

In accordance with embodiments described herein, handwriting can be a handwritten signature (see FIG. 22) or any other type of handwriting, such as printed characters or an artistic drawing (see FIG. 23). The raw handwriting data for a given stroke of handwriting contains information that allows the stroke to be analyzed and displayed (e.g., x-coordinates, y-coordinates, etc.). Other pen-related handwriting data may include pressure data (e.g., the force applied to the nib of the pen), inclination (angle between the pen barrel and vertical), orientation data (the plan-direction of the pen from the nib), and twist data (the rotation of the barrel during signing). In many digitizers, every point in the signature is recorded with a precision on the order of milliseconds, or better (e.g., 1 millisecond). Timing information makes it possible to observe the direction of the pen movement and to infer the speed and acceleration at each position. Thus, raw handwriting data will often include timing information, such as a sample rate and/or time stamps. Raw handwriting data also may include other data relating to the handwriting, such as information relating to the pen device or digitizer itself, contextual information (e.g., a description of document to be signed, time and date of signing, etc.), and the like, as described in further detail below.

Figure 24:
FIG. 24 is an illustration of an example data structure that can be used to represent a pen event and a data sequence order of such pen events that can be provided to a handwriting data processing section.

In described embodiments, raw handwriting data can be represented as a sequence of pen events (see FIG. 24). Typically, a pen event records the position of the pen tip (e.g., while on the surface of or within a limited range of a digitizer) at a particular time. Depending on device capabilities, pen data associated with pen events may include additional measurements such as pen pressure and angles. FIG. 24 is an illustration of an example data structure 108 that can be used to represent a pen event and a data sequence order 110 of such pen events that can be provided to a handwriting data processing section (see, e.g., handwriting data processing section 2100A in FIG. 20). As shown in FIG. 24, the data structure 2408 can be implemented as a "struct" or "class" type. Alternatively, the data structure 2408 can be implemented in some other way. In described embodiments, pen events are provided as input as each event occurs in the data sequence order 2410. The pen events can be converted to a streamed format (e.g., by stream generating section 200) in accordance with described embodiments.

In at least some embodiments, handwriting data includes pen-down information (i.e., pen data collected when the pen tip is in contact with a surface) and pen-up information (i.e., pen data collected when the pen tip is not in contact with a surface), but excludes information that is identified as gesture information. For example, in some usage scenarios, a pen device can be used for input of handwriting information as well as gesture information (e.g., for various interactions with user interface elements such as tapping, dragging, scrolling, and the like). In one example scenario, a user may sign with the pen device in a designated area and then use the pen device to tap a user interface element (such as check box or button labeled "OK" or "Done") to indicate that the signature is complete. In such a scenario, the handwriting data relating to the signature may be preserved while the check-box or button-tap event data may be discarded. Alternatively, gesture data may be preserved along with signature data if desired.

In any of the examples described herein, a pen device and a digitizer can be used to provide handwriting input. Information recorded by the sensors can be initially stored in a raw handwriting data format. The information recorded by the sensors may be accompanied by additional information provided by the pen device and/or the digitizer (e.g., device ID information, sample rate information, etc.). The raw handwriting data can be converted to stroke data for processing by an ink engine. The process of converting the raw data into the stroke data (which may include conversion of data recorded in units that are particular to the sensor into standardized units, such as pixels or millimeters) may not be reversible. For example, in at least some embodiments, the process of converting the raw handwriting data into standardized units may result in data loss. However, the same raw handwriting data also can be converted without data loss into streamed data. Uncompressed streamed data can be converted without data loss into encoded (compressed) streamed data (e.g., binary data in a format suitable for encoding in an image file). In accordance with embodiments described herein, encoded streamed data can be inserted into a digital image file (not shown) containing, for example, an image of the handwriting that corresponds to the handwriting input provided by the pen device and the digitizer.

Figure 25:
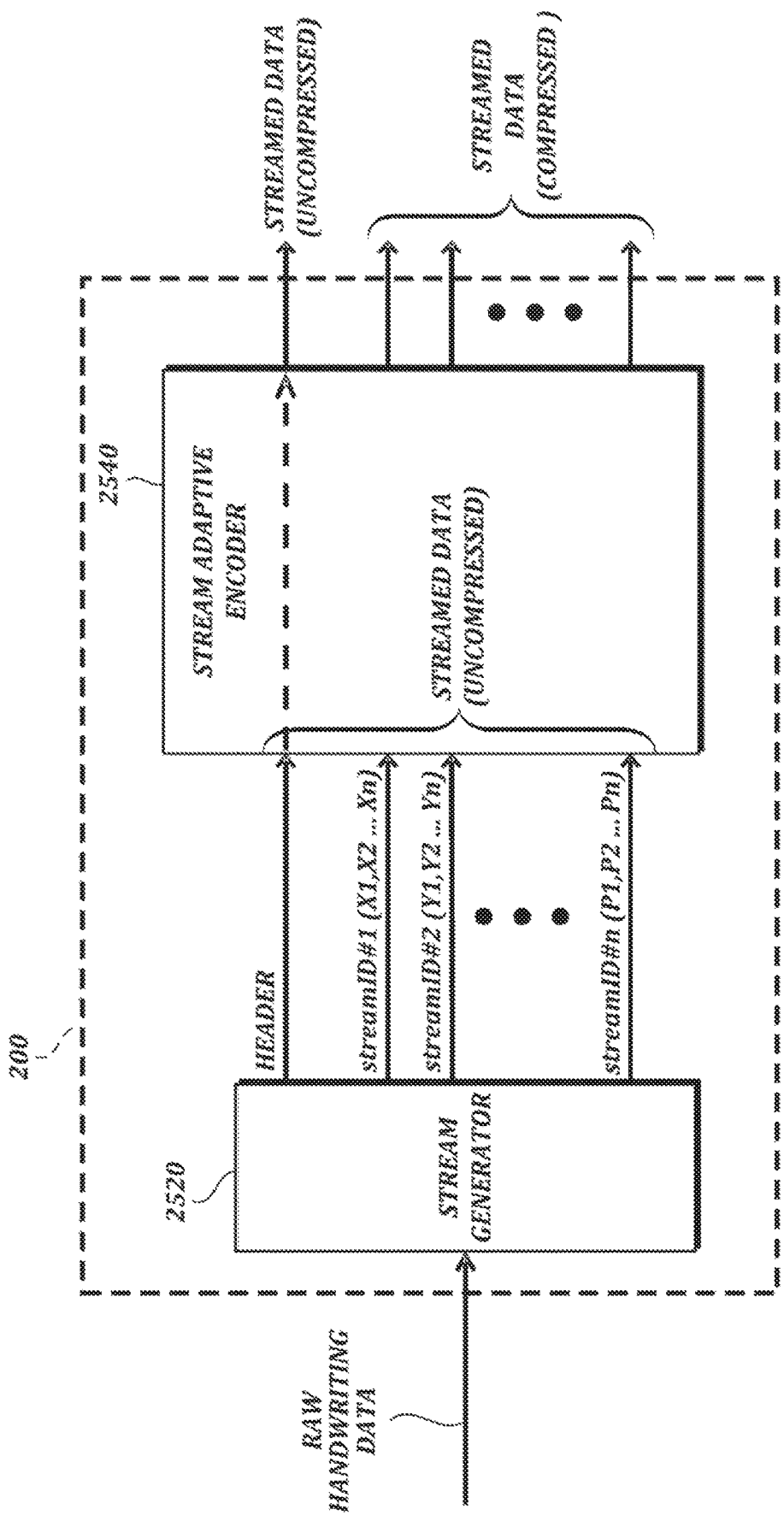
FIG. 25 is a functional block diagram of an illustrative embodiment of a stream generating section.

FIG. 25 shows an illustrative embodiment of a stream generating section 200 in which raw handwriting data is processed by a stream generator 2520 that generates uncompressed streamed data (e.g., a header and individual streams) to be provided to a stream adaptive encoder 2540. The stream adaptive encoder can selectively apply compression methods to some data, while other data is left uncompressed. For example, compression can be applied on a stream-by-stream basis rather than compressing the overall data, so that advantage may be taken of the form of each type of stream. In at least one embodiment, only streams containing relatively large amounts of data (e.g., x-coordinate streams, y-coordinate streams, pressure information streams, timing information streams, angle information streams) are compressed. Selective compression of less than all streams may result in slightly larger data size but may provide benefits in terms of reduced complexity and processing time.

In the example shown in FIG. 25, the header data passes through the stream adaptive encoder 2540 without being compressed while the individual streams (labeled "streamID #1," "streamID #2" . . . "streamID # n") are compressed by the stream adaptive encoder 2540. The output of the stream adaptive encoder 2540 comprises the header data and the compressed streams. The stream adaptive encoder 2540 may use lossless compression methods such as delta encoding, run-length encoding, entropy coding, and bit-packing individually or in combination to reduce the size of stored streamed data. The particular encoding techniques that are used, as well as the process of adaptively selecting from available encoding techniques, may vary depending on context or implementation, as explained in further detail below. Alternatively, compression can be omitted.

Streamed data can take many forms. In at least some embodiments, the streamed data includes a set of streams, each of which is responsible for storing one component of data (e.g., one stream for x-coordinates, one stream for y-coordinates, etc.) The stream type (i.e., the data format of a particular stream) can vary depending on the data being stored. Possible stream types include, without limitation, integer values (e.g., 32-bit signed or unsigned (U32) integers), pairs of integer values, floating point values (e.g., 32-bit floating point values), UTF8 or other text values, or arrays or buffers of such values. For example, an x-coordinate stream may take the form of an integer array, but different stream types may be used for storing other information.

In some embodiments, two streams of data may collectively provide information for a particular type of measurement, one being the raw data itself (e.g., x-coordinates, y-coordinates, etc.) and the other being calibration (or metric) data supplied by the device that allows an ink engine to convert the raw data into real units. In at least one embodiment, the x-coordinate stream includes the x-coordinate values supplied by the device, and the x-coordinate metric stream includes information about the scale and range of those x-coordinate values. For example, x-coordinate metrics may describe a possible range of values, scale information, and sign convention information (e.g., the meaning of negative and positive values).

Figure 26:
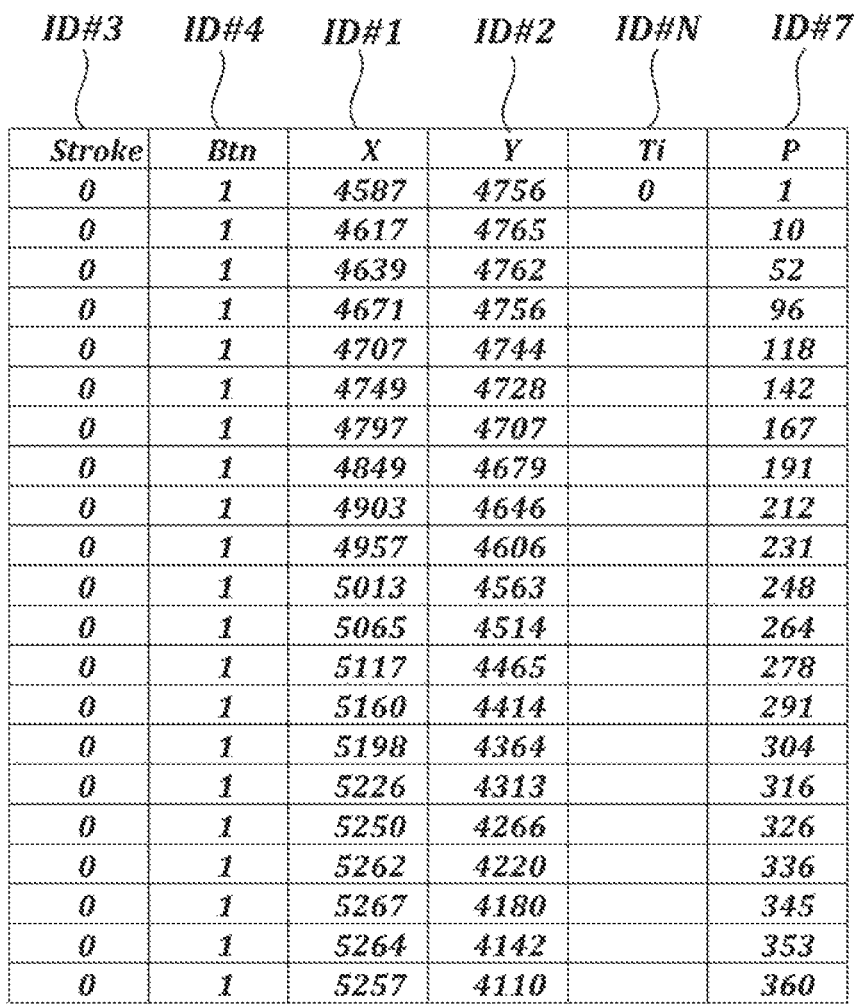
FIG. 26 is a table illustrating example handwriting data that may be represented in output from a stream generator.

Example handwriting data that may be represented in output from stream generator 220 is shown in the table 2600 illustrated in FIG. 26. The rows in table 2600 correspond to pen events represented in the streams. The column labeled "Stroke" in table 2600 is associated with stream ID=3 and provides an indicator of which stroke in the handwriting the pen events are associated with. (In this example, stroke "0" indicates that the corresponding pen events are in the first stroke of the handwriting.) The column labeled "Btn" in table 2600 is associated with stream ID=4 and provides a binary value that indicates whether the pen is up (0) or down (1). The columns labeled "X" and "Y" are associated with stream ID=1 and stream ID=2 and provide x-coordinates and y-coordinates, respectively. The column labeled "Ti" in table 2600 provides timing information. Timing information may include timestamps for individual pen events. However, in the example shown in FIG. 26, this column is blank after the first row to illustrate a common scenario in which a digitizer collects pen events at fixed time intervals (e.g., every 5 ms), thus allowing the time of each pen event to be inferred from the sampling rate and avoiding the need for explicit timestamp signaling for each pen event. The column labeled "P" in table 2600 is associated with stream ID=7 and provides pen pressure values.

Figure 27:
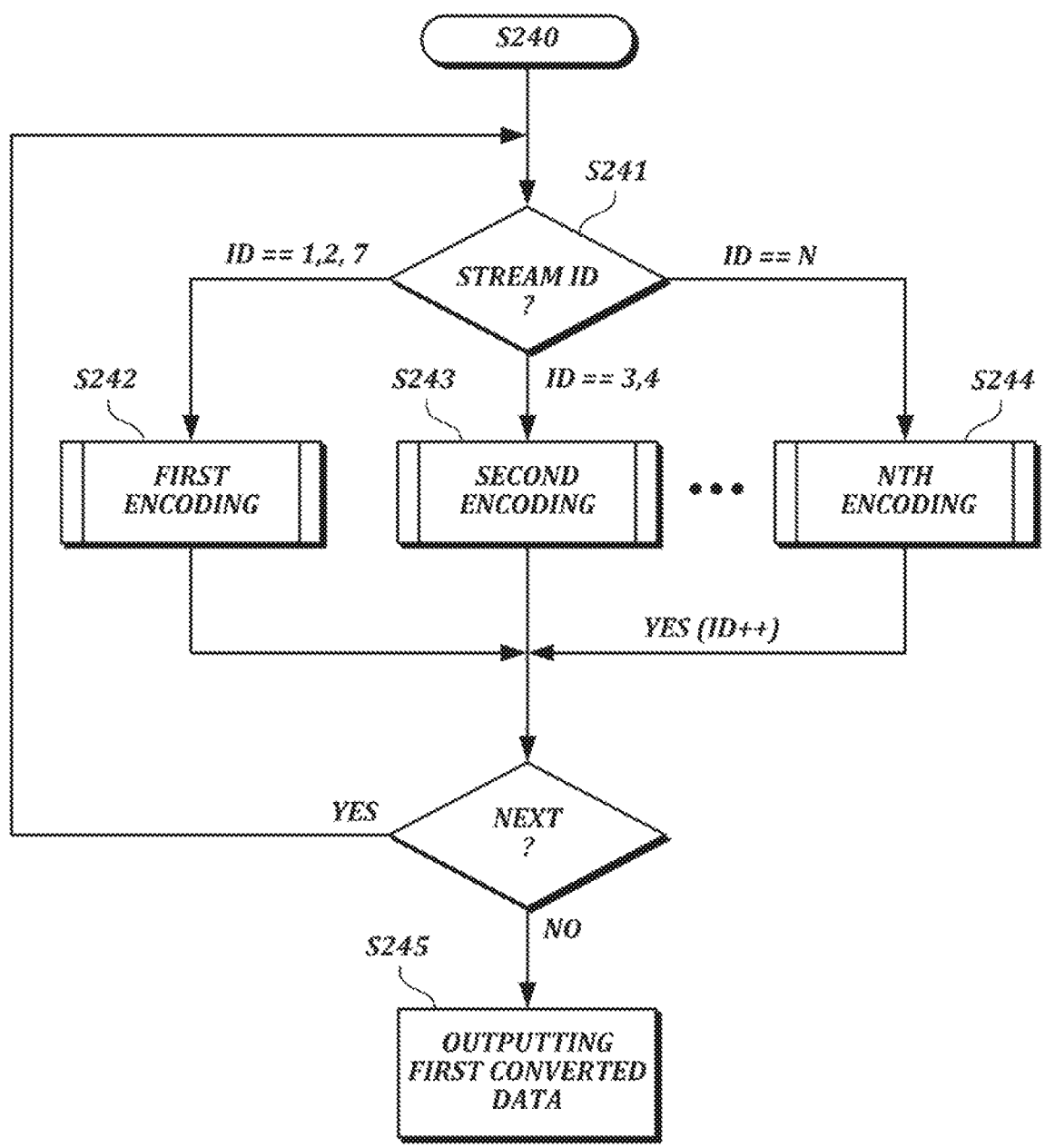
FIG. 27 is a flow chart illustrating an example adaptive encoding process that can be performed by a stream adaptive encoder.

An example adaptive encoding process S240 that can be performed by stream adaptive encoder 2540 (see FIG. 25) is shown in FIG. 27. At step S241, the stream ID is identified, and a corresponding encoding scheme is selected based on the stream ID. For example, a first encoding scheme S242 is selected for stream ID=1, 2, or 7 (e.g., x-coordinates, y-coordinates, or pressure values), and a second encoding scheme S243 is selected for stream ID=3 or 4 (e.g., a stroke ID number or a "Btn" value indicating whether the pen is up or down). The selected encoding scheme can take advantage of characteristics of the data to be encoded. For example, the first encoding scheme S242 can take advantage of the tendency of x-coordinates, y-coordinates, and pressure values to change frequently, but in somewhat predictable ways based on the values associated with earlier pen events. As another example, the second encoding scheme S242 can take advantage of the tendency of stroke ID numbers and "Btn" values to change infrequently, resulting in long runs of the same value.

In the example shown in FIG. 27, the selection of appropriate encoding schemes proceeds for each stream based on the stream ID, and when all streams have been processed, streamed data (FIRST_CONV_DATA) is output at step S245. Any stream IDs that are not present or not recognized by the stream adaptive encoder 2540 may be skipped or discarded, as appropriate. The particular encoding schemes that are used and the particular data that is selected for encoding can vary depending on implementation. In the example shown in FIG. 27, the encoding scheme S244 may comprise any encoding technique described herein or some other encoding technique and may be used to encode any stream described herein or some other stream.

Figure 28:
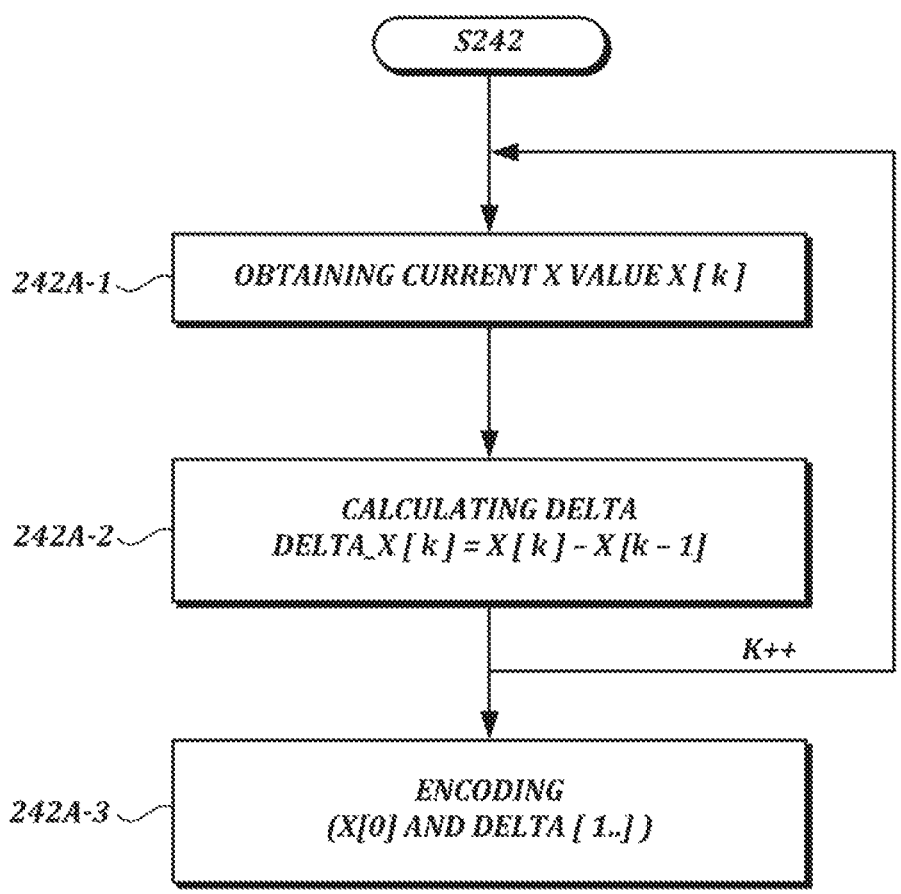
FIG. 28 is a flow chart illustrating an example of a first encoding scheme that can be used in the adaptive encoding process depicted in FIG. 27.

An example of a first encoding scheme S242 (see FIG. 27) is shown in FIG. 28. In the example shown in FIG. 28, x-coordinate values associated with pen events are encoded, although other values (e.g., y-coordinate values, pressure values) may be similarly encoded. At step 242A-1, a current x-coordinate value (index k) is obtained. At step 242A-2, a delta value is calculated by subtracting a previous x-coordinate value from the current x-coordinate value. (Step 242A-2 may be skipped in some situations, such as where the current x-coordinate value is associated with an initial pen event (k=0).) Steps 242A-1 and 242A-2 are repeated for subsequent pen events. When all the values in this stream have been processed, an initial x-coordinate value for an initial pen event (k=0) is encoded at step 242A-3 along with delta values for subsequent pen events (k=1 . . . n). As an example, the encoding of step 242A-3 may include run-length coding or entropy coding for delta values. The particular techniques for encoding the initial value and the delta values may vary depending on implementation.

In at least one embodiment, an unsigned 32-bit integer (U32) array stream is used to store x-coordinates, and the following procedure is used when storing the data.

1. The values are stored as an initial value followed by a set of deltas for the remainder of the array.

2. The deltas are run-length encoded. The maximum delta that needs to be stored is calculated and then the maximum repeat-count is found.

Figure 29A:
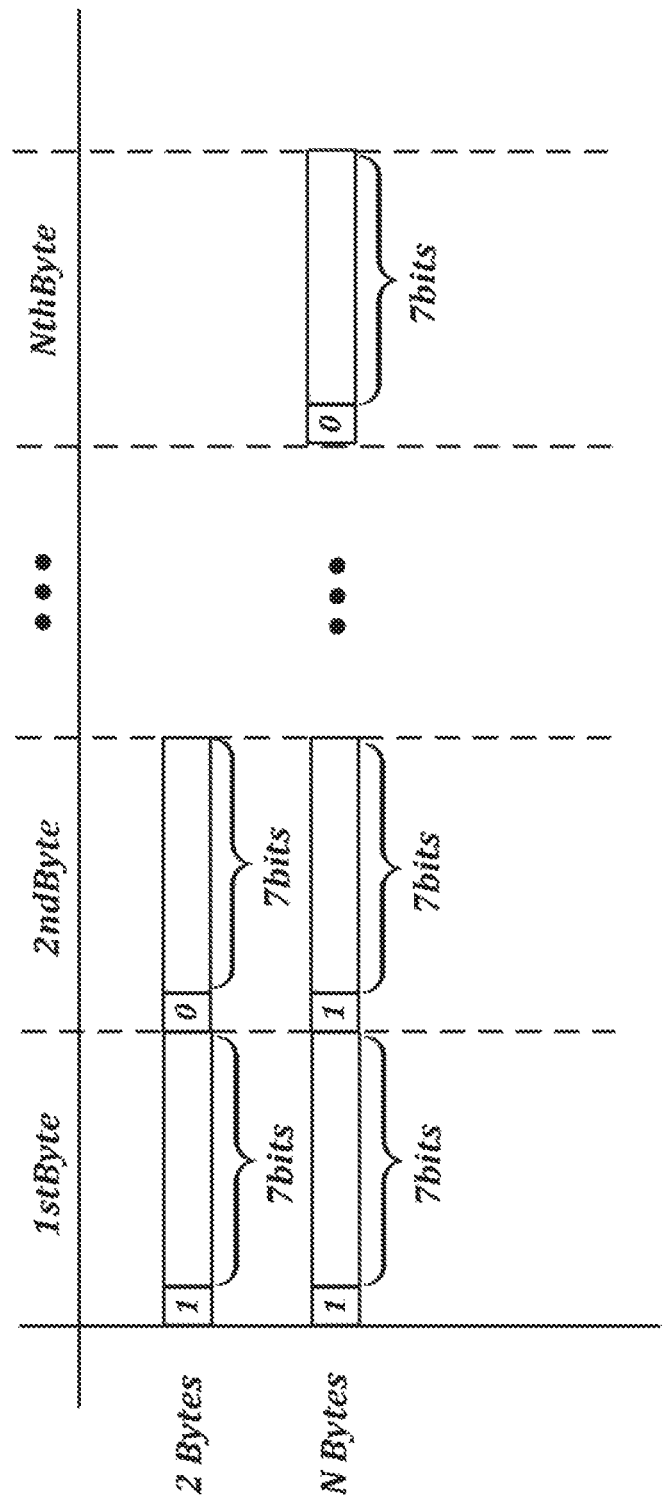
FIG. 29A is a diagram illustrating a 32 v encoding technique.

3. The data is then written as: (a) the number of points, stored as a 32 v value; (b) the first value, stored as a 32 v value; (c) the number of bits needed to store the biggest delta, stored as an 8-bit value; and (d) the number of bits needed to store the biggest run-length, stored as an 8-bit value. In this context, "32 v" refers to a method of storing values up to 32 bits in size, but only using the number of bytes that is actually needed to store the value. Thus, a 32 v value is an example of a variable length value, and in particular, a value having a variable number of bytes (variable byte value). An illustrative 32 v encoding technique is shown in FIG. 29A. As shown in FIG. 29A, in a 32 v value, each byte is used to store 7 bits of the value needing to be stored. The first 7 bits are stored in the first byte with the sign-bit set (1). This is repeated until all non-zero bits have been stored. The last byte is indicated by a clear sign-bit (0). As an example, in the process shown in FIG. 29B, an integer V is obtained at step 2910. At step 2920, V is compared with the hex value 0x7F. If V is greater than the hex value 0x7F, at step 2940 the lowest 7 bits of V are written in a single byte with the sign-bit set (1), and a right shift of 7 bits is performed at step 2950. Steps 2920, 2940, 2950 are repeated until V is not greater than 0x7F. at which point the last byte of V is written with the sign-bit clear (0) at step 2930. Referring again to the example shown in FIG. 29A, the second byte of a 2-byte value has a clear sign-bit, whereas the nth byte of an n-byte value has a clear sign bit. On loading the 32 v value, each byte is read, and the least significant 7 bits are extracted until the last byte, which is indicated by the clear sign-bit.

4. The full set of deltas are then written as a bit-packed binary blob, stored with run-length encoding where appropriate. (Binary blobs are described in further detail below.)

In at least some embodiments, streamed data of any stream type can be converted into export data comprising a flattened series of bits, which also can be referred to as encoded binary handwriting data or a "binary blob." Binary blobs corresponding to streams can then be combined into a single entity, potentially along with other binary information, such as header information (e.g., format and/or version information, number of streams, etc.) that may pertain to more than one stream or the export data as a whole. In the context of a handwritten signature, this single entity can be referred to as a "signature blob." Applications may handle binary information in the signature blob directly, or the binary information may be converted to a different format such as base-16 (hex) or base-64 encoding.

Figures 29B, 30:
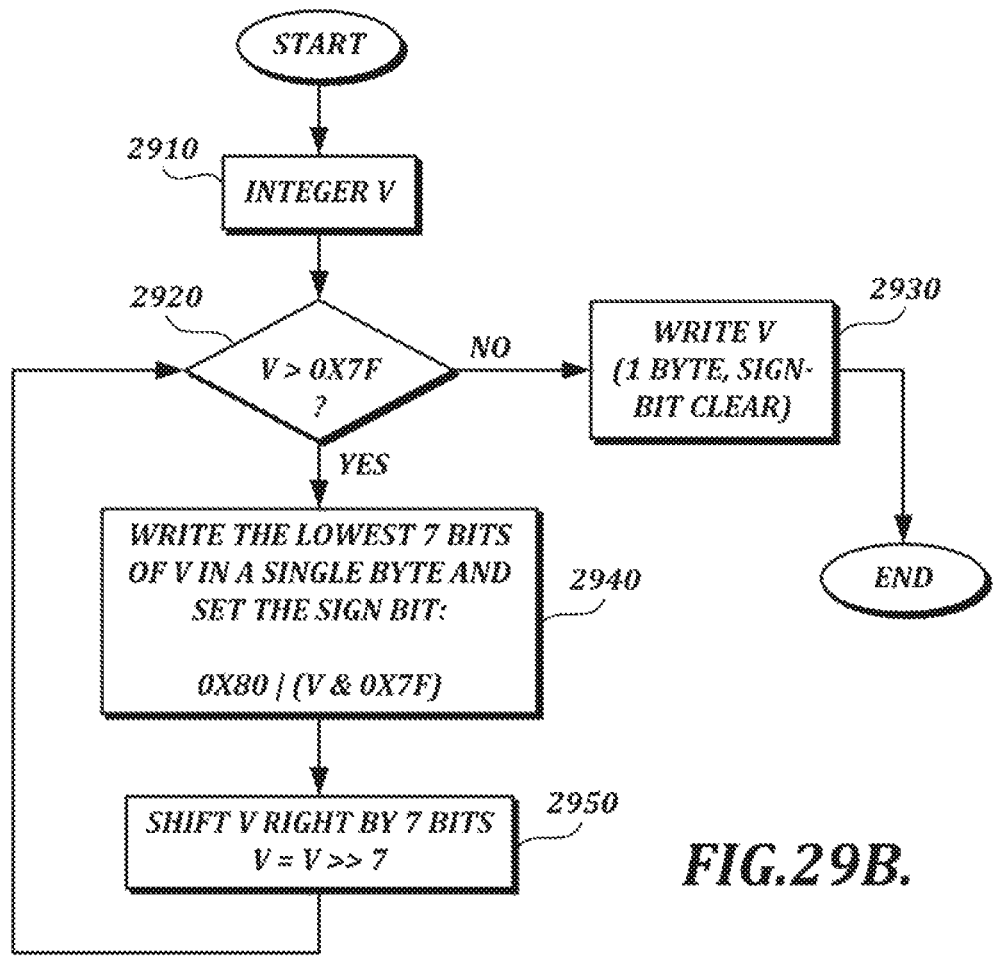
FIG. 29B is a flow chart illustrating a 32 v encoding technique.
FIG. 30 is a diagram of an example data structure that can be output from a stream encoder.

FIG. 30 is a diagram of an example data structure 3000 comprising at least three streams and header information comprising an indication of the total number of streams. The data structure 3000 is one example of a binary blob, or encoded binary data. The data structure 3000 can be output from a stream encoder (e.g., stream adaptive encoder 2540 in FIG. 25), in accordance with embodiments described herein.

In at least one embodiment, a unique integer identifier (e.g., ID=1 for x-coordinates, ID=2 for y-coordinates, ID=3 for x-coordinate metrics, etc.) is assigned to each stream, as shown in FIG. 25. Stream ID values may be defined and controlled by a single authority. Stream ID values may be associated with specific stream types, which may allow the stream type for a given stream to be determined from the stream ID and not be signaled explicitly. Different streams that are uniquely identified may still have the same stream type. For example, x-coordinate and y-coordinate streams may both be integer arrays but have different stream identifiers. Streams also may include additional information, such as a length field that indicates the number of bytes of payload data (e.g., data corresponding to actual x-coordinates in an x-coordinate stream) that are contained in the stream.

As shown in FIG. 30, reading top-to-bottom and left-to-right, the data structure 3000 includes a field that indicates the total number of streams in the signature blob, followed by data corresponding to individual streams (e.g., stream ID, length of payload data in bytes, and the payload data itself). Each stream can be read sequentially by reading the stream ID, the length of the binary payload data it contains, and the payload data itself. If the stream ID is recognized, the payload data can be converted into an appropriate format using an associated data handler. (As illustrated in FIG. 30, in which stream IDs 3, 4, 5, and 6 are omitted, it is not necessary for streams corresponding to all possible stream IDs to be present.) If the stream ID is not recognized (e.g., where an older decoder does not recognize newly defined data streams), the stream can be safely discarded and the next stream processed in turn.

As explained above, the particular encoding techniques that are used for encoding data described herein (including, for example, encoded binary handwriting data), as well as the process of adaptively selecting from available encoding techniques, may vary depending on implementation. In this section, alternative encoding techniques are described with reference to FIGS. 31-44.

In some embodiments, variable length coding schemes that use entropy coding are preferable in terms of compression efficiency for some data types. Further, in some embodiments, predictive coding is used to encode some values (e.g., x-coordinates, y-coordinates, and pressure values). In examples described herein, predictive coding involves calculating a prediction residual, i.e., the difference between a predicted value and an actual value. The predicted value is based on previously obtained data. In an encoder, the previously obtained data may be stored in memory. In a decoder, the previously obtained data may be recently decoded data. Predictive coding is based on an assumption that handwriting movement tends to continue in a direction and at a speed that is similar to the direction and speed of previous movement. Like delta values, prediction residuals also can be encoded.

Figure 31:
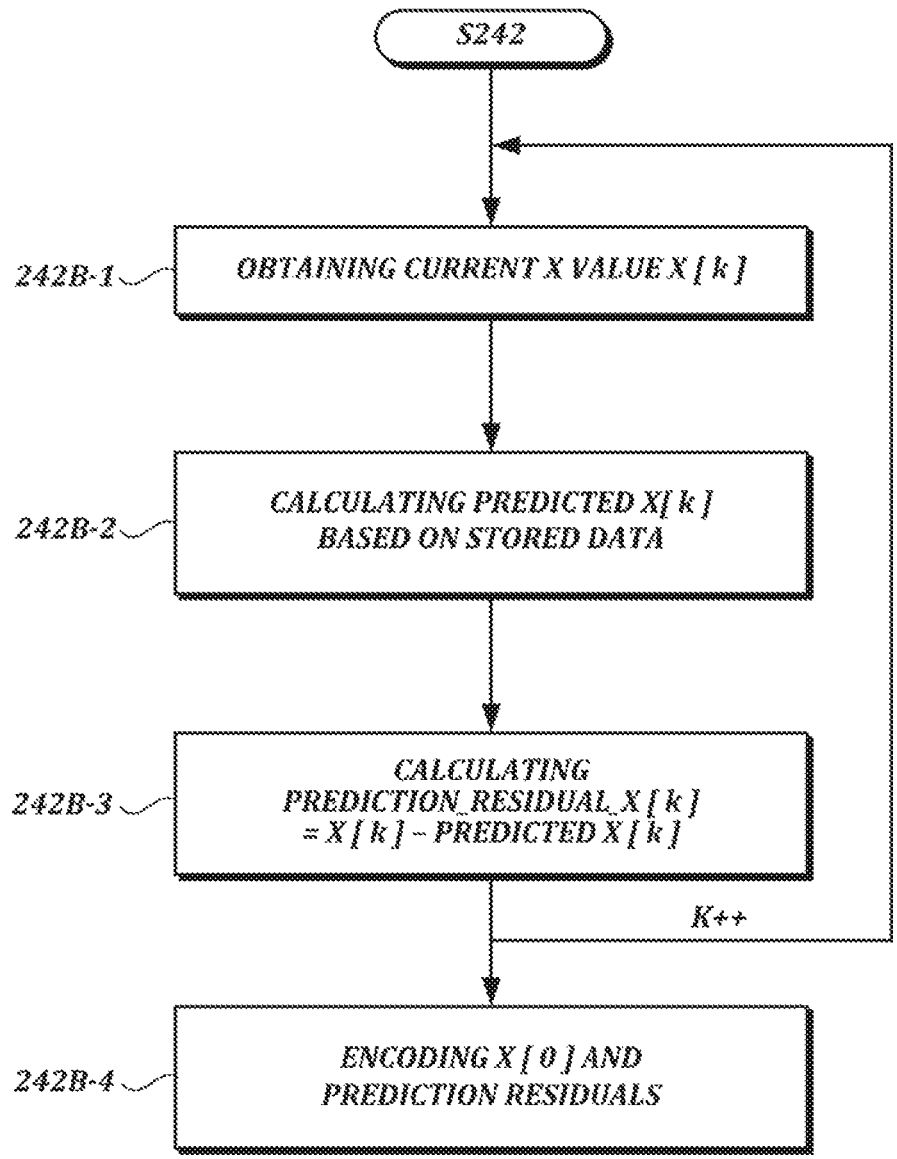
FIG. 31 is a flow chart illustrating an alternative first encoding scheme.

A flow chart of an alternative first encoding scheme S242 (see FIG. 28) is shown in FIG. 31. In the example shown in FIG. 31, x-coordinate values associated with pen events are encoded, although other values (e.g., y-coordinate values, pressure values) may be similarly encoded. When this encoding scheme illustrated in FIG. 31 is applied, the following steps are executed (e.g., in handwriting data processing section 2100A in FIG. 20). At step 242B-1, a current x-coordinate value (index k) is obtained. At step 242B-2, a predicted value of the current x-coordinate value (index k) is calculated based on previously obtained data. For example, the predicted value can be derived by a linear prediction method to a third point from two decoded values (e.g., X[k−2] and X[k−1]. At step 242B-3, a prediction residual value is calculated by subtracting the predicted value from the current x-coordinate value. In this example, the prediction residual is the difference between (i) the predicted x-coordinate position and the actual measured x-coordinate position. (Steps 242B-2 and 242B-3 may be skipped in some situations, such as where the current x-coordinate value is associated with an initial pen event (k=0) and no previously obtained data is available for calculating predicted values.) Steps 242B-1, 242B-2, and 242B-3 are repeated for subsequent pen events. When all the values in this stream have been processed, an initial x-coordinate value for an initial pen event (k=0) is encoded at step 242A-4 along with prediction residuals for subsequent pen events (k=1 . . . n). The particular techniques for encoding the initial value and the prediction residuals may vary depending on implementation, as explained in further detail below.

Figure 32:
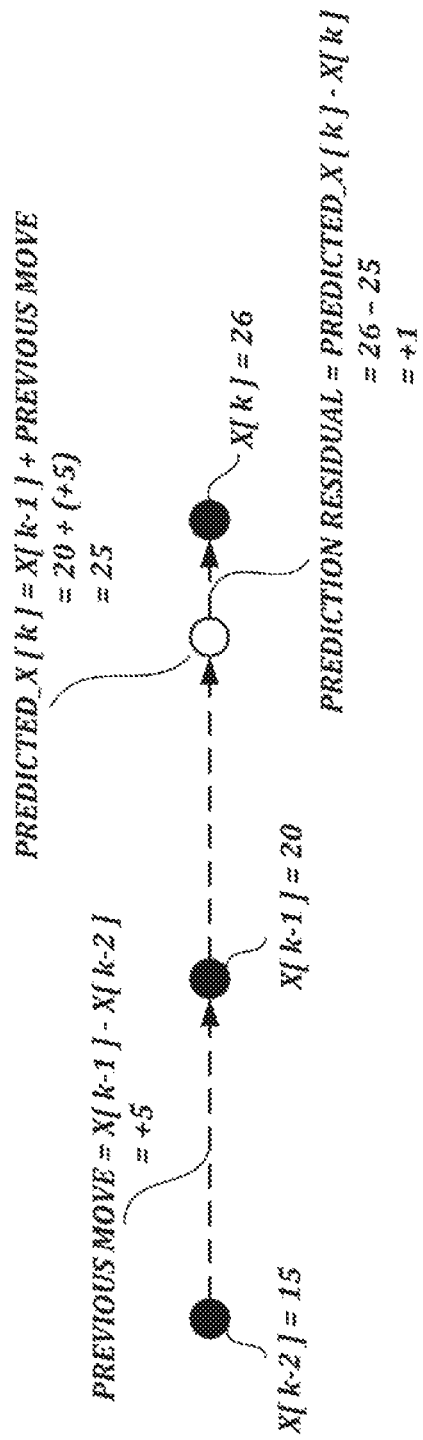
FIG. 32 is a diagram that illustrates a prediction residual calculation that may be performed in the alternative first encoding scheme shown in FIG. 31.

FIG. 32 is a diagram that illustrates a prediction residual calculation that may be performed in the alternative first encoding scheme S242B shown in FIG. 31. In the example shown in FIG. 32, x-coordinate values associated with pen events are predicted, although other values (e.g., y-coordinate values, pressure values) may be similarly predicted. A predicted value of the current x-coordinate value (X[k]=+26) is calculated based on previously obtained data. In this example, the predicted value (Predicted_X[k]) is calculated based on the values of two previously obtained x-coordinate values (X[k−2] and X[k−1]). In particular, the predicted value (+25) is calculated by adding the difference between the values of X[k−2] and X[k−1] to the value of X[k−1], as shown below:

$$\text{Predicted\_}X[k]=X[k-1]+(X[k-1]-X[k-2])=20+(20-15)=20+5=+25 \quad [\text{Math.7}]$$

The prediction residual value (+1) is calculated by subtracting the predicted value from the current x-coordinate value, as shown below:

$$\text{Prediction Residual}=X[k]-\text{Predicted\_}X[k]=26-25=+1 \quad [\text{Math.8}]$$

Figure 33:
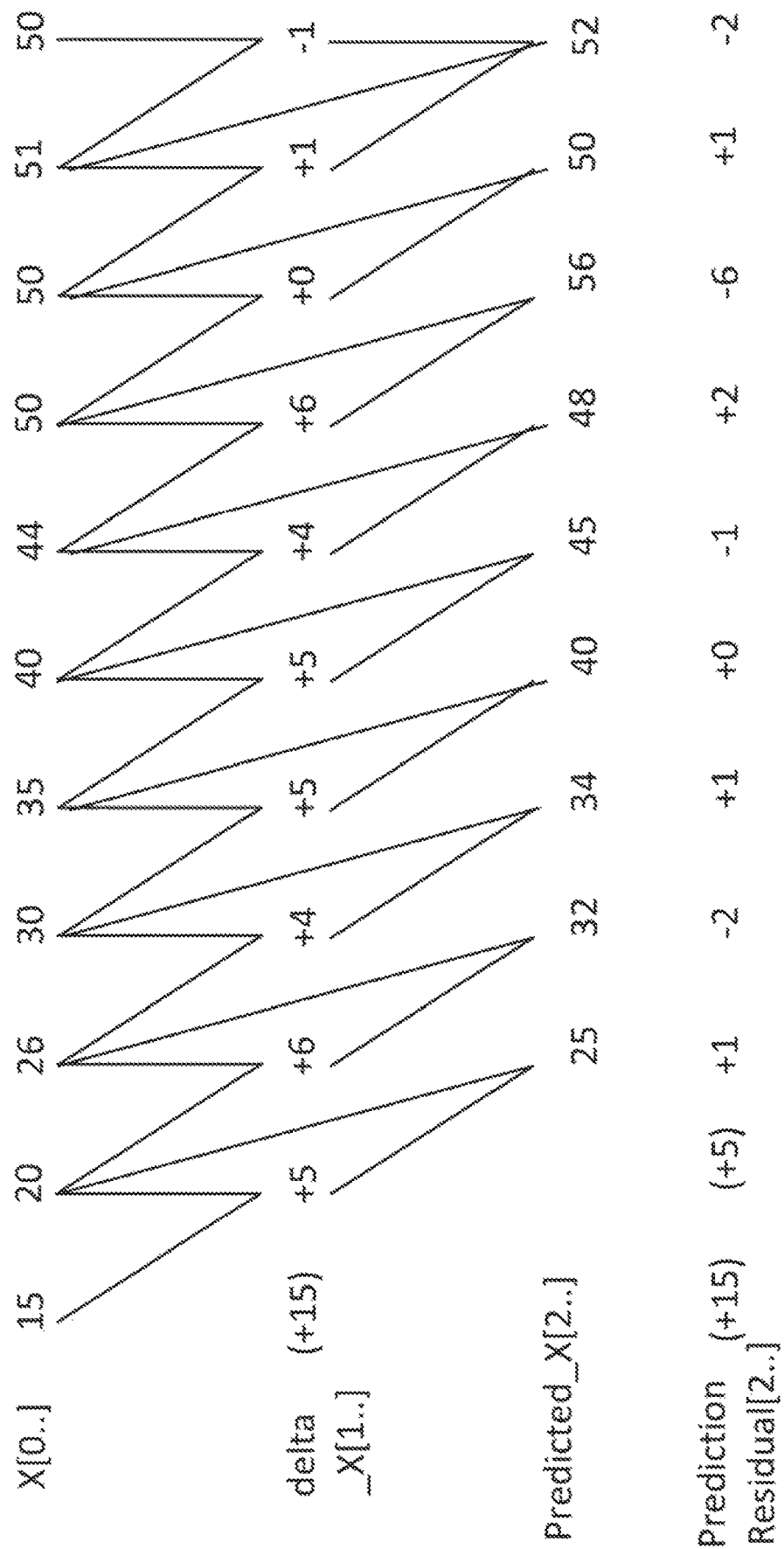
FIG. 33 is a diagram of several example x-coordinate values with respective delta values, predicted values, and prediction residuals.
Figure 34:
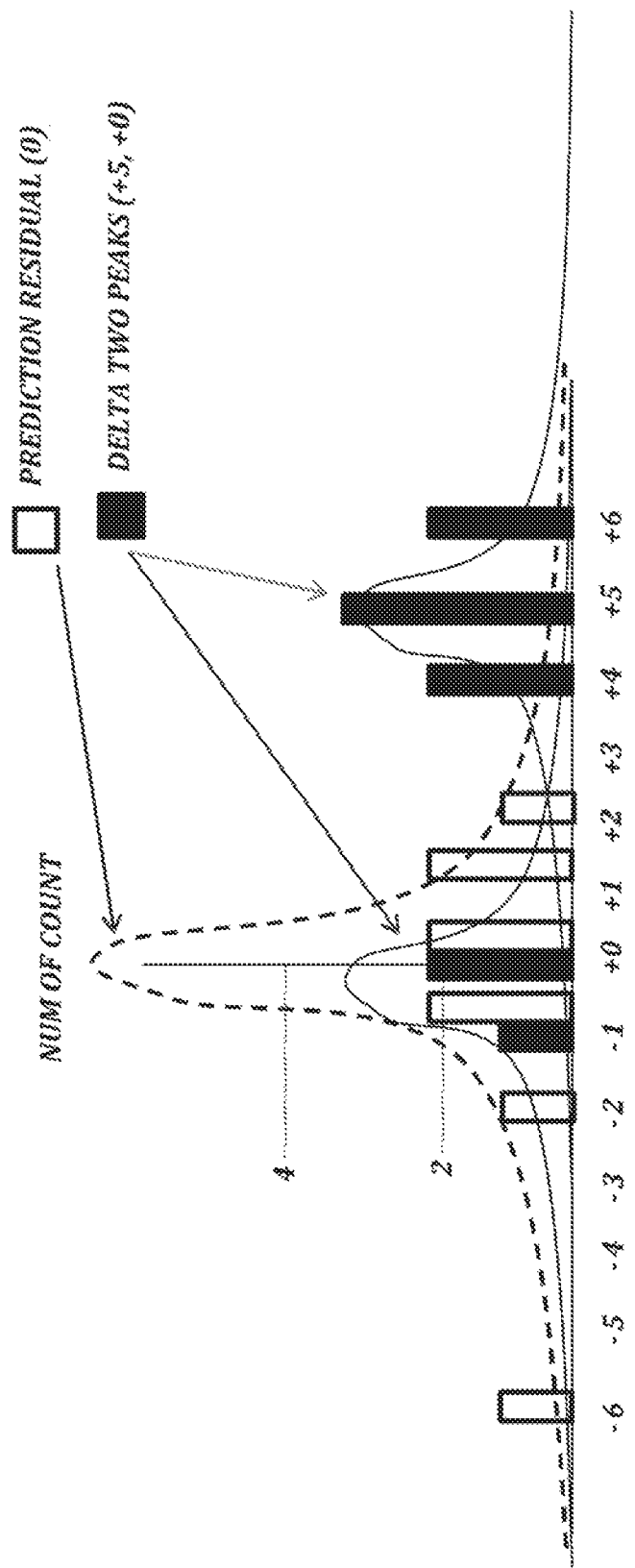
FIG. 34 is a histogram showing frequency of delta values and prediction residuals shown in FIG. 33.

FIG. 33 is a diagram of several example x-coordinate values with respective delta values, predicted values, and prediction residuals. In FIG. 33, the first row of values (X[0 . . . ]) represents actual x-coordinate values, the second row (delta_X[1 . . . ]) represents delta values, the third row (Predicted_X[2 . . . ] represents predicted values, and the fourth row (Prediction Residual[2 . . . ] represents prediction residual values. In the example shown in FIG. 33, x-coordinate values (first row) increase from an initial value of 15 until the rate of change slows significantly at around 50. FIG. 34 is a histogram showing frequency of delta values and prediction residuals shown in FIG. 33. As shown in FIG. 34, the magnitude of prediction residuals may be smaller on average than the magnitude of delta values. Further, the frequency of prediction residuals may center around a single peak (e.g., a small absolute value or 0) while the frequency of delta values may have multiple peaks (e.g., one peak around +5, and one peak around 0).

Figure 35:
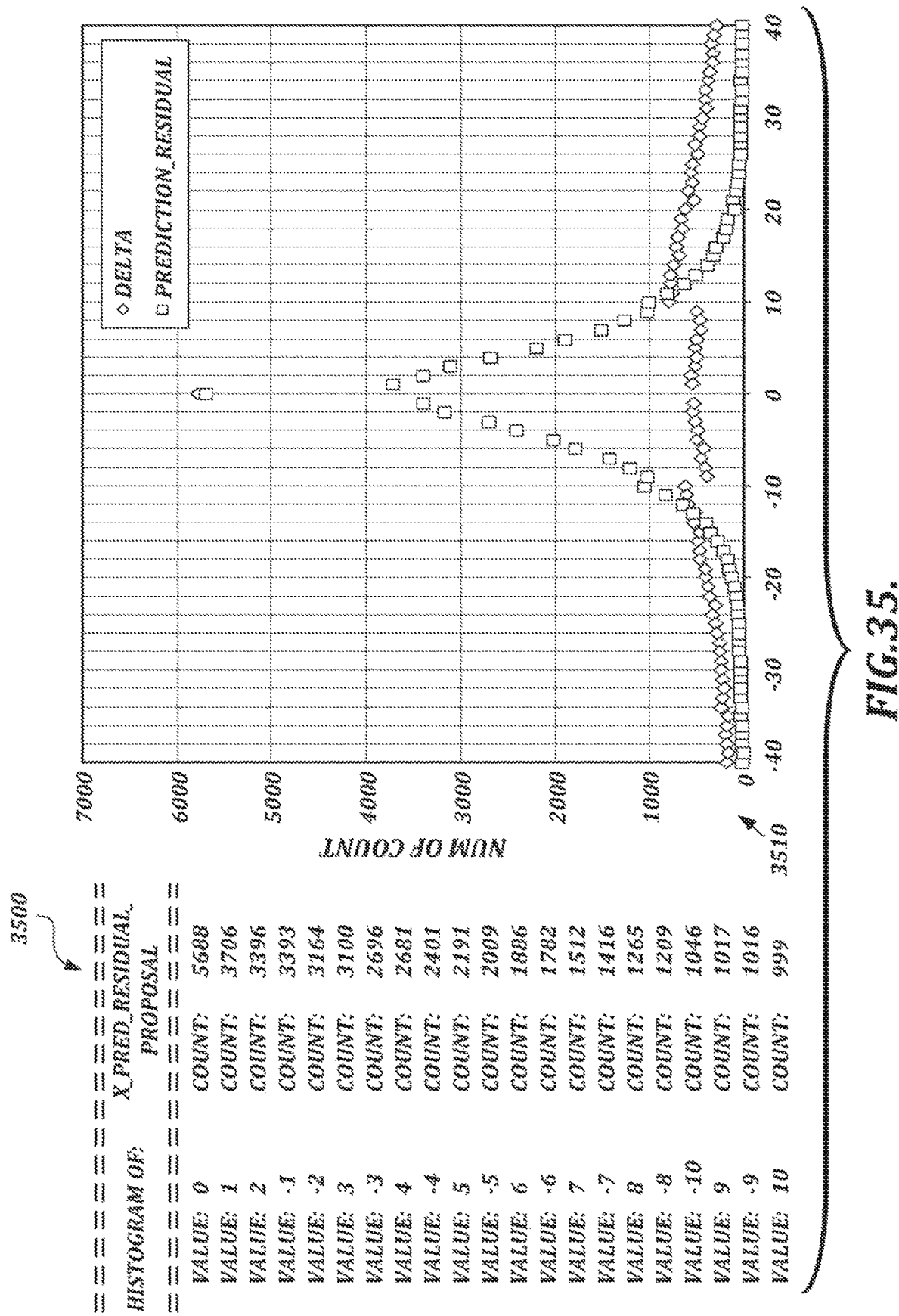
FIGS. 35 and 36 depict tables and histograms depicting results of an experimental study of 99 sample handwritten signatures.
Figure 36:
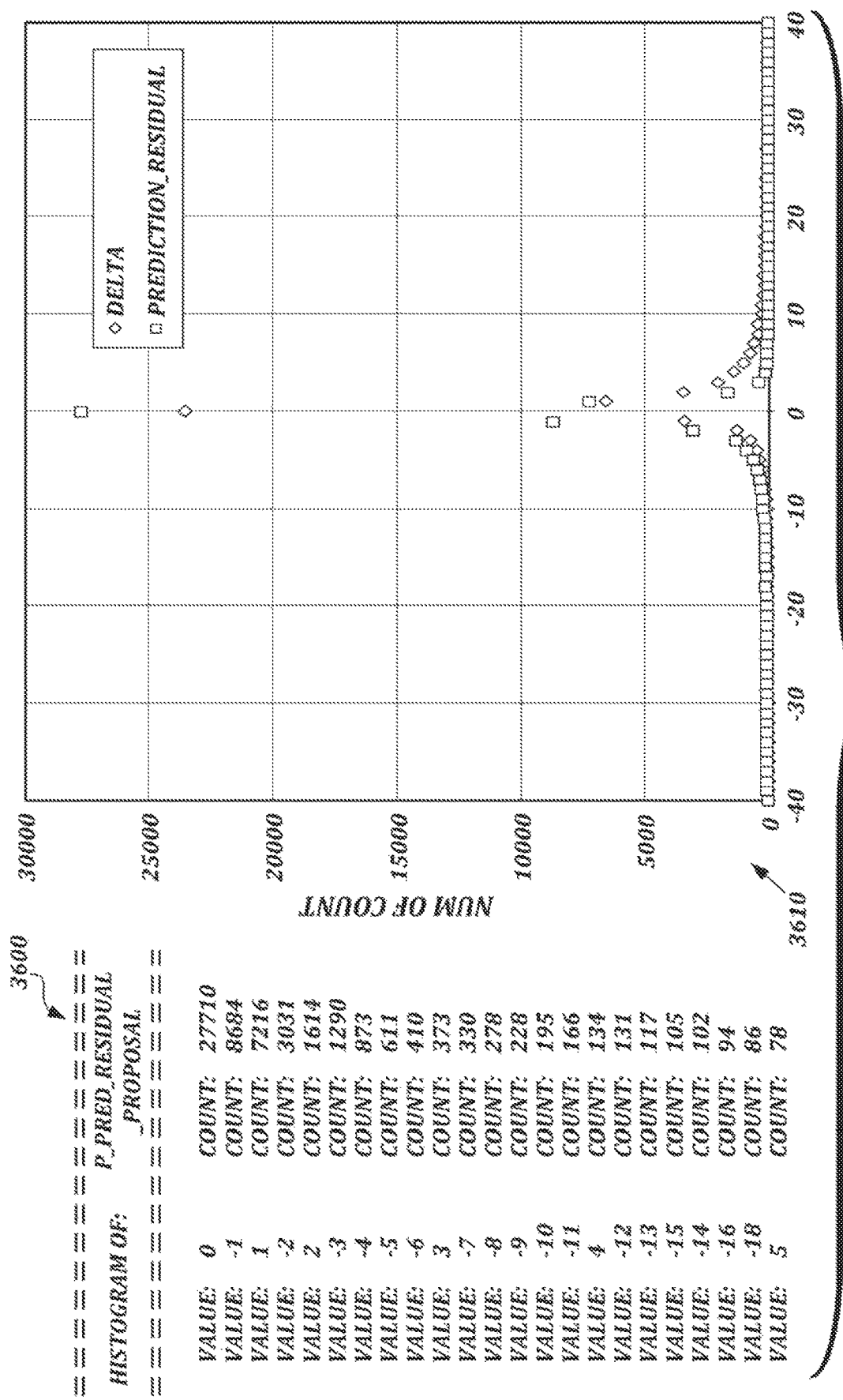

As shown in tables 3500 and 3600 depicted in FIGS. 35 and 36, respectively, an experimental study of 99 sample handwritten signatures indicates that smaller x-coordinate prediction residuals and pressure-value prediction residuals, respectively, tend to be more frequent than larger ones. Histogram 3510 depicted in FIG. 35 shows that the frequency of prediction residuals for x-coordinate values may center around a single peak (e.g., a small absolute value or 0) while the frequency of delta values may have multiple peaks (e.g., one peak around −10, one peak around +10, and one peak around 0). Histogram 3610 depicted in FIG. 36 shows that the frequency of prediction residuals and pressure values both may center around a single peak (e.g., a small absolute value or 0). Overall, the histograms 3510 and 3610 show that, for pressure values and for x-coordinate values, prediction residual values are more likely to be equal to or near 0. If a suitable encoding scheme is used, it may be possible to take advantage of these smaller magnitudes by encoding them with fewer bits.

FIG. 37 depicts a table 3700 that shows an example variable-length coding scheme that can be used to encode values such as delta values or prediction residuals. The table 3700 depicts a mapping between values and corresponding bit strings. The coding scheme depicted in FIG. 37 is a type of variable-length entropy coding known as Exponential-Golomb (or Exp-Golomb) coding, in which higher probability values are encoded using shorter bit strings. The example encoding scheme shown in FIG. 37 is particularly suitable for situations in which the occurrence of small values is significantly more likely than large values, as shown in FIGS. 38 and 39.

FIGS. 38 and 39 depict tables 3800 and 3900, respectively, which show results of applications of the variable-length coding scheme of FIG. 37 to prediction residuals for x-coordinate values and pressure values, respectively. The entries in the columns labeled "X_pred_residual_ExpGolomb" and "P_pred_residual_ExpGolomb" in tables 3800 and 3900, respectively, can be included in the output (e.g., streams associated with "streamID #1" and "streamID #7," respectively, in "FIRST_CONV_DATA") of a suitably configured encoder (e.g., stream adaptive encoder 2540 in FIG. 25).

Figure 40:
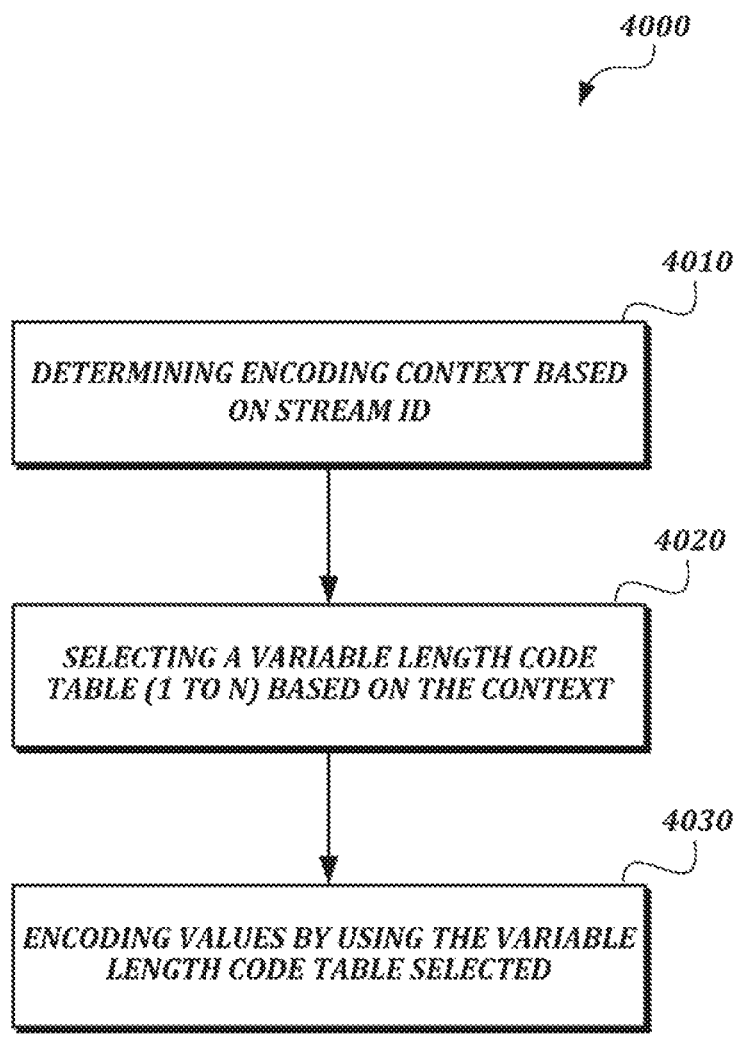
FIG. 40 is a flow chart of an illustrative context-based encoding scheme selection process.

A flow chart of an illustrative context-based encoding scheme selection process 4000 is shown in FIG. 40. At step 4010, an encoding context is determined based at least in part on a stream ID. At step 4020, a variable-length code (VLC) table is selected based on the context. At step 4030, values in the stream represented by the stream ID are encoded using the selected VLC table. FIGS. 41A and 41B show example VLC tables 4100 and 4110, respectively. In the example shown in FIG. 41A, the context has been determined based on the stream ID (e.g., stream ID=2) associated with x-coordinate values. The VLC table 4100 prioritizes right-moves over left-moves by generally providing shorter bitstrings for right-moves of a given magnitude. In the example shown in FIG. 41B, the context has been determined based on the stream ID associated with x-coordinate values and an indication of a language (e.g., Arabic), script, or alphabet in which the writing tends to move from right to left. The VLC table 4110 prioritizes left-moves over right-moves by generally providing shorter bitstrings for left-moves of a given magnitude. Details of how encoding contexts are determined and the particular VLC tables and codes that are used may vary depending on implementation.

Figure 42:
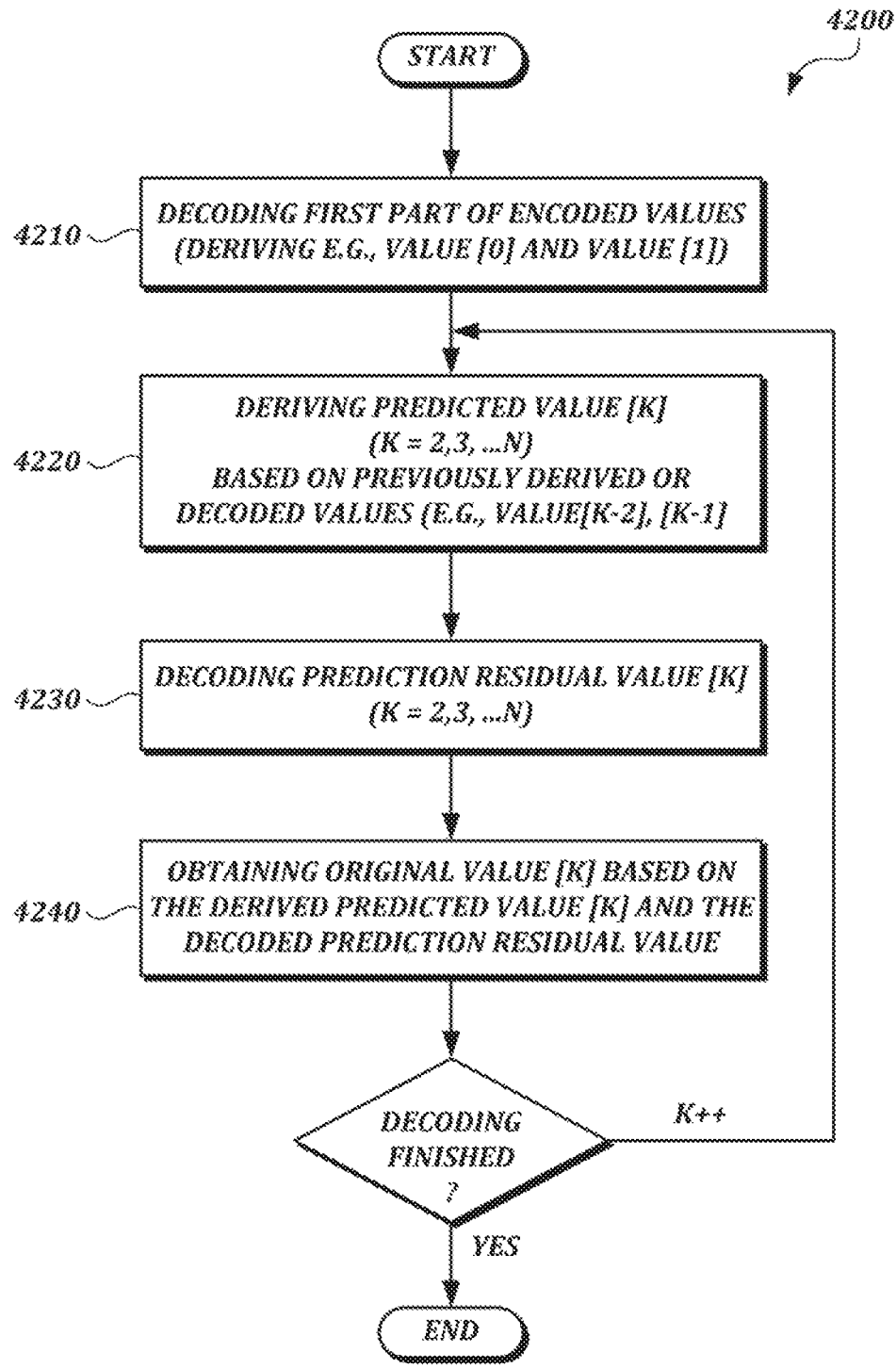
FIG. 42 is a flow chart of an illustrative decoding process involving decoding values with encoded prediction residuals.

A flow chart of an illustrative decoding process 4200 is shown in FIG. 42. In the example shown in FIG. 42, the decoding process 4200 involves decoding values (e.g., x-coordinate values, y-coordinate values, etc.) with encoded prediction residuals. At step 4210, a first part of encoded values (e.g., two initial encoded values corresponding to index k=0 and k=1, respectively) is decoded. The decoding of the values in the first part at step 4210 allows subsequent values with encoded prediction residuals to be decoded in later steps. At step 4220, a predicted value is derived for the value associated with the next index (e.g., k=2 or subsequent values) based on previously derived or decoded values. (See, e.g., FIG. 32.) At step 4230, a prediction residual value is decoded for the respective predicted value. At step 4240, an original value is obtained based on the derived predicted value and the decoded prediction residual value. (See, e.g., FIG. 32.) Decoding continues for additional values until all the encoded values to be decoded have been decoded. The techniques used for decoding particular encoded values and/or encoded prediction residuals (see, e.g., steps 4210 and 4230 of FIG. 42) will vary depending on the encoding scheme that was used to encode them. For example, values encoded using an Exp-Golomb encoding scheme will be decoded using a corresponding decoding scheme.

Figure 43:
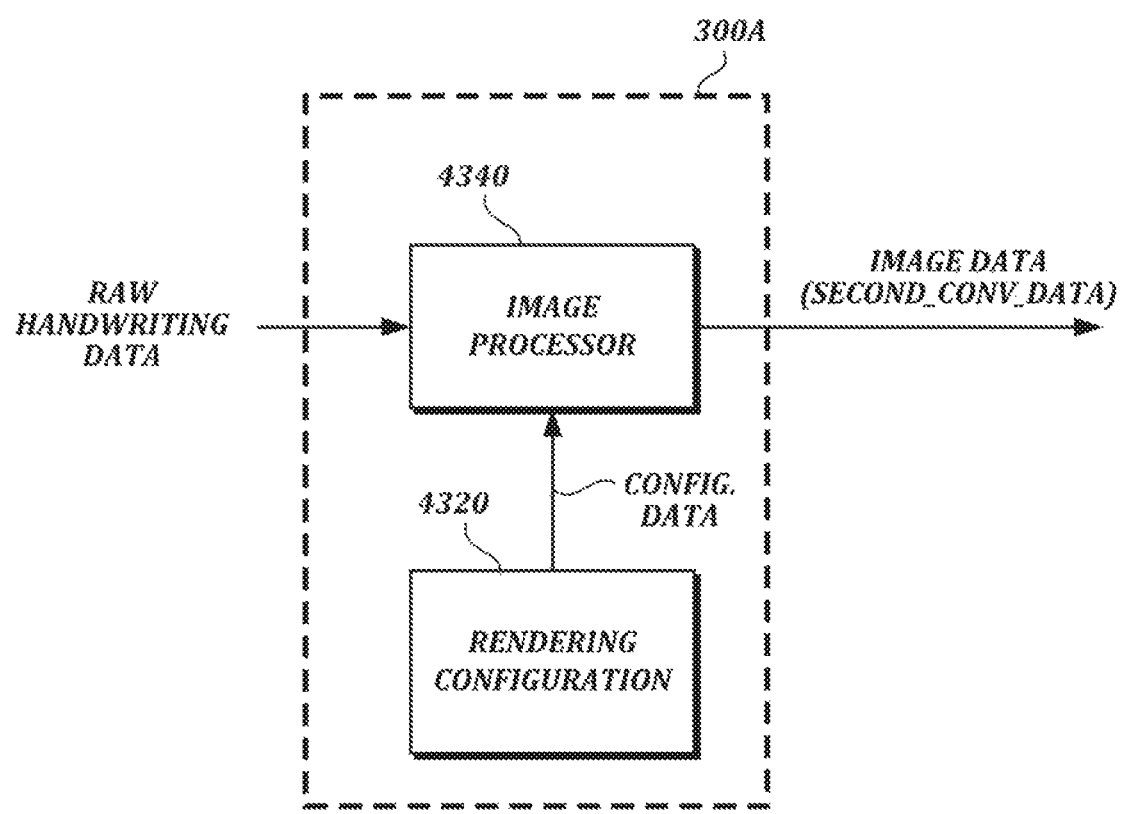
FIG. 43 is a functional block diagram of an illustrative embodiment of an image data processing section.
Figures 44, 45:
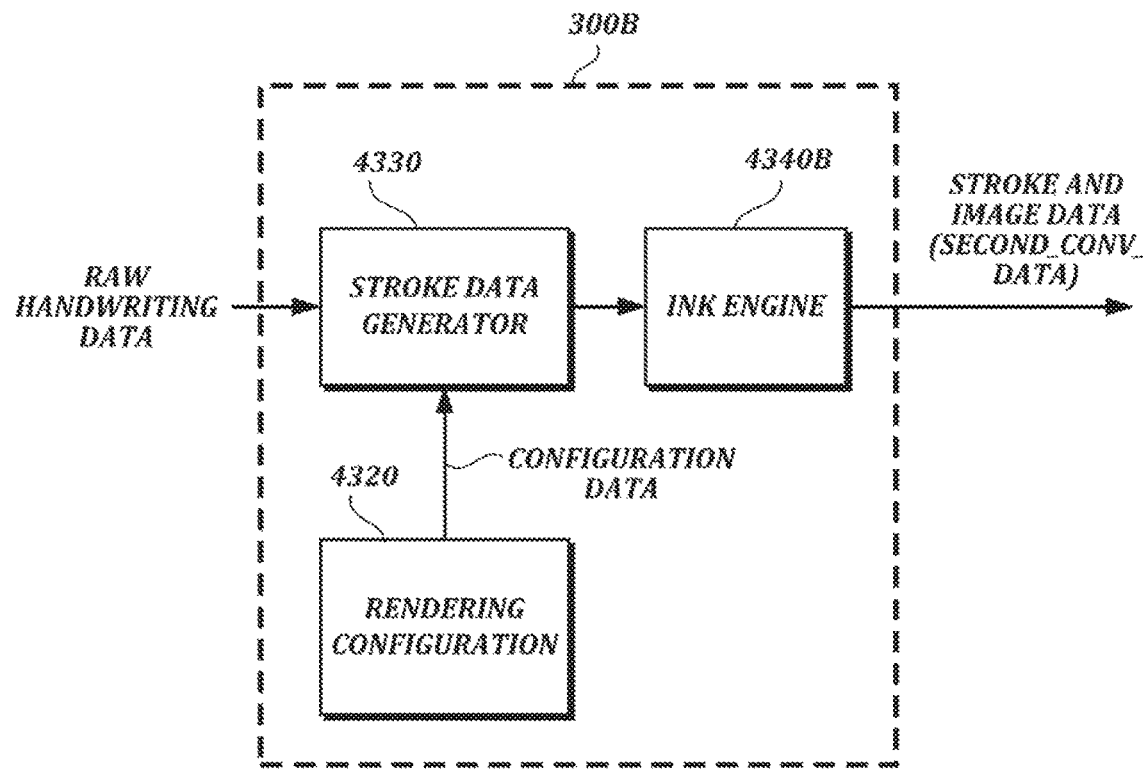
FIG. 44 is a functional block diagram of an illustrative embodiment of a stroke and image data processing section.
FIGS. 45 and 46 are illustrations of images that may be rendered from image data generated by a lossy data processing section.

Referring again to FIG. 21A, in some embodiments a stroke and/or image data processing section 300 processes raw handwriting data using lossy techniques (i.e., techniques that may involve data loss). Data loss may occur due to processes such as a one-way x/y-coordinate smoothing function, quantization (e.g., to convert data into standardized units), non-use and subsequent discarding of timestamps, among others. FIG. 43 shows an illustrative embodiment of an image data processing section 300A in which raw handwriting data is processed by an image processor 4340 based on configuration data provided by a rendering configuration module 4320. Configuration data may include data that may be needed to generate image data, such as image size, scale, offset, stroke color (e.g., red, green, blue, opacity), pen tool data (e.g., brush, pencil), and/or the like. In the example shown in FIG. 43, the image processor 4340 converts the raw handwriting data into image data (labeled "SECOND_CONV_DATA"). FIG. 44 shows an illustrative embodiment of a stroke and image data processing section 300B in which raw handwriting data is processed by a stroke data generator 4330 based on configuration data provided by a rendering configuration module 4320. In the example shown in FIG. 44, the stroke data generator 4330 converts the raw handwriting data into stroke data that can be processed by an ink engine 4340B. The ink engine 4340B converts the stroke data into image data ("SECOND_CONV_DATA").

Figure 46:
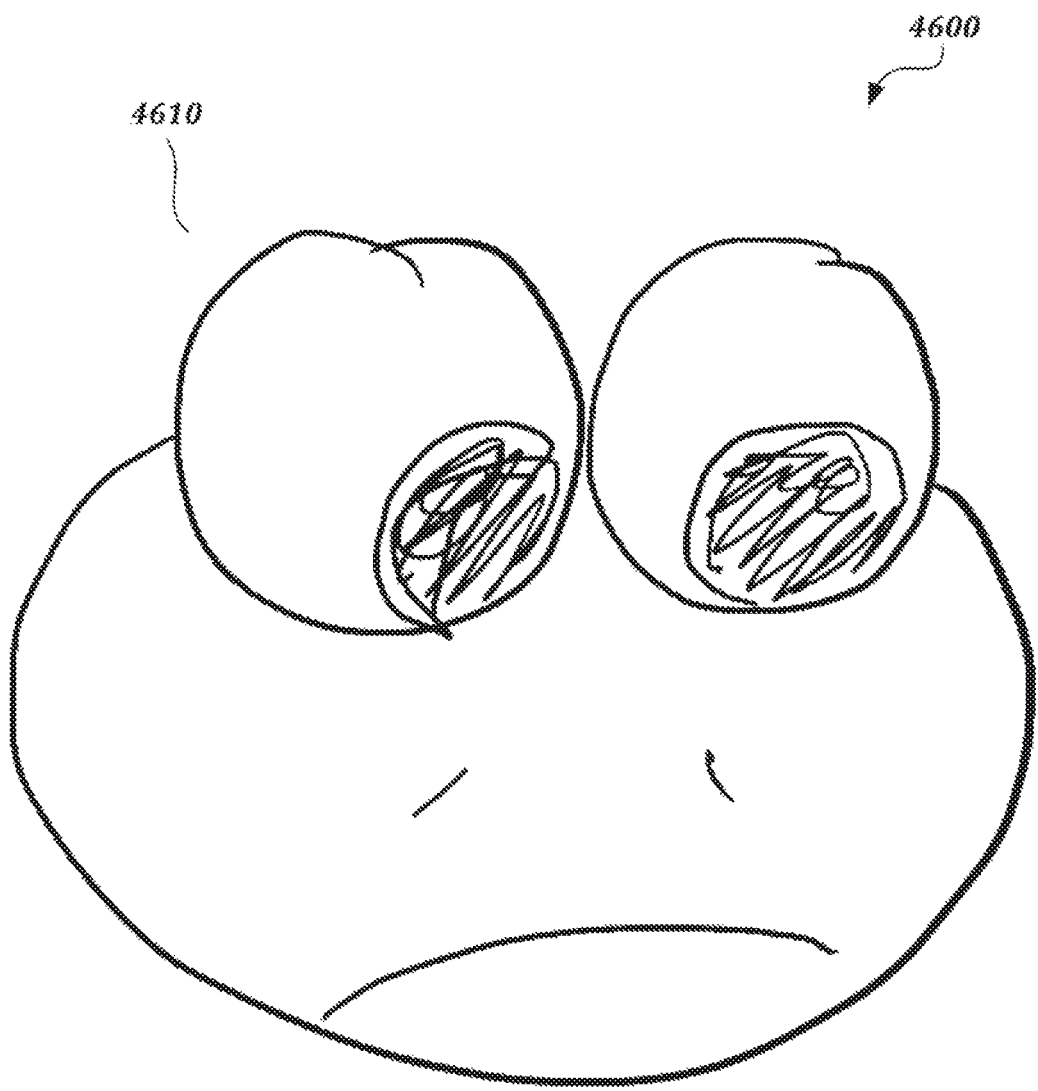

Examples of images that may be rendered from image data generated by a lossy data processing section 300 (e.g., by one of the embodiments depicted in FIGS. 43 and 44) are shown in FIGS. 45 and 46, which depict images of a signature 4500 and an artistic drawing 4600, respectively. In the example shown in FIG. 46, the artistic drawing is rendered over a background image 4610. Configuration data may be used to configure the rendering of the images. For example, configuration data may indicate that the handwriting of the signature 4500 or the artistic drawing 4600 should be rendered in a particular color of ink.

Figure 47:
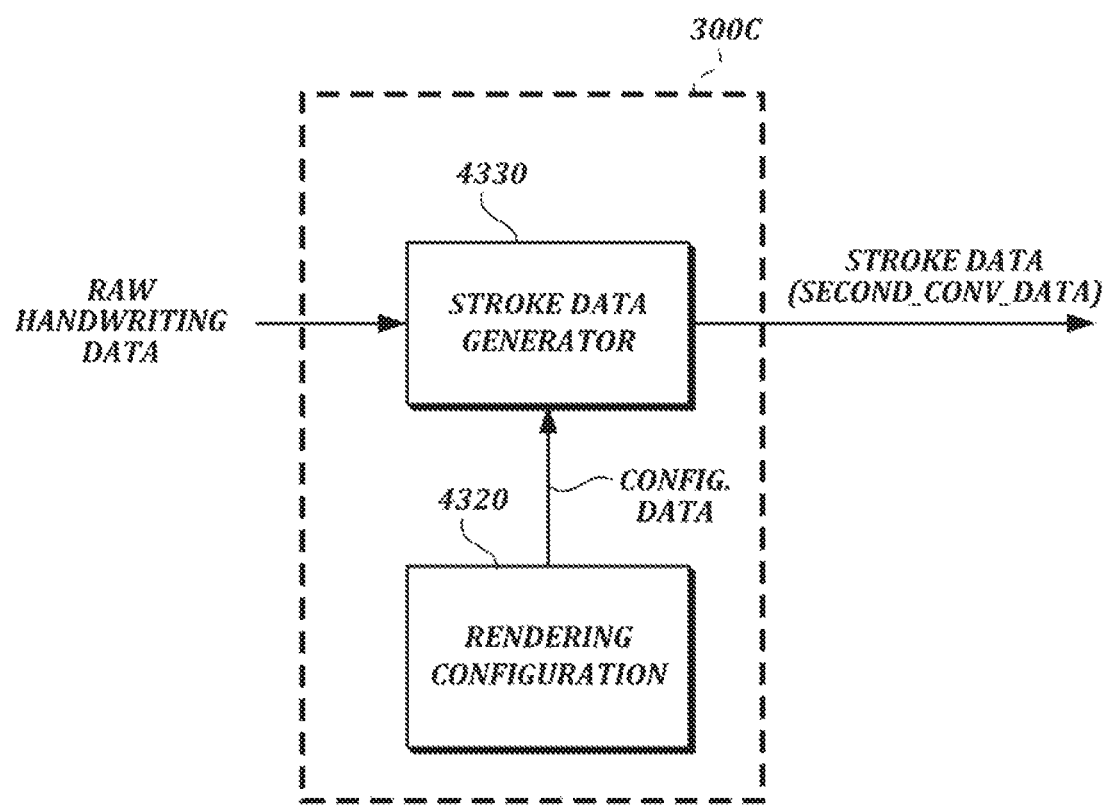
FIG. 47 is a functional block diagram of an illustrative embodiment of a stroke data processing section.

FIG. 47 shows an embodiment of a stroke data processing section 300C in which raw handwriting data is processed by a stroke data generator 4330 based on configuration data provided by a rendering configuration module 4320. The stroke data generator 4330 converts the raw handwriting data into stroke data ("SECOND_CONV_DATA"). Unlike the stroke and image data processing section 300B depicted in FIG. 44, the stroke data processing section 300C lacks an ink engine. A separate ink engine (not shown) may convert the stroke data into image data. As an example, the separate ink engine may run on a server in a cloud computing arrangement. The particular techniques that are used to generate and process configuration data, stroke data, and image data in embodiments described herein may vary depending on implementation and/or context.

Figure 48:
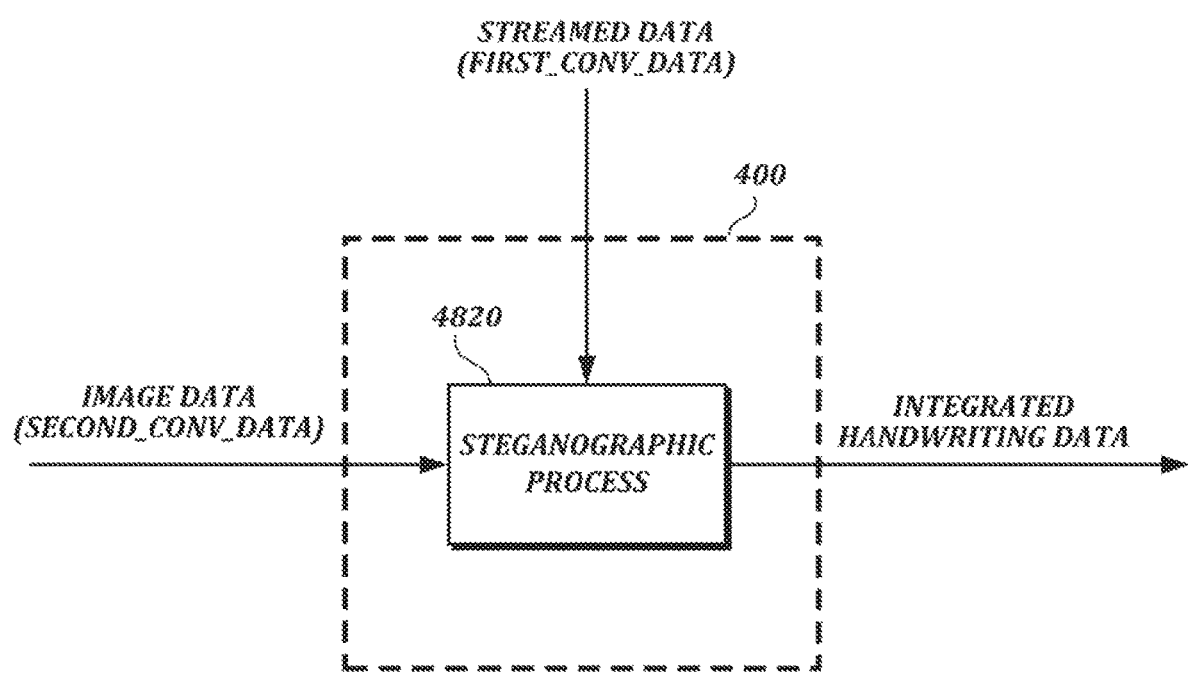
FIG. 48 is a functional block diagram of a steganographic process for inserting streamed data into image data.

Referring again to FIG. 21A, in some embodiments an integrating section 400 combines image data with handwriting data that has been preserved in a streamed format. FIG. 48 shows an illustrative embodiment of an integrating section 400 in which data ("FIRST_CONV_DATA") received from a stream generating section 200 (see FIG. 21A) is integrated with image data ("SECOND_CONV_DATA") received from a lossy data processing section 300 (see FIG. 21A). In the example shown in FIG. 48, a steganographic process 4820 is used to insert streamed data into image data. The particular techniques that are used to generate integrated data may vary depending on implementation and/or context, as explained in detail below.

Although it is possible to render images of signature or signed documents in standard image formats without preservation of the original content of handwriting data, one of the disadvantages of doing this is that much of the signature information captured will be lost. This problem can be overcome by integrating the original content of handwriting data with image data (e.g., by inserting encoded binary handwriting data into an image steganographically). A further advantage is that many existing applications can handle processing of images but not handwriting data. By inserting handwriting data into images, the original content of raw handwriting data can be preserved even as the images are passed between applications that are unable to recognize or process handwriting data on its own. Using images of this type allows the full original content of the handwriting data to be preserved without modifying the applications that handle the modified images.

The size of the streamed data for a particular instance of handwriting is variable and depends on factors such as the duration of the handwriting; data points are typically collected at fixed intervals, so the number of points to be stored is proportional to the overall time taken to sign and the rate of data collection. Some digitizers may collect 400 points per second, or more. The size of the streamed data also may depend on the presence or absence of data streams that may be optional, such as pressure and pen angle streams. As an example, a signature comprising x-coordinate, y-coordinate, time, and pressure information collected at 100 points per second (a common frequency) may occupy between 1 and 2 kilobytes when stored in binary form. Handwriting containing more points per second may include more information. In at least one embodiment, typical handwritten signatures generate streamed data in a range between 2 and 4 kilobytes in size.

Figure 49:
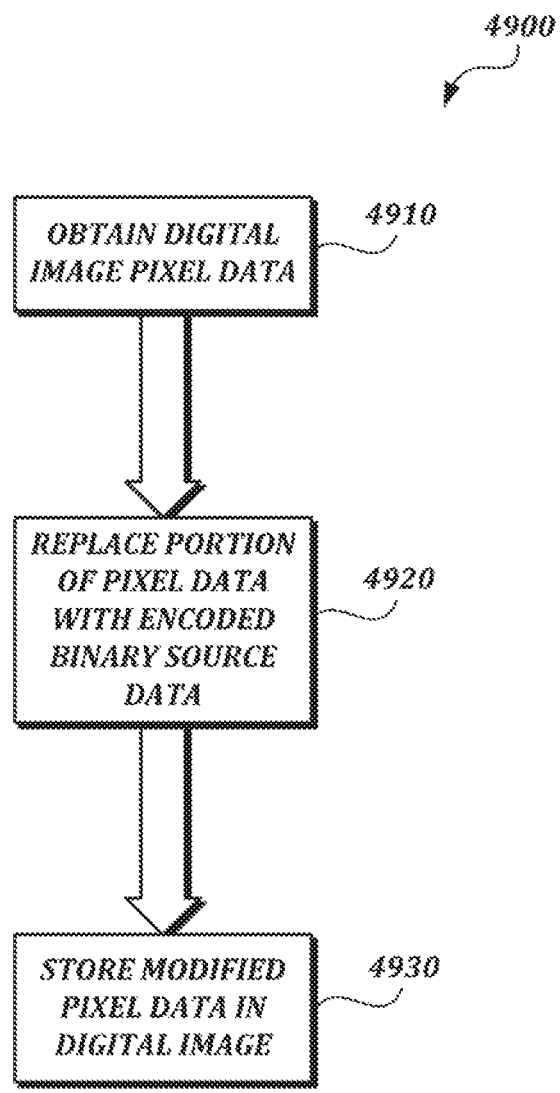
FIG. 49 is a flow chart of a generalized technique for inserting encoded binary handwriting data into an image.

In at least one embodiment, encoded binary handwriting data is inserted into an image according to the generalized technique 4900 shown in FIG. 49. In step 4910, digital image pixel data is obtained. No particular format of the original pixel data is required. However, it is preferred that the bit depth of the pixel data be such that some bits can be altered from their original values without causing noticeable degradation of the rendered image. In step 4920, a portion of the original pixel data is replaced with encoded binary handwriting data that represents electronic handwriting (e.g., in an encoded binary format described above). For example, one or more bits of one or more color values are modified in selected pixels of the image, as explained in further detail below. The number of pixels to be modified may depend on several factors, including the size of data to be encoded and the number of bits that are modified in each pixel. In step 4930, the image data, including the modified pixel values, are stored in a modified digital image. The modified image may be stored in a compressed or uncompressed format. To avoid data loss, the modified digital image is not stored in lossy compression formats such as JPEG.

In at least one embodiment, in a pixel consisting of 24 bits with 8 bits used for each of three color values (e.g., red, green, and blue), less significant bits of the color value are replaced with electronic handwriting data. In at least one embodiment, 4 bits per pixel (e.g., the least significant bit of the red value, the least significant bit of the green value, and the 2 least significant bits of the blue value) are replaced, thereby allowing 4 bits of handwriting data to be stored in a single pixel, and 1 byte (8 bits) of handwriting data to be stored in 2 pixels. The 4 bits of handwriting data per pixel can translate to a base-16 (hex) value.

It is generally preferred that handwriting data is not all stored in a continuous sequence of pixels in the image. In some embodiments, although some data (e.g., header data) may be stored in a series of sequential pixels, much of the data (e.g., x-coordinate data, y-coordinate data) is stored in a pseudo-random selection of pixels distributed around the full image. In at least one embodiment, header information is inserted into a series of sequential pixels beginning with the first pixel of the image and continuing sequentially until all the header information has been inserted. Data in the individual streams is then inserted into a pseudo-random selection of pixels. Header information may include a version number of the data storage mechanism; a size of the streamed data; and the width and height of the image in which the data will be stored.

In addition to header information and stream data, validation data may be inserted into an image in order to provide a mechanism for determining whether an image contains valid handwriting data. In at least one embodiment, 8 bits representing two predetermined hex-values are inserted in the first two pixels of an image. When the data is later extracted, a suitably configured decoder can check for the presence of these two hex-values to make an initial determination that the image contains valid handwriting data. Alternatively, validation data can take other forms (e.g., binary data representing more than 2 hex-values, a base-64 value, etc.), or validation data can be omitted.

Figure 50:
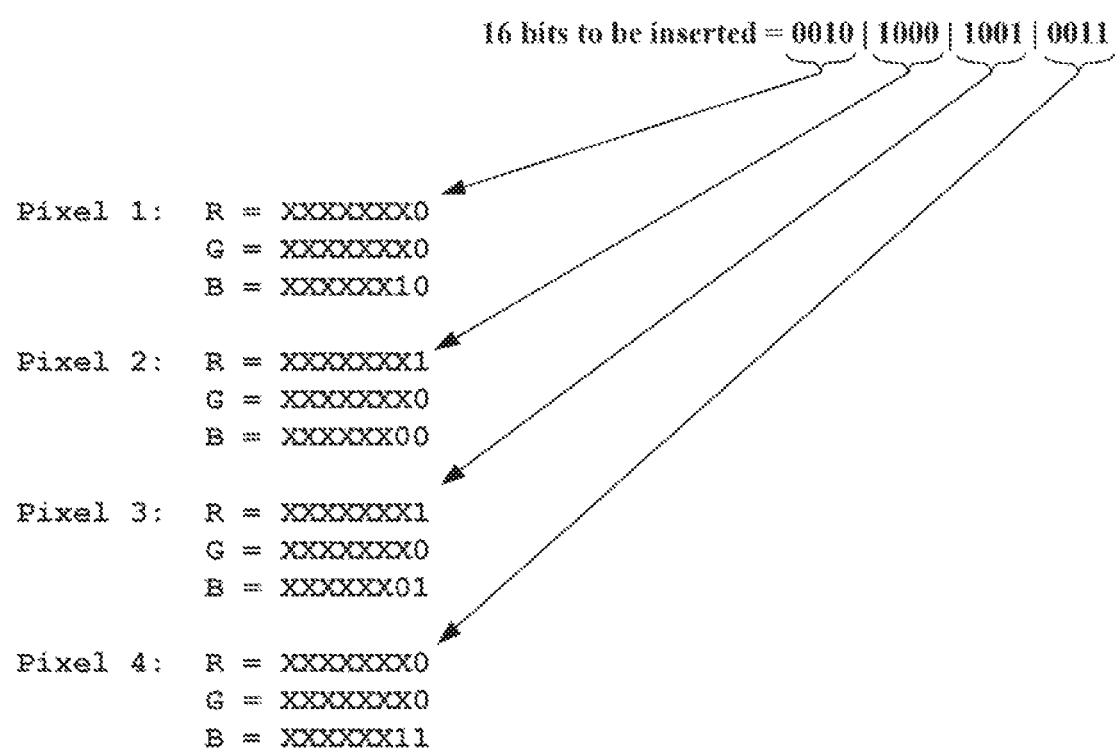
FIG. 50 is a diagram of an illustrative distribution of 16 bits of binary data in a pseudo-random selection of pixels.

In the example shown in FIG. 50, the distribution of 16 bits of binary data in a pseudo-random selection of pixels is illustrated. As shown in FIG. 50, 1 bit in each red value, 1 bit in each green value, and 2 bits in each blue value are modified. The remaining bits in each color value (represented in FIG. 50 by an "X") are not affected. Alternatively, binary data can be inserted into pixel values in some other way. For example, different numbers of bits in the red, green, and blue color values can be modified, or some subset of color values (e.g., red and blue) can be modified while the remaining color value(s) (e.g., green) are left unmodified. The particular numbers of bits and the particular values to be modified may also depend on the format of the image data. For example, an image in a format that contains different color values, or color values having different bit depths (e.g., 10 bits or 16 bits) may be adjusted in different ways. In general, an integration scheme that results in a very small amount of image degradation is preferred.

Pseudo-random selection of pixels can be performed in many ways. In at least one embodiment, a uniform-deviate generator is initialized with the size of the image as a seed, and is then used to determine the sequence of pixels to be modified. This ensures that the pixels are uniformly distributed and makes it difficult for a third party to determine which pixels have been modified. If a given pixel is selected a second time, it is simply ignored, and another pixel is selected according to the pseudo-random algorithm. When the embedded data is decoded, the sequence of pixels can be determined using the image size as a seed with the same algorithm. This means that although the information is scattered around the image the same sequence can be reproduced (by initializing the uniform deviate with the same seed) and the modified pixels can be read in the correct order by a suitably configured decoder.

Figure 51:
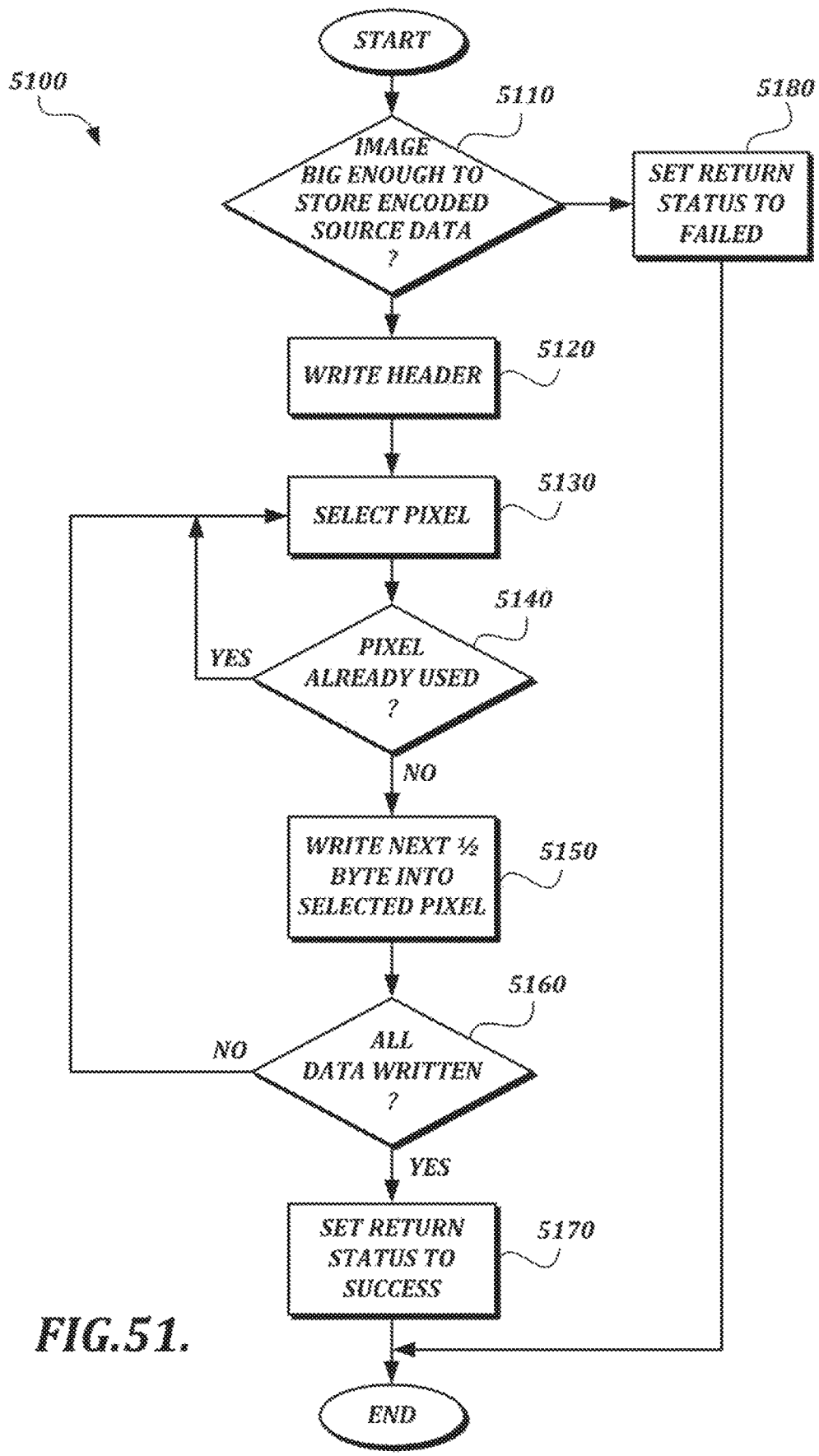
FIG. 51 is a detailed flow chart illustrating a steganographic process of inserting encoded binary handwriting data into a digital image.

A detailed flow chart that illustrates a steganographic process 3200 of inserting encoded binary handwriting data into a digital image in at least one embodiment is provided in FIG. 51. At step 5110, an initial determination is made as to whether the image is large enough (in terms of number of pixels) to store the encoded handwriting data. The algorithm used to make this determination can vary depending on implementation. As an example, the algorithm can determine whether, given the number of bits (e.g., 4 bits) to be modified in each pixel, the number of pixels that will be need to be modified to store the encoded handwriting data exceeds a predetermined threshold percentage of the total pixels in the image. If the image is large enough, at step 5120 the header data is written in a sequence of pixels. For the remaining encoded handwriting data, at step 5130 a pixel is pseudo-randomly selected. A check is performed at step 5140 to determine whether the pixel was previously selected. If the pixel has been previously selected, the pseudo-random selection process is performed again. If the pixel has not been previously selected, at step 5150 the appropriate number of bits (e.g., ½-byte (4 bits)) of encoded handwriting data are written in the pixel. Steps 5130-5150 are repeated until, at step 5160, a determination is made that all encoded handwriting data has been written in the image. A status flag is set at step 5170 to indicate success.

If, on the other hand, the image is not large enough to store the encoded handwriting data, at step 5180 the status flag is set to indicate failure. However, the process 5100 also can include an adaptive feature to deal effectively with some images that are not large enough to store the encoded handwriting data. For example, the process 5100 can be adapted to modify a larger number of bits in each selected pixel (e.g., by modifying 6 bits per pixel (e.g., 2 bits per color value) rather than 4 bits per pixel) to reduce the number of pixels that will need to be modified. In this way, the percentage of pixels to be modified in the image may be reduced, and the steganographic process can continue despite the smaller number of pixels in the image.

Figure 52:
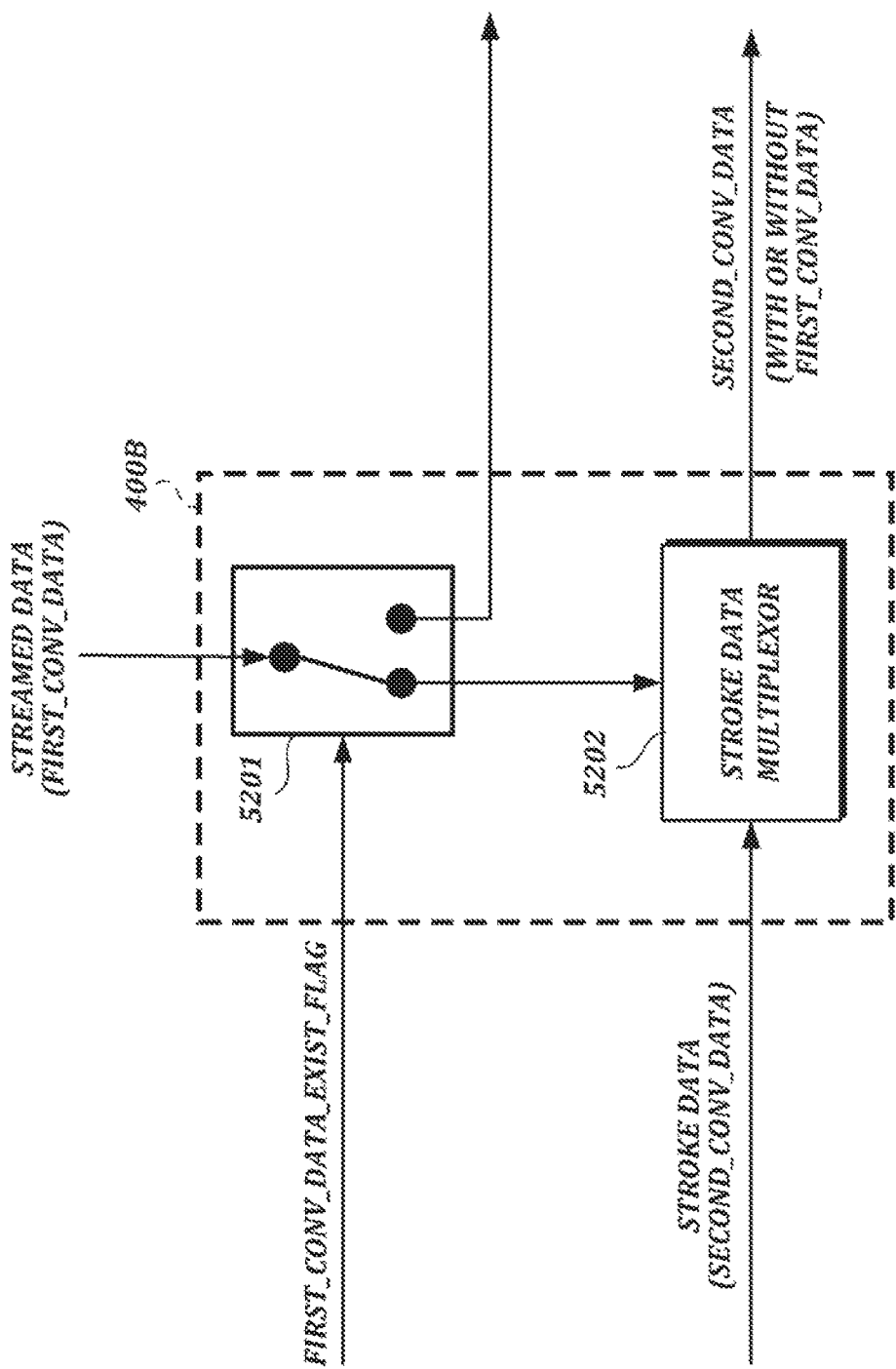
FIG. 52 is a functional block diagram of an illustrative embodiment of an integrating section.
Figure 53:
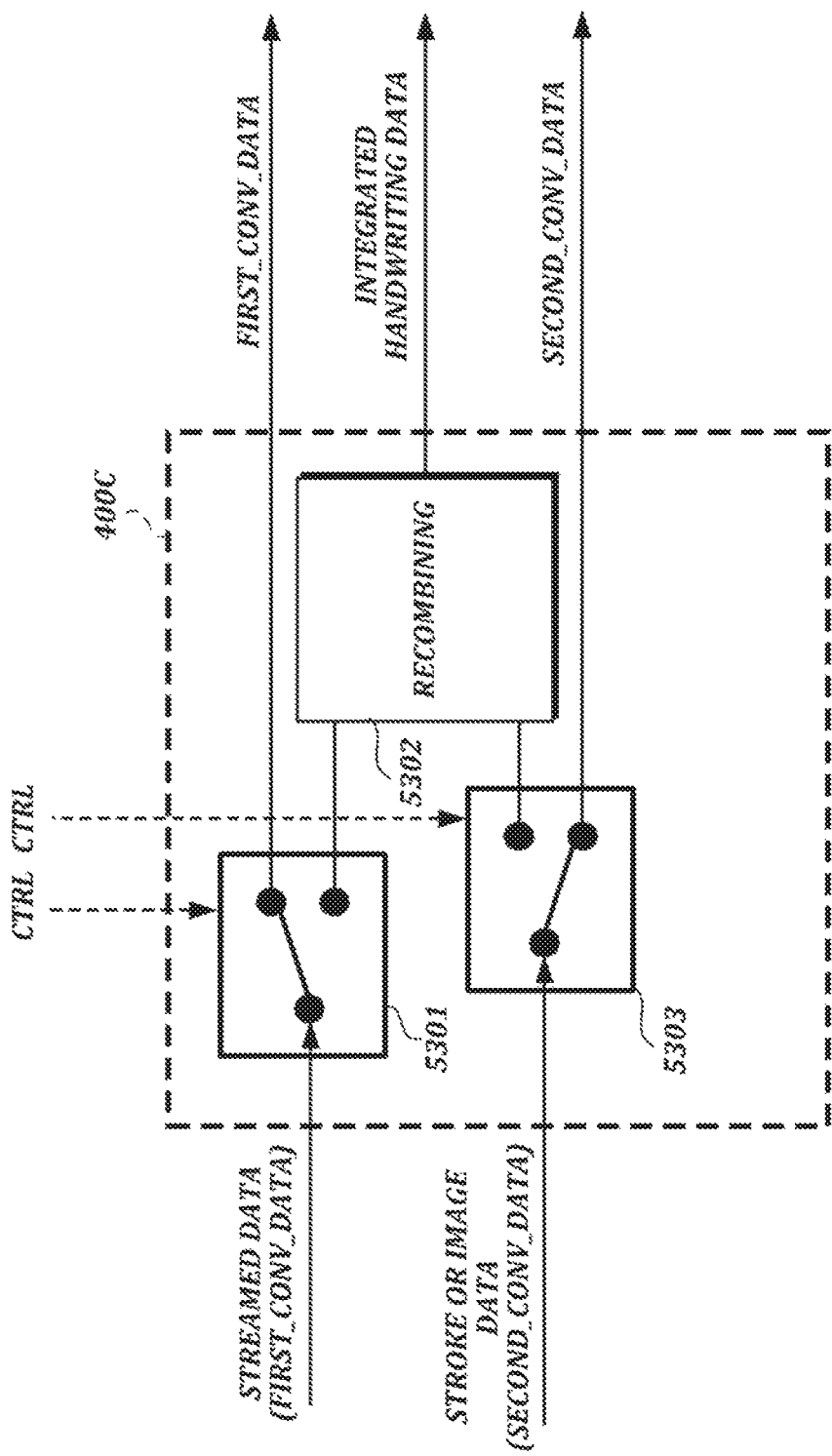
FIG. 53 is a functional block diagram of another illustrative embodiment of an integrating section.

It is not necessary to always combine streamed data with image data or stroke data. FIG. 52 shows an illustrative embodiment of an integrating section 400B in which data received from a stream generating section 200 (see FIG. 21A) is selectively integrated with stroke data received from a lossy data processing section 300 (see FIG. 21A). In the example shown in FIG. 52, the integrating section 400B determines whether the data ("FIRST_CONV_DATA") received from the stream generating section 200 will be integrated with the stroke data ("SECOND_CONV_DATA") in stroke data multiplexor 5202 based on the state of a flag ("FIRST_CONV_DATA_EXIST_FLAG") provided as input to the selection module 5201. FIG. 53 shows another illustrative embodiment of an integrating section 400C in which data received from a stream generating section 200 (see FIG. 21A) is selectively integrated with stroke and/or image data received from a lossy data processing section 300 (see FIG. 21A). In the example shown in FIG. 53, the integrating section 400C determines whether the streamed data ("FIRST_CONV_DATA") received from the stream generating section 200 will be integrated with the stroke and/or image data ("SECOND_CONV_DATA") in recombining module 5302 based on control signals ("ctrl") provided as input to selection modules 5301 and 5303. The particular techniques that are used to integrate data and to determine whether data should be integrated and/or processed separately may vary depending on implementation and/or other factors, such as whether an application is requesting particular data. For example, if an application requests only image data (e.g., a PNG file), the control signals can be set such that the integrating section 400C outputs only image data. As another example, if an application requests only streamed data, the control signals can be set such that the integrating section 400C outputs only streamed data. As another example, if an application requests streamed data and image data, the control signals can be set such that the integrating section 400C outputs integrated data comprising streamed data and image data.

In any of the examples described herein, one or more decoders can be used to decode lossy or lossless-encoded data. A decoder receives encoded data as input and produces decoded data as output. Typically, a decoder comprises decoding logic that is configured to decode data that has been encoded in a specific way. For example, a PNG (Portable Network Graphics) decoder is configured to decode data that has been encoded in a PNG format. Decoding logic may reside on a different computing device than the corresponding encoding logic, or on the same device.

In accordance with embodiments described herein, an encoded handwriting data decoder comprises logic for reading encoded binary handwriting data (e.g., bit-packed, exp-Golomb coded binary handwriting data) and converting it back into a form that can be used by tools such as ink engines, forensic signature data analysis tools, or other electronic handwriting tools. An encoded handwriting data decoder can be used in combination with other decoders, such as image data decoders. For example, after an encoded handwriting data decoder reads encoded handwriting data that has been inserted in pixel data in an image file, the image file can then be decoded by a suitable image data decoder and rendered for display.

The details of the decoding process used by a decoder may depend on context and/or on information that is provided to the decoder. For example, in accordance with embodiments described herein, an encoded handwriting data decoder may receive information in a header portion of encoded handwriting data that indicates how many bits in each color value of a pixel contain encoded binary handwriting data, or whether a particular code table has been used in an entropy coding scheme. With this information, the decoder can choose the appropriate techniques for decoding the encoded data.

Although embodiments described above relate to electronic handwriting data that may be stored in digital images, it should be understood that in many of the techniques and tools described above, electronic handwriting data may be supplemented or replaced with other types of data that are not limited to electronic handwriting data, and such data may be stored in and/or extracted from digital images in accordance with principles described herein.

III. Computing Environment

Unless otherwise specified in the context of specific examples, described techniques and tools may be implemented by any suitable computing devices, including, but not limited to, laptop computers, desktop computers, smart phones, tablet computers, and/or the like. For example, although generation of handwriting data in some examples described herein may require certain hardware features, such as an electronic pen, the raw data generated by an electronic pen may be transmitted to and processed by suitably configured general purpose computing devices, including, but not limited to, laptop computers, desktop computers, smart phones, tablet computers, and/or the like.

Some of the functionality described herein may be implemented in the context of a client-server relationship. In this context, server devices may include suitable computing devices configured to provide information and/or services described herein. Server devices may include any suitable computing devices, such as dedicated server devices. Server functionality provided by server devices may, in some cases, be provided by software (e.g., virtualized computing instances or application objects) executing on a computing device that is not a dedicated server device. The term "client" can be used to refer to a computing device that obtains information and/or accesses services provided by a server over a communication link. However, the designation of a particular device as a client device does not necessarily require the presence of a server. At various times, a single device may act as a server, a client, or both a server and a client, depending on context and configuration. Actual physical locations of clients and servers are not necessarily important, but the locations can be described as "local" for a client and "remote" for a server to illustrate a common usage scenario in which a client is receiving information provided by a server at a remote location.

Figure 54:
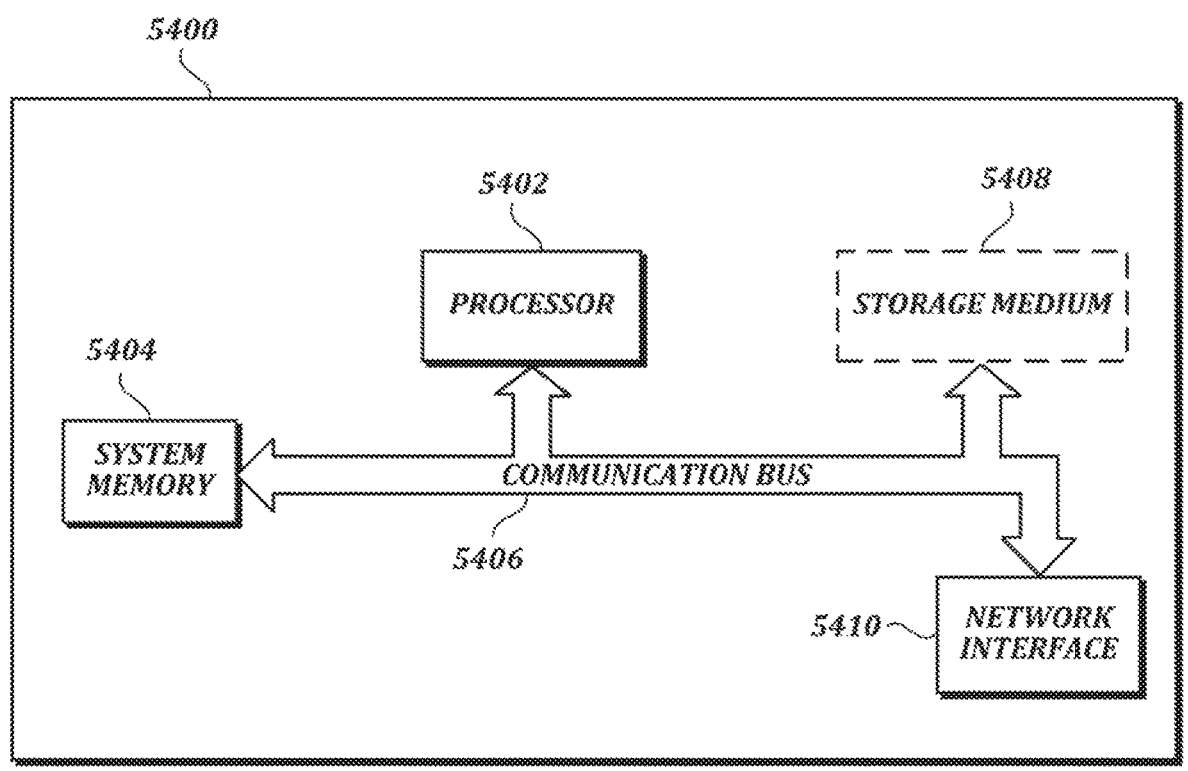
FIG. 54 is a block diagram that illustrates aspects of an exemplary computing device appropriate for use in accordance with embodiments of the present disclosure.

FIG. 54 is a block diagram that illustrates aspects of an exemplary computing device 5400 appropriate for use in accordance with embodiments of the present disclosure. The description below is applicable to servers, personal computers, mobile phones, smart phones, tablet computers, embedded computing devices, and other currently available or yet-to-be-developed devices that may be used in accordance with embodiments of the present disclosure.

In its most basic configuration, the computing device 5400 includes at least one processor 5402 and a system memory 5404 connected by a communication bus 5406. Depending on the exact configuration and type of device, the system memory 5404 may be volatile or nonvolatile memory, such as read only memory ("ROM"), random access memory ("RAM"). EEPROM, flash memory, or other memory technology. Those of ordinary skill in the art and others will recognize that system memory 5404 typically stores data and/or program modules that are immediately accessible to and/or currently being operated on by the processor 5402. In this regard, the processor 5402 may serve as a computational center of the computing device 5400 by supporting the execution of instructions.

As further illustrated in FIG. 54, the computing device 5400 may include a network interface 5410 comprising one or more components for communicating with other devices over a network. Embodiments of the present disclosure may access basic services that utilize the network interface 5410 to perform communications using common network protocols. The network interface 5410 may also include a wireless network interface configured to communicate via one or more wireless communication protocols, such as WiFi, 2G, 3G, 4G, LTE, WiMAX, Bluetooth, and/or the like.

In the exemplary embodiment depicted in FIG. 54, the computing device 5400 also includes a storage medium 5408. However, services may be accessed using a computing device that does not include means for persisting data to a local storage medium. Therefore, the storage medium 5408 depicted in FIG. 54 is optional. In any event, the storage medium 5408 may be volatile or nonvolatile, removable or non-removable, implemented using any technology capable of storing information such as, but not limited to, a hard drive, solid state drive, CD-ROM, DVD, or other disk storage, magnetic tape, magnetic disk storage, and/or the like.

As used herein, the term "computer-readable medium" includes volatile and nonvolatile and removable and non-removable media implemented in any method or technology capable of storing information, such as computer-readable instructions, data structures, program modules, or other data.

In this regard, the system memory 5404 and storage medium 5408 depicted in FIG. 54 are examples of computer-readable media.

For ease of illustration and because it is not important for an understanding of the claimed subject matter, FIG. 54 does not show some of the typical components of many computing devices. In this regard, the computing device 5400 may include input devices, such as a keyboard, keypad, mouse, trackball, microphone, video camera, touchpad, touchscreen, stylus, and/or the like. Such input devices may be coupled to the computing device 5400 by wired or wireless connections including RF, infrared, serial, parallel, Bluetooth, USB, or other suitable connection protocols using wireless or physical connections.

In any of the described examples, data can be captured by input devices and transmitted or stored for future processing. The processing may include encoding data streams, which can be subsequently decoded for presentation by output devices. Media data can be captured by multimedia input devices and stored by saving media data streams as files on a computer-readable storage medium (e.g., in memory or persistent storage on a client device, server, administrator device, or some other device). Input devices can be separate from and communicatively coupled to computing device 5400 (e.g., a client device), or can be integral components of the computing device 5400. In some embodiments, multiple input devices may be combined into a single, multifunction input device (e.g., a video camera with an integrated microphone). Any suitable input device either currently known or developed in the future may be used with described systems described herein.

The computing device 5400 may also include output devices such as a display, speakers, printer, etc. The output devices may include video output devices such as a display or touchscreen. The output devices also may include audio output devices such as external speakers or earphones. The output devices can be separate from and communicatively coupled to the computing device 5400, or can be integral components of the computing device 5400. In some embodiments, multiple output devices may be combined into a single device (e.g., a display with built-in speakers). Any suitable output device either currently known or developed in the future may be used with described systems.

In general, functionality of computing devices described herein may be implemented in computing logic embodied in hardware or software instructions, which can be written in a programming language, such as C, C++, COBOL, JAVA™, PHP, Perl, HTML, CSS, JavaScript, VBScript, ASPX, Microsoft .NET™ languages such as C #, and/or the like. Computing logic may be compiled into executable programs or written in interpreted programming languages. Generally, functionality described herein can be implemented as logic modules that can be duplicated to provide greater processing capability, merged with other modules, or divided into sub-modules. The computing logic can be stored in any type of computer-readable medium (e.g., a non-transitory medium such as a memory or storage medium) or computer storage device and be stored on and executed by one or more general-purpose or special-purpose processors, thus creating a special-purpose computing device configured to provide functionality described herein.

IV. Extensions and Alternatives

Many alternatives to the systems and devices described herein are possible. For example, individual modules or subsystems can be separated into additional modules or subsystems or combined into fewer modules or subsystems. As another example, modules or subsystems can be omitted or supplemented with other modules or subsystems. As another example, functions that are indicated as being performed by a particular device, module, or subsystem may instead be performed by one or more other devices, modules, or subsystems. Although some examples in the present disclosure include descriptions of devices comprising specific hardware components in specific arrangements, techniques and tools described herein can be modified to accommodate different hardware components, combinations, or arrangements. Further, although some examples in the present disclosure include descriptions of specific usage scenarios, techniques and tools described herein can be modified to accommodate different usage scenarios. Functionality that is described as being implemented in software can instead be implemented in hardware, or vice versa.

Many alternatives to the techniques described herein are possible. For example, processing stages in the various techniques can be separated into additional stages or combined into fewer stages. As another example, processing stages in the various techniques can be omitted or supplemented with other techniques or processing stages. As another example, processing stages that are described as occurring in a particular order can instead occur in a different order. As another example, processing stages that are described as being performed in a series of steps may instead be handled in a parallel fashion, with multiple modules or software processes concurrently handling one or more of the illustrated processing stages. As another example, processing stages that are indicated as being performed by a particular device or module may instead be performed by one or more other devices or modules.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the claimed subject matter.

The embodiments of the invention in which an exclusive property or privilege is claimed are defined in the claim section.

The invention claimed is:

1. A computer system comprising:
a streamed data generating section configured to generate streamed data based on raw handwriting data, wherein the streamed data comprises a plurality of streams, wherein the streamed data generating section comprises a lossless stream adaptive encoder configured to adaptively encode the plurality of streams, wherein the raw handwriting data includes pen data associated with pen events, and wherein the pen data includes coordinate data, pressure data, inclination data, orientation data, twist data, or timing information; and
a lossy data processing section configured to generate stroke data and/or image data based on the raw handwriting data.

2. The computer system of claim 1, further comprising an integrating section configured to integrate the streamed data and the stroke data and/or the image data into integrated data.

3. The computer system of claim 2, wherein the integrated data comprises a digital image with the encoded handwriting data inserted therein.

4. A method executed in a computer system comprising one or more processors and memory, the method comprising:
- generating streamed data based on raw handwriting data, wherein the streamed data comprises a plurality of streams, wherein the raw handwriting data includes pen data associated with pen events, and wherein the pen data includes coordinate data, pressure data, inclination data, orientation data, twist data, or timing information;
- adaptively encoding the plurality of streams using a lossless stream adaptive encoder; and
- generating stroke data and/or image data based on the raw handwriting data using lossy data processing.

5. The method of claim 4, further comprising integrating the streamed data and the stroke data and/or the image data into integrated data.

6. The method of claim 5, wherein the integrated data comprises a digital image with the encoded handwriting data inserted therein.

7. A computer-readable medium having stored thereon computer-executable instructions configured to cause one or more processors of a computer system to perform steps comprising:
- generating streamed data based on raw handwriting data, wherein the streamed data comprises a plurality of streams, wherein the raw handwriting data includes pen data associated with pen events, and wherein the pen data includes coordinate data, pressure data, inclination data, orientation data, twist data, or timing information;
- adaptively encoding the plurality of streams using a lossless stream adaptive encoder; and
- generating stroke data and/or image data based on the raw handwriting data using lossy data processing.

8. The computer-readable medium of claim 7, the steps further comprising integrating the streamed data and the stroke data and/or the image data into integrated data.

9. The computer-readable medium of claim 8, wherein the integrated data comprises a digital image with the encoded handwriting data inserted therein.

* * * * *